United States Patent
Lin et al.

(10) Patent No.: US 9,754,897 B2
(45) Date of Patent: Sep. 5, 2017

(54) SEMICONDUCTOR DEVICE AND METHOD OF FORMING ELECTROMAGNETIC (EM) SHIELDING FOR LC CIRCUITS

(71) Applicant: STATS ChipPAC, Ltd., Singapore (SG)

(72) Inventors: Yaojian Lin, Singapore (SG); Byung Joon Han, Singapore (SG); Rajendra D. Pendse, Fremont, CA (US); Il Kwon Shim, Singapore (SG); Pandi C. Marimuthu, Singapore (SG); Won Kyoung Choi, Singapore (SG); Linda Pei Ee Chua, Singapore (SG)

(73) Assignee: STATS ChipPAC, Pte. Ltd., Singapore (SG)

( * ) Notice: Subject to any disclaimer, the term of this patent is extended or adjusted under 35 U.S.C. 154(b) by 11 days.

(21) Appl. No.: 14/721,677

(22) Filed: May 26, 2015

(65) Prior Publication Data

US 2015/0348936 A1 Dec. 3, 2015

Related U.S. Application Data

(60) Provisional application No. 62/006,787, filed on Jun. 2, 2014.

(51) Int. Cl.
*H04L 23/00* (2006.01)
*H01L 23/552* (2006.01)
(Continued)

(52) U.S. Cl.
CPC .......... *H01L 23/552* (2013.01); *H01L 21/561* (2013.01); *H01L 21/568* (2013.01);
(Continued)

(58) Field of Classification Search
CPC .......... H01L 21/77; H01L 21/78; H01L 21/82
See application file for complete search history.

(56) References Cited

U.S. PATENT DOCUMENTS 7,745,910 B1 * 6/2010 Olson ................... H01L 21/561
257/659
8,093,691 B1 * 1/2012 Fuentes ............... H01L 23/3128
257/659

(Continued)

*Primary Examiner* — William Harriston
(74) *Attorney, Agent, or Firm* — Robert D. Atkins; Patent Law Group: Atkins and Associates, P.C.

(57) ABSTRACT

A semiconductor device has a first component. A modular interconnect structure is disposed adjacent to the first component. A first interconnect structure is formed over the first component and modular interconnect structure. A shielding layer is formed over the first component, modular interconnect structure, and first interconnect structure. The shielding layer provides protection for the enclosed semiconductor devices against EMI, RFI, or other inter-device interference, whether generated internally or from external semiconductor devices. The shielding layer is electrically connected to an external low-impedance ground point. A second component is disposed adjacent to the first component. The second component includes a passive device. An LC circuit includes the first component and second component. A semiconductor die is disposed adjacent to the first component. A conductive adhesive is disposed over the modular interconnect structure. The modular interconnect structure includes a height less than a height of the first component.

20 Claims, 39 Drawing Sheets

(51) Int. Cl.
*H01L 21/56* (2006.01)
*H01L 23/538* (2006.01)
*H01L 23/00* (2006.01)
*H01L 21/683* (2006.01)
*H01L 23/498* (2006.01)

(52) U.S. Cl.
CPC ...... *H01L 21/6836* (2013.01); *H01L 23/5389* (2013.01); *H01L 24/19* (2013.01); *H01L 24/24* (2013.01); *H01L 24/96* (2013.01); *H01L 24/97* (2013.01); *H01L 23/49816* (2013.01); *H01L 23/5386* (2013.01); *H01L 2221/6834* (2013.01); *H01L 2221/68327* (2013.01); *H01L 2224/04105* (2013.01); *H01L 2224/12105* (2013.01); *H01L 2224/24137* (2013.01); *H01L 2224/24195* (2013.01); *H01L 2224/73267* (2013.01); *H01L 2224/94* (2013.01); *H01L 2224/97* (2013.01); *H01L 2924/13091* (2013.01); *H01L 2924/1815* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 2006/0145361 A1* | 7/2006 | Yang | H01L 23/29 257/787 |
| 2009/0194852 A1* | 8/2009 | Chiu | H01L 21/568 257/660 |
| 2010/0110656 A1* | 5/2010 | Ko | H01L 21/561 361/818 |
| 2011/0084382 A1* | 4/2011 | Chen | H01L 24/97 257/737 |

* cited by examiner

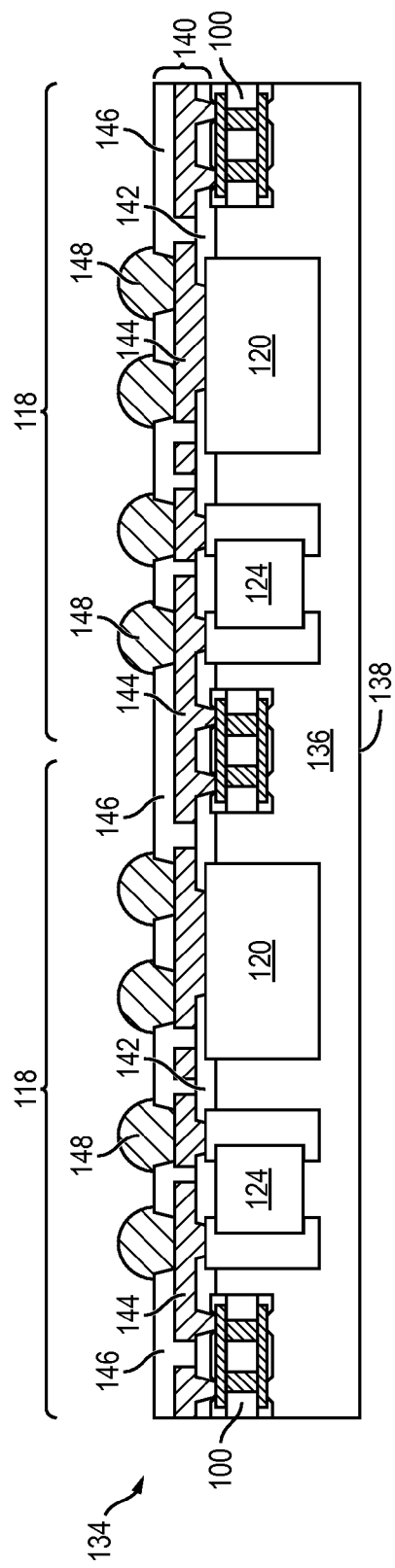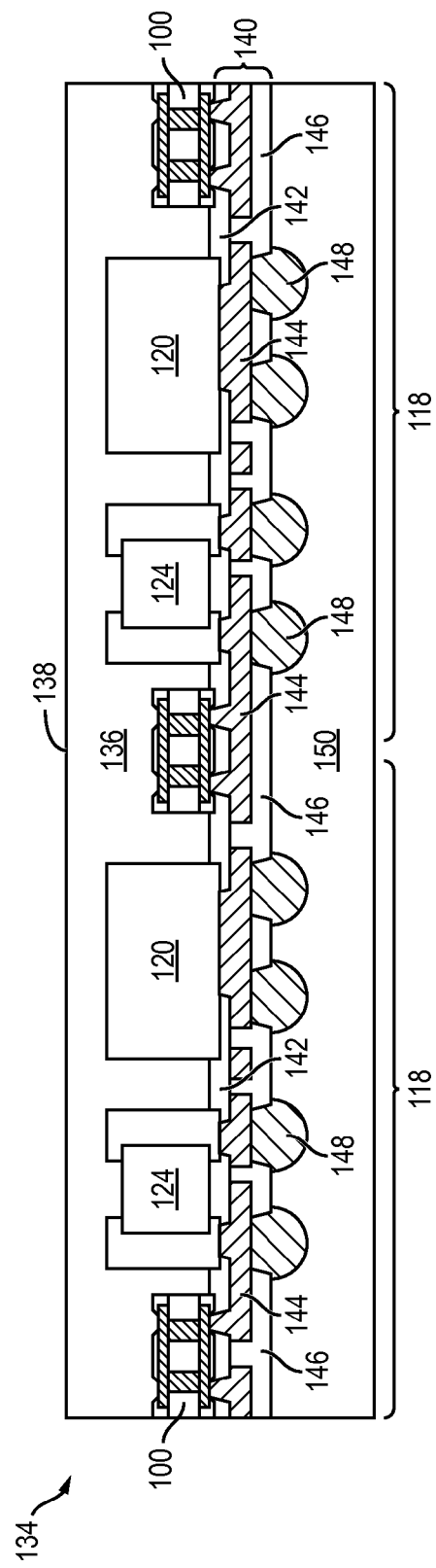

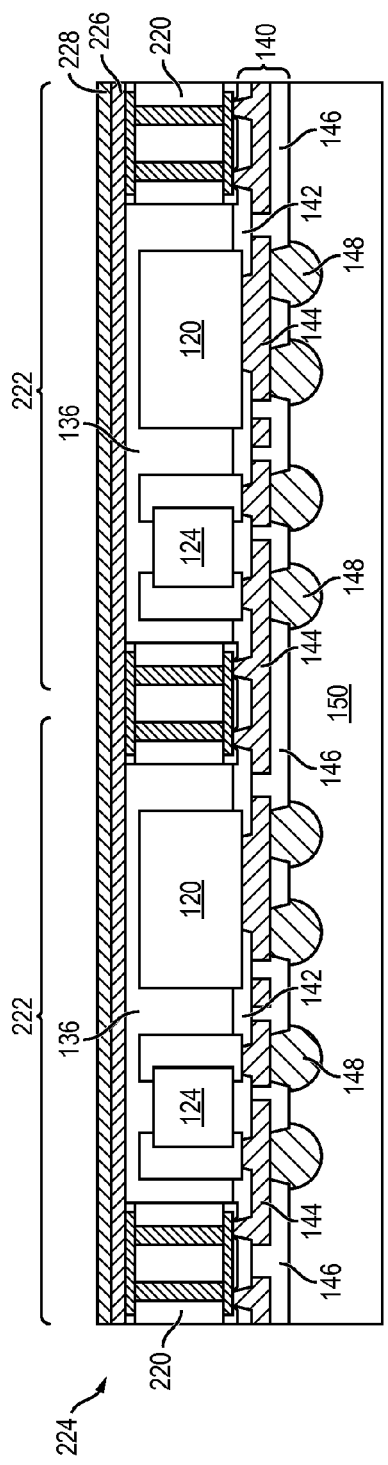
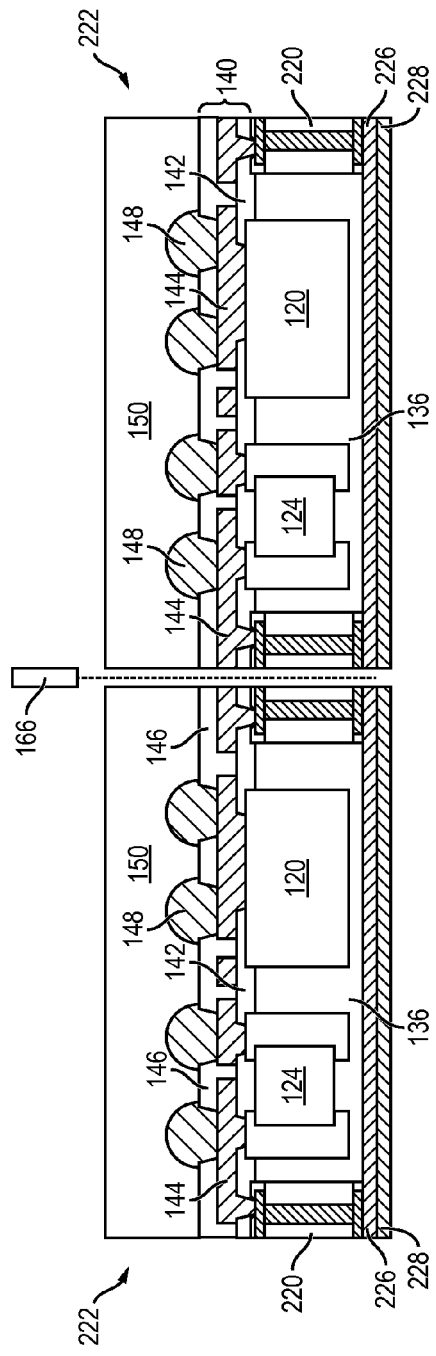

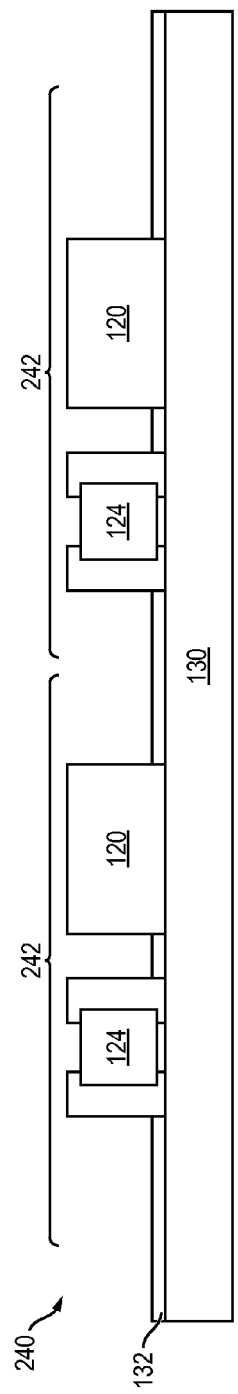
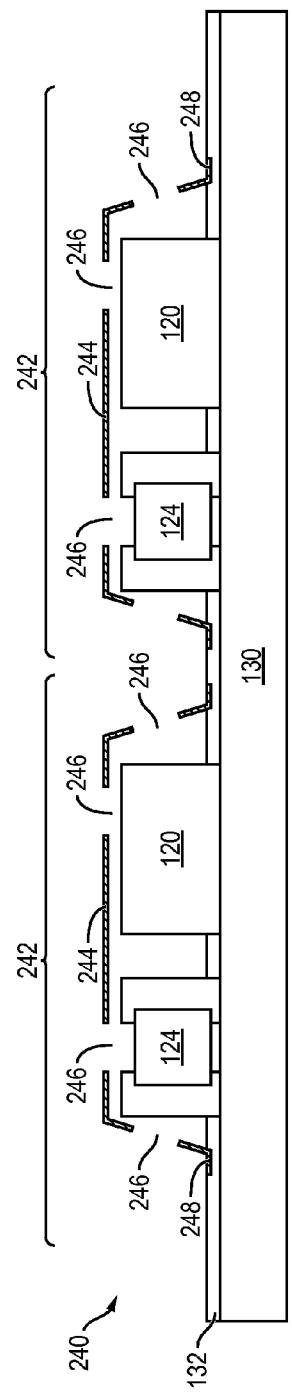
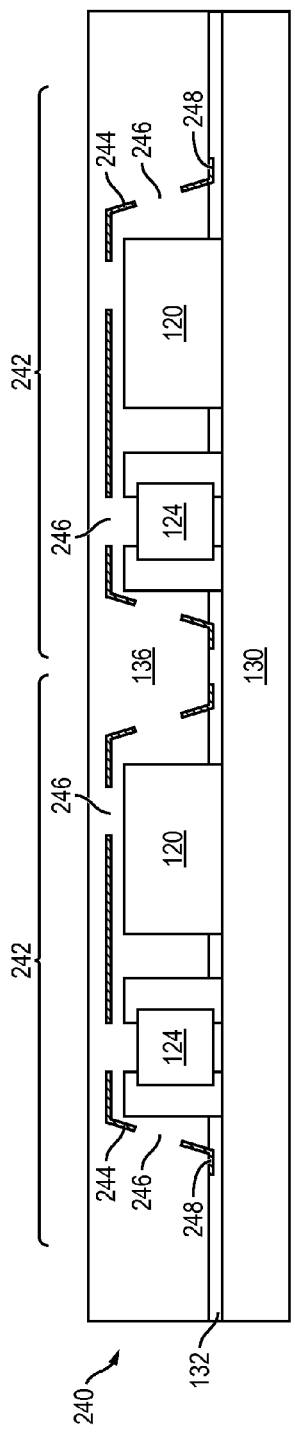

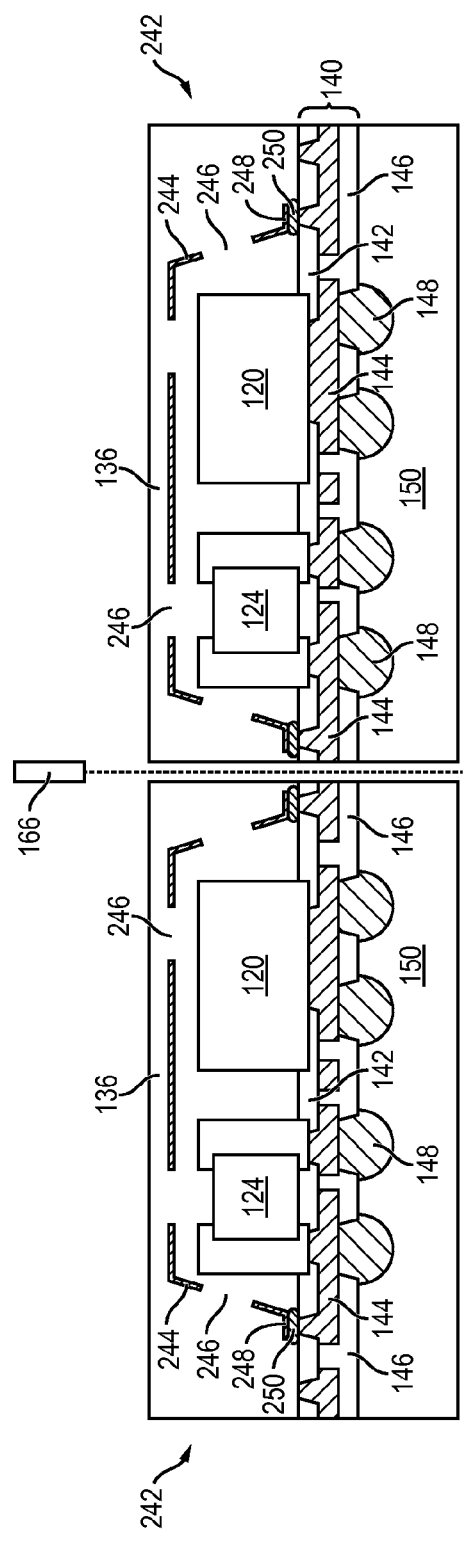
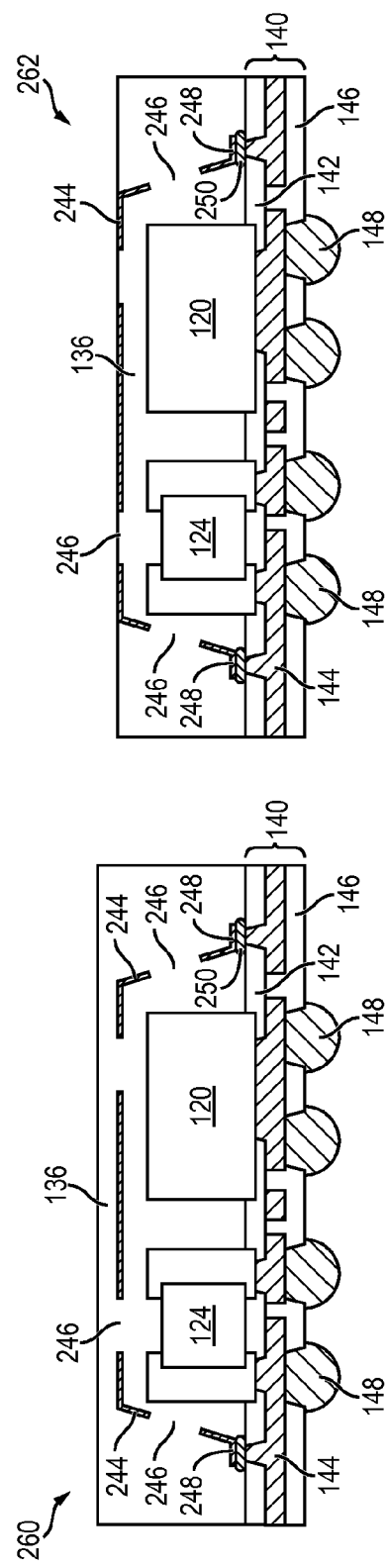

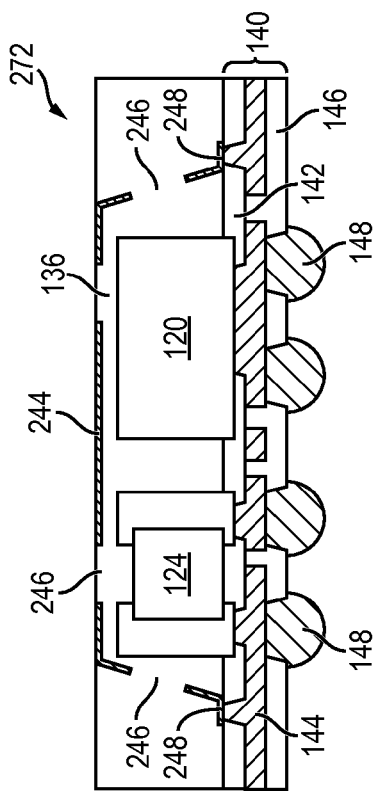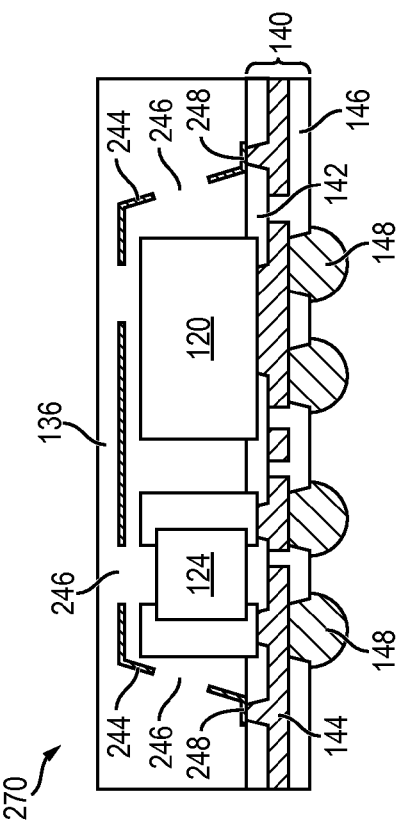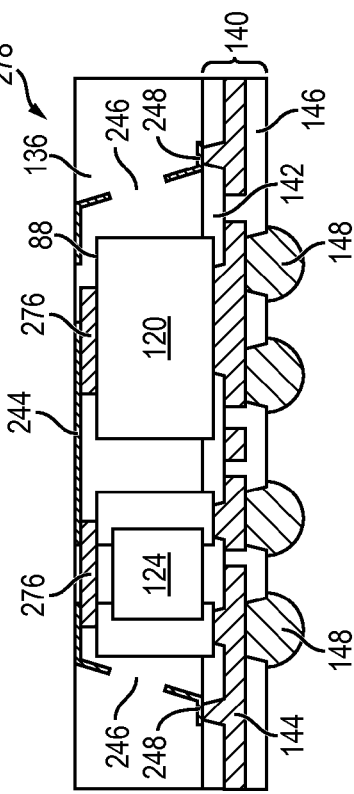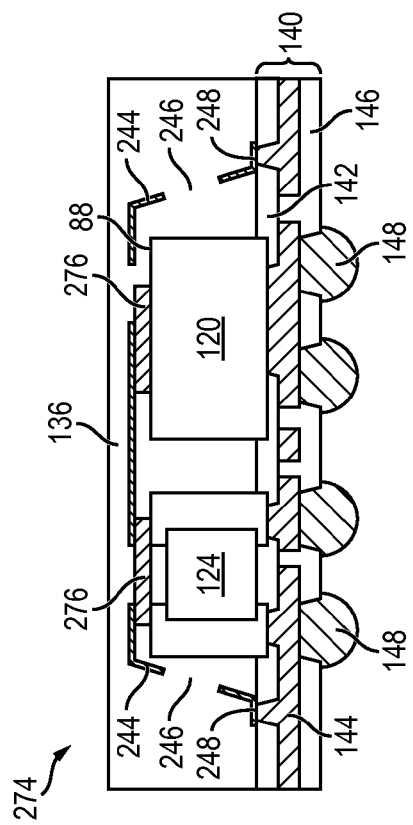

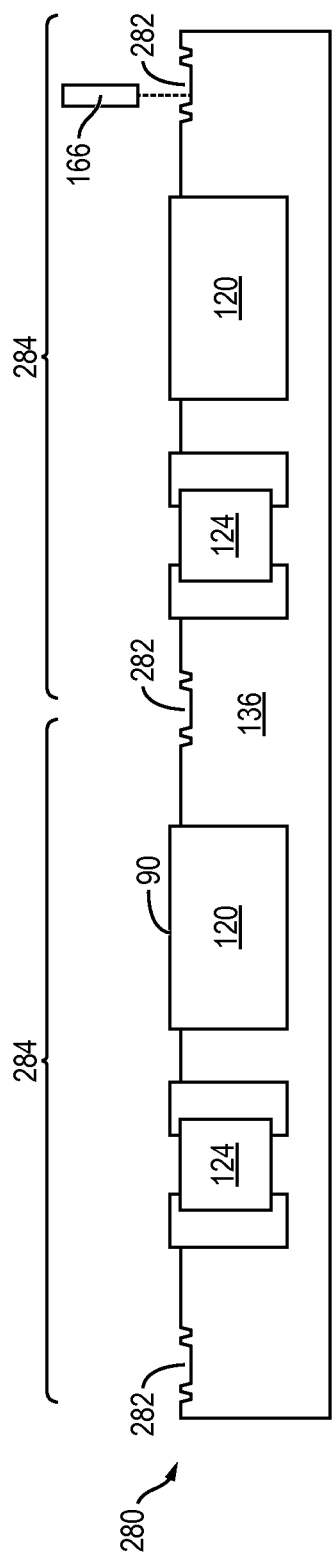
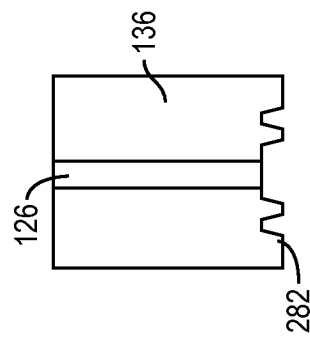
FIG. 12a
FIG. 12c
FIG. 12d

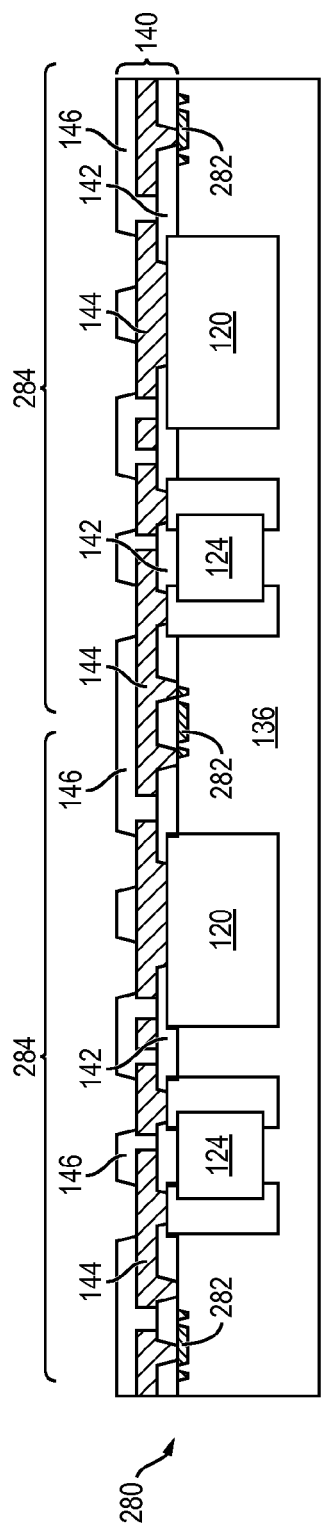
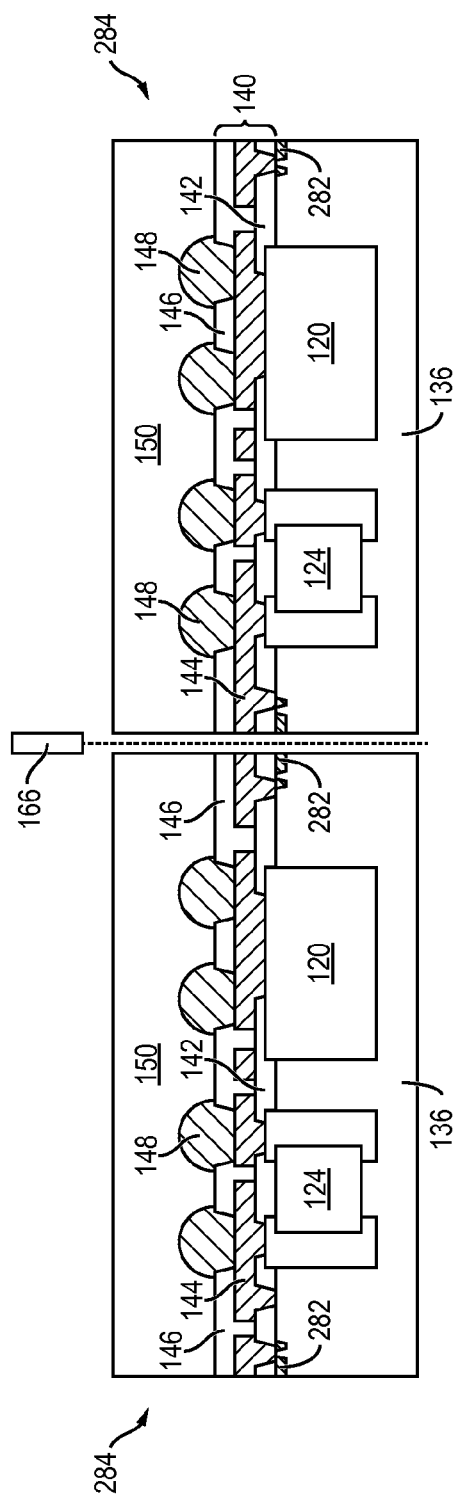
FIG. 12e
FIG. 12g

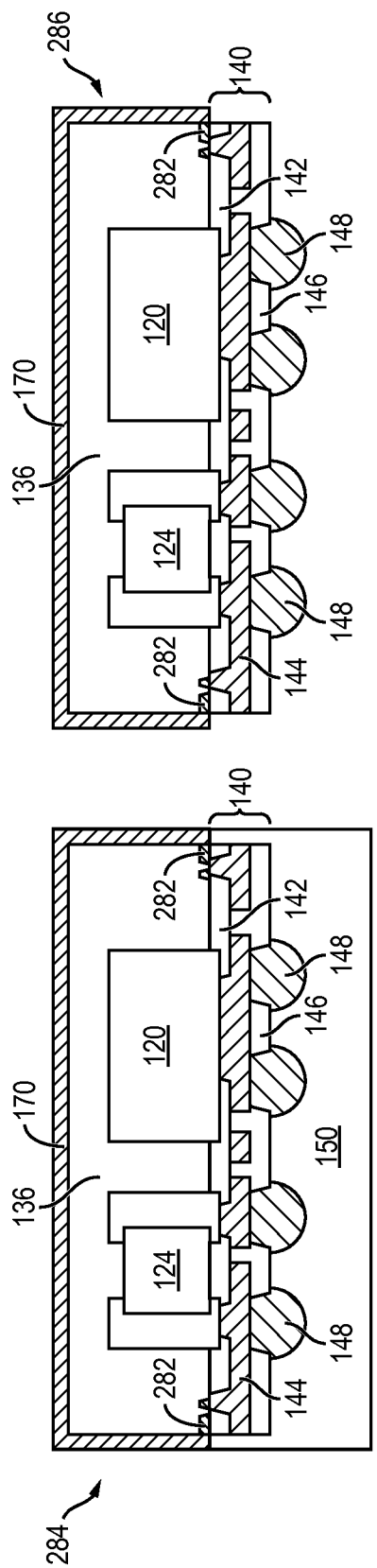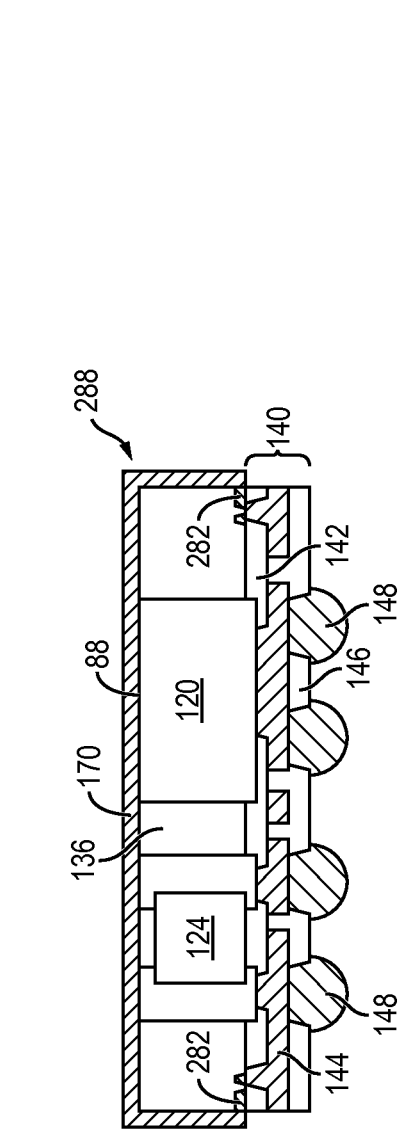

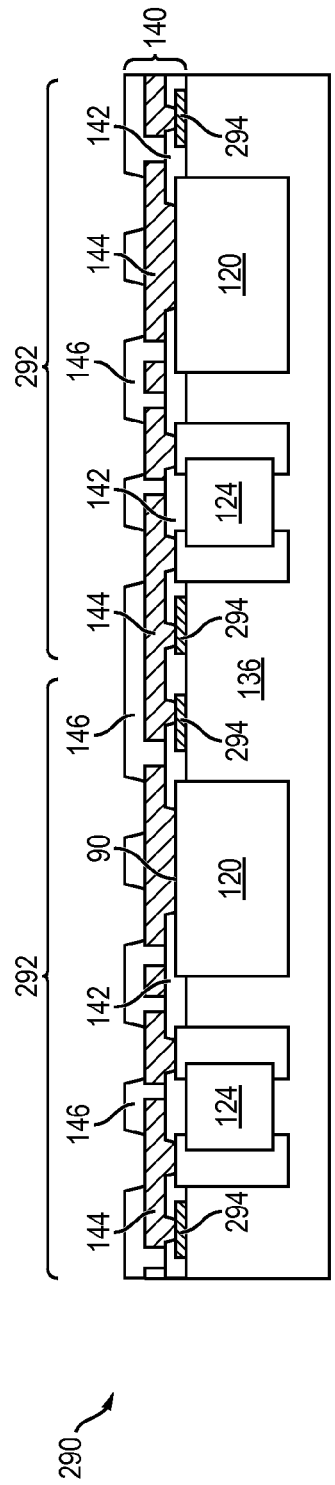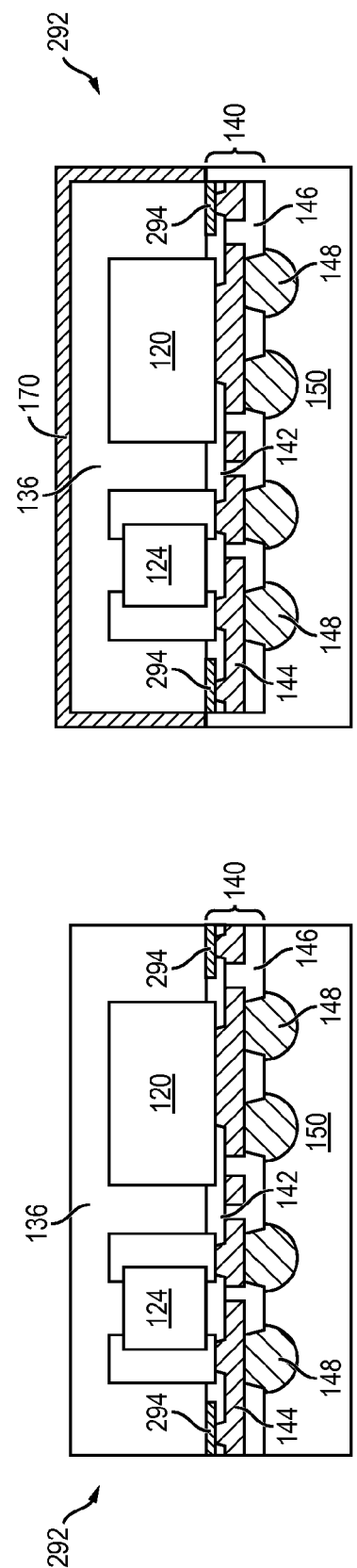

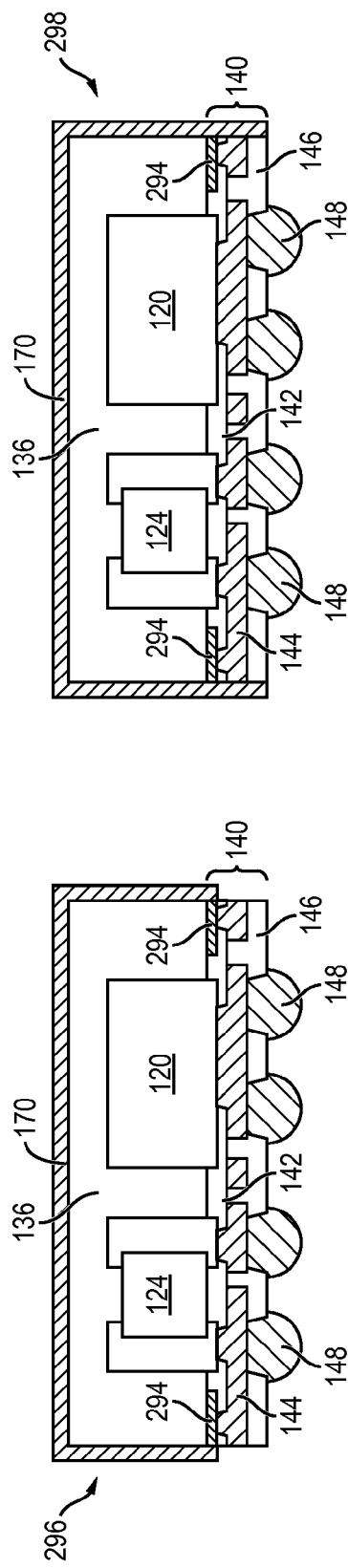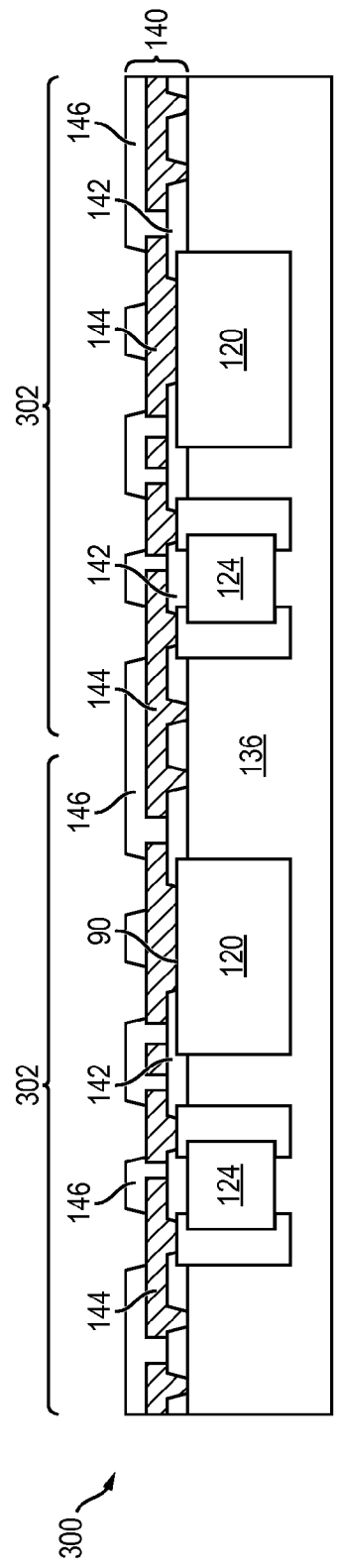

SEMICONDUCTOR DEVICE AND METHOD OF FORMING ELECTROMAGNETIC (EM) SHIELDING FOR LC CIRCUITS

CLAIM OF DOMESTIC PRIORITY

The present application claims the benefit of U.S. Provisional Application No. 62/006,787, filed Jun. 2, 2014, which application is incorporated herein by reference.

FIELD OF THE INVENTION

The present invention relates in general to semiconductor devices and, more particularly, to a semiconductor device and method of forming semiconductor packages with electromagnetic shielding for LC (inductor and capacitor) circuits.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk, which can interfere with device operation.

SUMMARY OF THE INVENTION

A need exists to isolate semiconductor die from EMI, RFI, and other inter-device interference. Accordingly, in one embodiment, the present invention is a method of making a semiconductor device comprising the steps of providing a first component, disposing a modular interconnect structure adjacent to the first component, forming a first interconnect structure over the first component and modular interconnect structure, and forming a shielding layer over the first component, modular interconnect structure, and first interconnect structure.

In another embodiment, the present invention is a method of making a semiconductor device comprising the steps of providing a first component, disposing an encapsulant over the first component, forming a first interconnect structure over the first component and encapsulant, and forming a shielding layer over the first component, encapsulant, and first interconnect structure.

In another embodiment, the present invention is a semiconductor device comprising a first component. A modular interconnect structure is disposed adjacent to the first component. A first interconnect structure is formed over the first component and modular interconnect structure. A shielding layer is formed over the first component, modular interconnect structure, and first interconnect structure.

In another embodiment, the present invention is a semiconductor device comprising a first component. An encapsulant is disposed over the first component. A first interconnect structure is formed over the first component and encapsulant. A shielding layer is formed over the first component, encapsulant, and first interconnect structure.

BRIEF DESCRIPTION OF THE DRAWINGS

FIGS. 5a-5m illustrate a method of making an EMI shielded module including corner PCB units;

FIGS. 8a-8f illustrate a method of making an EMI shielded module including tall PCB units;

FIGS. 9a-9h illustrate a method of making an EMI shielded module including an embedded conductive shielding cage;

FIGS. 10a-10b illustrate other EMI shielded modules including shielding cages;

FIGS. 11a-11b illustrate other EMI shielded modules including a thermally enhanced adhesive;

FIGS. 12a-12j illustrate another method of making EMI shielded modules including trenches formed in the encapsulant;

FIGS. 13a-13f illustrate another method of making EMI shielding modules including RDL side teeth;

FIGS. 14a-14d illustrate another method of making an EMI shielded module;

DETAILED DESCRIPTION OF THE DRAWINGS

Figure 1:
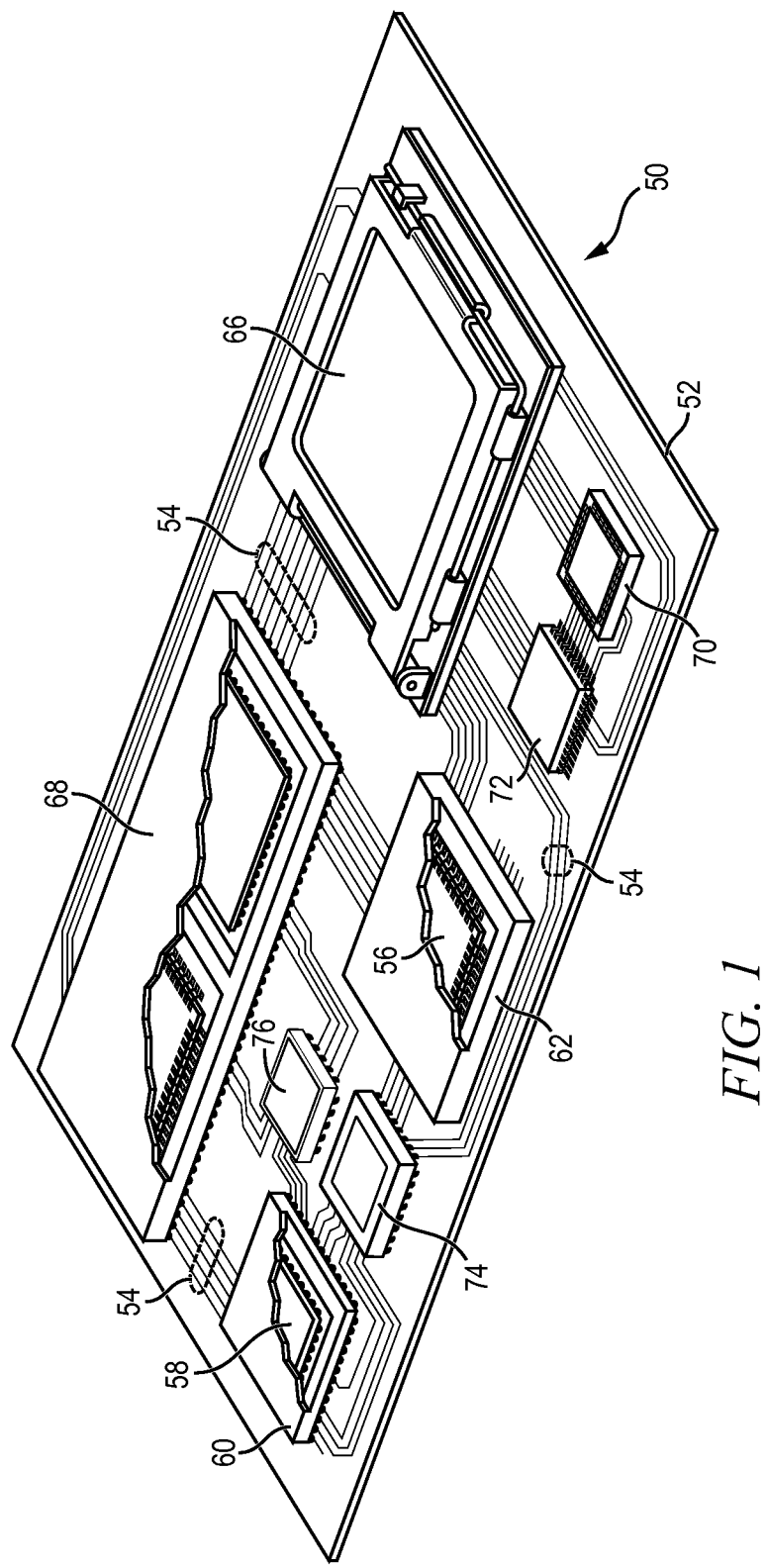
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
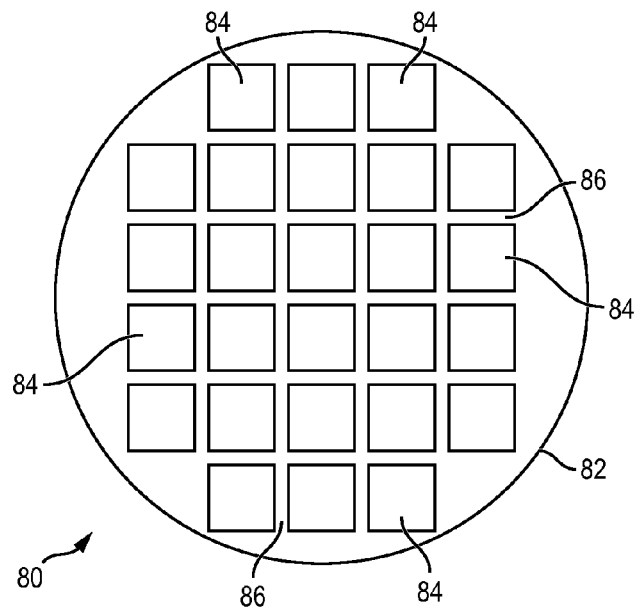
FIGS. 2a-2d illustrate a semiconductor wafer with a plurality of semiconductor die separated by a saw street.

FIG. 2a shows a semiconductor wafer 80 with a base substrate material 82, such as silicon, germanium, aluminum phosphide, aluminum arsenide, gallium arsenide, gallium nitride, indium phosphide, silicon carbide, or other bulk semiconductor material for structural support. A plurality of semiconductor die or components 84 is formed on wafer 80 separated by a non-active, inter-die wafer area or saw street 86 as described above. Saw street 86 provides cutting areas to singulate semiconductor wafer 80 into individual semiconductor die 84. In one embodiment, semiconductor wafer 80 has a width or diameter of 100-450 millimeters (mm).

Figure 2B:
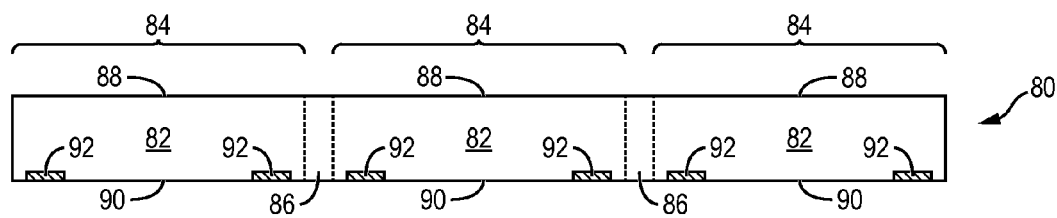

FIG. 2b shows a cross-sectional view of a portion of semiconductor wafer 80. Each semiconductor die 84 has a back or non-active surface 88 and an active surface 90 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 90 to implement analog circuits or digital circuits, such as digital signal processor (DSP), ASIC, MEMS, memory, or other signal processing circuit. In one embodiment, active surface 90 contains a MEMS, such as an accelerometer, gyroscope, strain gauge, microphone, or other sensor responsive to various external stimuli.

Semiconductor die 84 may contain baseband circuits that are susceptible to EMI, RFI, and other interference generated by other devices. In one embodiment, semiconductor die 84 may contain IPD that generate EMI or RFI. For example, the IPDs contained within semiconductor die 84 provide the electrical characteristics needed for high frequency applications, such as high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. In such systems, the output signal in the transmitter section of the radio frequency integrated circuit (RFIC) may interfere with the local oscillator (LO). The inductor can be used in the tank resonators of the LO in the RF transceiver. The LO includes a voltage-controlled oscillator (VCO) that is synchronized to an external crystal reference through a phase-locked loop (PLL). The VCO can be implemented as a cross-coupled amplifier circuit with a tuned resonant inductor-capacitor (LC) load. The inductor is made with one or two spiral inductor coils on the RFIC. External signals can couple into the VCO by magnetic induction directly into the tank resonator. If the external source is a periodic or quasi-periodic signal, it will introduce a spurious tone. In subsequent mixing, the RF signal is multiplied by the LO signal to transpose the band of interest down to low frequency for further signal processing. The presence of the spurious tone in the LO often causes out-of-band signals to be mixed into the base-band frequency range, which degrades the receiver sensitivity, adding both noise and cross-talk to the received signal. Therefore, each of these passive circuit elements has the potential to interfere with adjacent devices.

An electrically conductive layer 92 is formed over active surface 90 of semiconductor die 84 using PVD, CVD, electrolytic plating, electroless plating process, or other suitable metal deposition process. Conductive layer 92 includes one or more layers of aluminum (Al), copper (Cu), tin (Sn), nickel (Ni), gold (Au), silver (Ag), or other suitable electrically conductive material or combination thereof. Conductive layer 92 operates as contact pads electrically connected to the circuits on active surface 90. Conductive layer 92 is formed as contact pads disposed side-by-side a first distance from the edge of semiconductor die 84, as shown in FIG. 2b. Alternatively, conductive layer 92 is formed as contact pads that are offset in multiple rows such that a first row of contact pads is disposed a first distance from the edge of the die, and a second row of contact pads alternating with the first row is disposed a second distance from the edge of the die. In one embodiment, back surface 88 of semiconductor wafer 80 undergoes an optional back-grinding operation with a grinder or other suitable mechanical or etching process to remove a portion of base substrate material 82 and reduce the thickness of semiconductor wafer 80 including semiconductor die 84.

Semiconductor wafer 80 undergoes electrical testing and inspection as part of a quality control process. Manual visual inspection and automated optical systems are used to perform inspections on semiconductor wafer 80. Software can be used in the automated optical analysis of semiconductor wafer 80. Visual inspection methods may employ equipment such as a scanning electron microscope, high-intensity or ultra-violet light, or metallurgical microscope. Semiconductor wafer 80 is inspected for structural characteristics including warpage, thickness variation, surface particulates, irregularities, cracks, delamination, and discoloration.

Figure 2C:
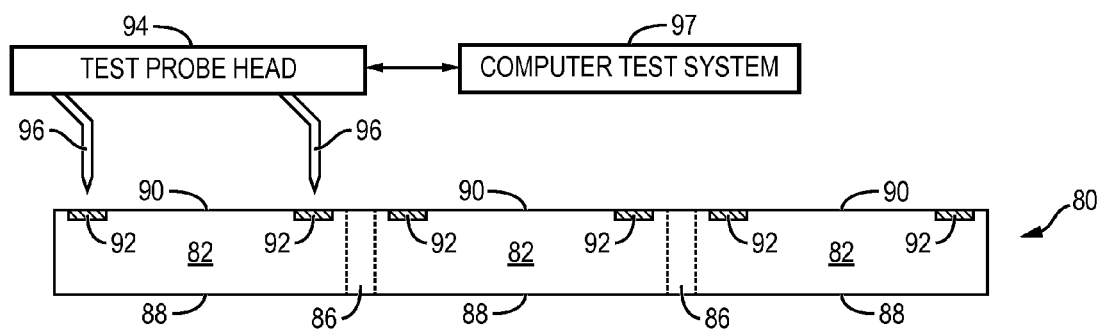

The active and passive components within semiconductor die 84 undergo testing at the wafer level for electrical performance and circuit function. Each semiconductor die 84 is tested for functionality and electrical parameters, as shown in FIG. 2c, using a test probe head 94 including a plurality of probes or test leads 96, or other testing device. Probes 96 are used to make electrical contact with nodes or conductive layer 92 on each semiconductor die 84 and provide electrical stimuli to the contact pads. Semiconductor die 84 responds to the electrical stimuli, which is measured by computer test system 97 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 80 enables semiconductor die 84 that pass to be designated as known good die (KGD) for use in a semiconductor package.

Figure 2D:
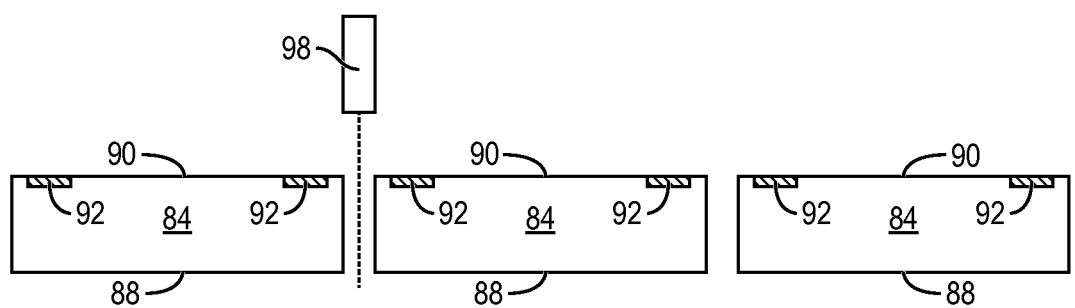

In FIG. 2d, semiconductor wafer 80 is singulated through saw street 86 using a saw blade or laser cutting tool 98 into individual semiconductor die 84. Individual semiconductor die 84 can be inspected and electrically tested for identification of KGD post singulation.

Figure 3:
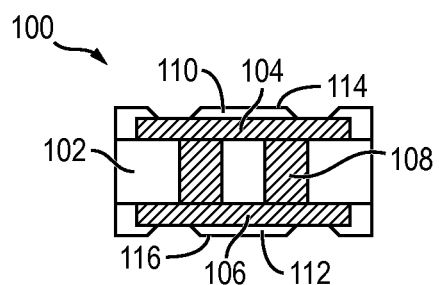
FIG. 3 illustrates a PCB unit for connecting EMI shielding to a redistribution layer (RDL) ground plane.

FIG. 3 shows a PCB unit 100 with base material 102 such as metal, silicon, polymer, polymer composite, ceramic, glass, glass epoxy, beryllium oxide, or other suitable low-cost, rigid material or bulk semiconductor material for structural support. Alternatively, base material 102 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics.

Conductive layer 104 and optional conductive layer 106 are formed on opposing surfaces of base material 102. Conductive layers 104 and 106 can be one or more layers of Al, Cu, Sn, Ni, Au, Ag, or other suitable electrically conductive material formed by electrolytic plating or electroless plating for electrical interconnect. The layout of conductive layers 104 and 106 and base material 102 typically uses silk screen printing, photoengraving, PCB milling, electroless plating, or electroplating process.

Optional z-direction vertical interconnect conductive plated through holes (PTH) 108 are formed through base material 102 when optional conductive layer 106 is present. A plurality of vias is formed through base material 102 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive PTH 108. In one embodiment, i.e., without optional conductive layer 106 or optional PTH 108, base material 102 is conductive.

Insulating or passivation layers 110 and 112 are formed over opposing surfaces of PCB unit 100 using PVD, CVD, printing, spin coating, spray coating, sintering or thermal oxidation. Insulating layers 110 and 112 contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. Insulating layer 110 forms front surface 114 of PCB unit 100. Insulating layer 112 forms back surface 116 of PCB unit 100. A portion of insulating layers 110 and 112 is removed by an etching process to expose conductive layers 104 and 106. In one embodiment, removing the portion of insulating layer 110 and 112 expose PTH 108. PCB unit 100 acts as a modular interconnect structure providing connectivity to module 118.

Figure 4:
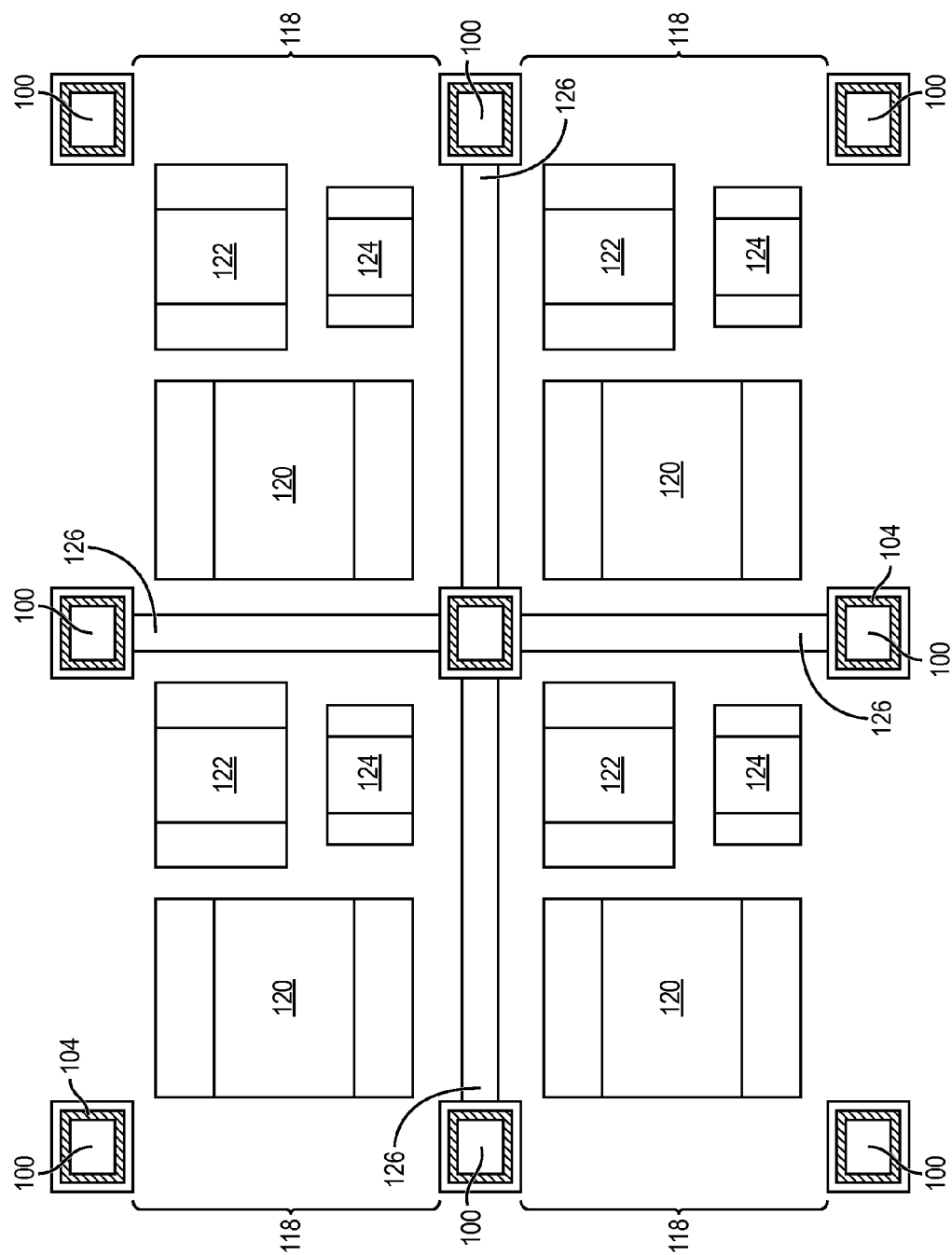
FIG. 4 illustrates a plan view of a layout for using PCB units as grounding connections.

FIG. 4 shows a plan view of a portion of a layout for forming modules 118 with three components 120-124. FIG. 4 shows four modules 118, although any number of modules may be formed. Each corner of each module 118 includes PCB unit 100. The layout shown in FIG. 4 includes a separation region or saw street 126 between each module 118. Components 120-124 may be semiconductor die 84 containing IPDs, or discrete passive devices such as inductors, capacitors, and resistors. In one embodiment, components 120 and 122 are inductors and component 124 is a capacitor with specifications listed in Table 1.

TABLE 1

| | | | | | Component Data | | |
|---|---|---|---|---|---|---|---|
| COMPONENT | VALUE | TOLERANCE | IMPERIAL CODE | METRI CODE | L | W | T |
| 120 | 1 uH | +/−20% | 1008 | 2520 | 2.5 ± 0.2 | 2.0 ± 0.2 | 1.0 max |
| 122 | 1 uH | +/−20% | 0806 | 2016 | 2.0 ± 0.2 | 1.6 ± 0.2 | 1.0 max |
| 124 | 22 uF | +/−20% | 0603 | 1608 | 1.6 ± 0.1 | 0.8 ± 0.1 | 1.0 max |

Figure 5A:
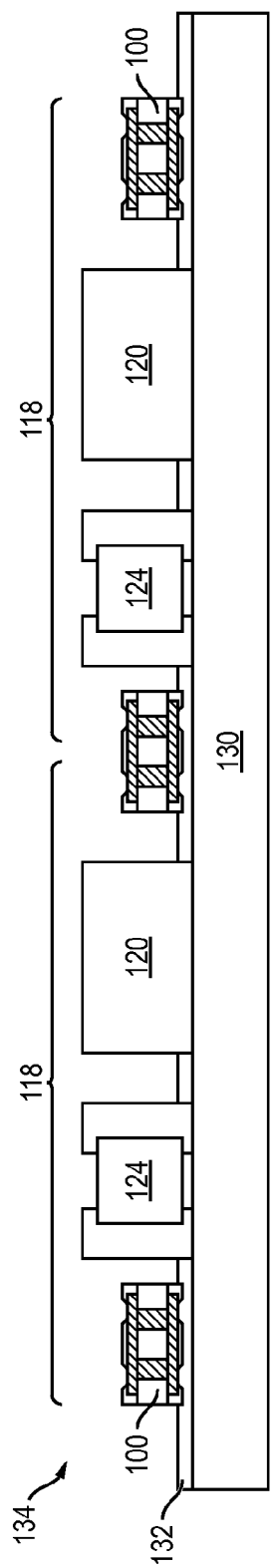

FIGS. 5a-5m illustrate, in relation to FIG. 1, a method of forming an EMI shielded module with three components 120-124. FIG. 5a shows a cross-sectional view of a portion of a carrier or temporary substrate 130 containing sacrificial base material such as silicon, polymer, beryllium oxide, glass, or other suitable low-cost, rigid material for structural support. An interface layer or double-sided tape 132 is formed over carrier 130 as a temporary adhesive bonding film, etch-stop layer, or thermal release layer.

Carrier 130 can be a round or rectangular panel (greater than 300 mm) with capacity for multiple components 120-124 or semiconductor die 84. Carrier 130 may have a larger surface area than the surface area of semiconductor wafer 80. A larger carrier reduces the manufacturing cost of the semiconductor package as more components or semiconductor die can be processed on the larger carrier thereby reducing the cost per unit. Semiconductor packaging and processing equipment are designed and configured for the size of the wafer or carrier being processed.

To further reduce manufacturing costs, the size of carrier 130 is selected independent of the size of components 120-124, semiconductor die 84, or semiconductor wafer 80. That is, carrier 130 has a fixed or standardized size, which can accommodate various size components 120-124 or semiconductor die 84 singulated from one or more semiconductor wafers 80. In one embodiment, carrier 130 is circular with a diameter of 330 mm. In another embodiment, carrier 130 is rectangular with a width of 560 mm and length of 600 mm. Semiconductor die 84 may have dimensions of 10 mm by 10 mm, which are placed on the standardized carrier 130. Alternatively, semiconductor die 84 may have dimensions of 20 mm by 20 mm, which are placed on the same standardized carrier 130. Modules 118 may have dimensions of 3 mm by 5 mm. Accordingly, standardized carrier 130 can handle any size of components 120-124 or semiconductor die 84, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 130 lowers manufacturing costs and capital risk by reducing or eliminating the need for specialized semiconductor processing lines based on die size or incoming wafer size. By selecting a predetermined carrier size to use for any size component or semiconductor die from all semiconductor wafer sizes, a flexible manufacturing line can be implemented.

PCB units 100 from FIG. 3 and components 120-124 or semiconductor die 84 from FIG. 2d are mounted to interface layer 132 and over carrier 130 using, for example, a pick and place operation with front surface 114 of PCB units 100 and active surface 90 of components 120-124 or semiconductor die 84 oriented toward the carrier. PCB units 100 and components 120-124 are arranged according to the layout shown in FIG. 4 to form modules 118. FIG. 5a shows components 120-124 and PCB units 100 mounted to interface layer 132 of carrier 130 as reconstituted panel or reconfigured wafer 134. PCB units 100 have a height less than a height of components 120-124.

Figure 5B:
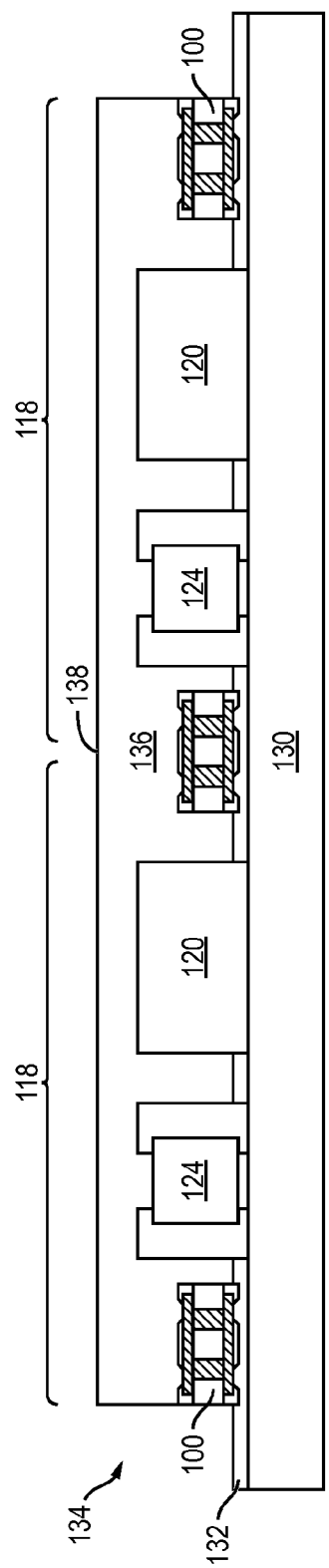

In FIG. 5b, an encapsulant or molding compound 136 deposited over reconstituted panel 134 including PCB units 100, components 120-124, and carrier 130 using a paste printing, compressive molding, transfer molding, liquid encapsulant molding, vacuum lamination, or other suitable applicator. In one embodiment, encapsulant 136 is deposited using film-assisted molding process to leave a backside of components 120-124 devoid of the encapsulant. Encapsulant 136 can be polymer composite material, such as epoxy resin with filler, epoxy acrylate with filler, or polymer with proper filler. Encapsulant 136 is non-conductive, provides physical support, and environmentally protects the semiconductor device from external elements and contaminants. Encapsulant 136 is deposited between PCB units 100 and components 120-124 to cover the side surfaces of PCB units 100 and components 120-124. In one embodiment, encapsulant 136 includes surface 138 over back surface 116 of PCB units 100 and back surface 88 of components 120-124.

Figure 5C:
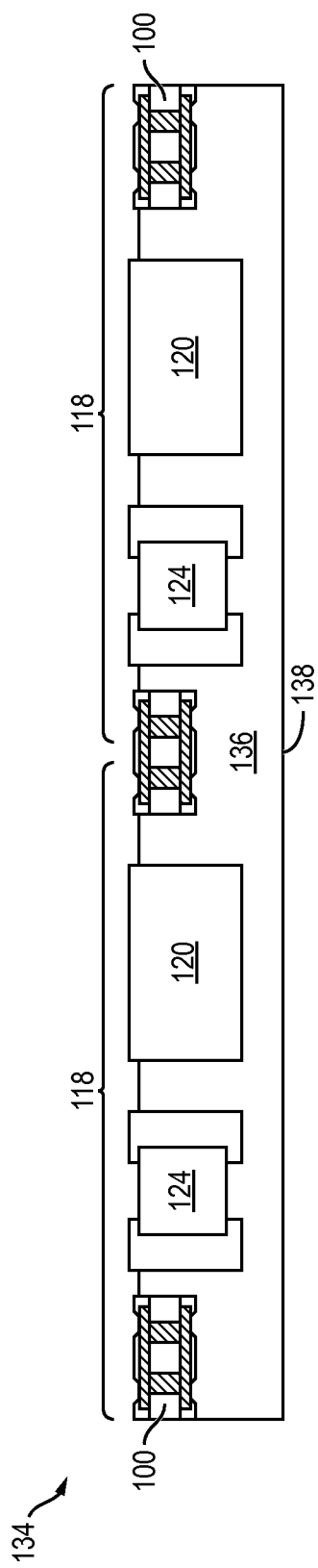

In FIG. 5c, temporary carrier 130 and optional interface layer 132 are removed from reconstituted panel 134 by chemical etching, mechanical peel-off, chemical mechanical planarization (CMP), mechanical grinding, thermal bake, laser scanning, or wet stripping. Front surface 114 of PCB units 100 and active surface 90 of components 120-124 are exposed after carrier 130 and interface layer 132 are removed. FIG. 5d shows a plan view of a portion of reconstituted panel 134 after encapsulation.

Figure 5E:
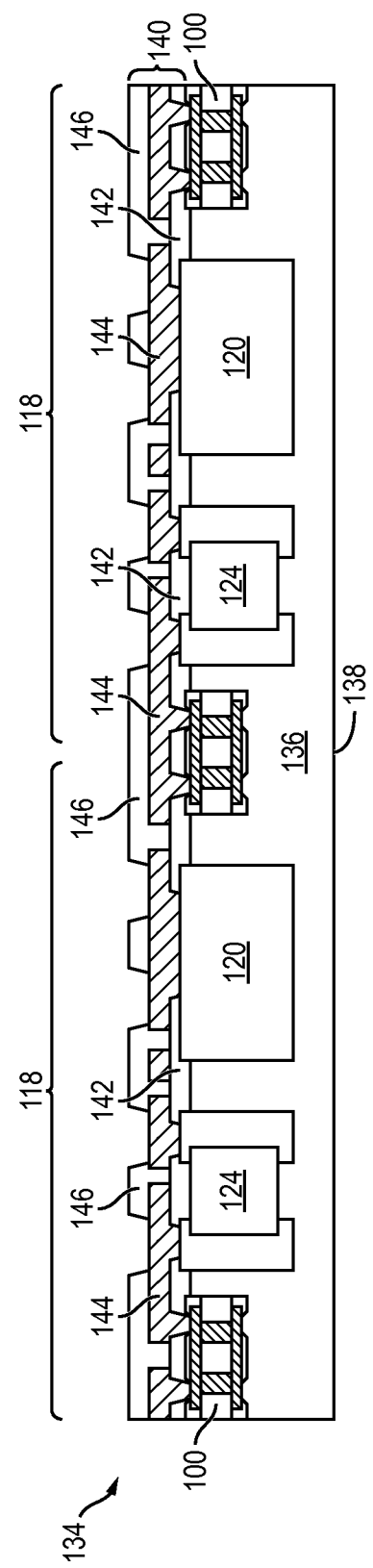
Figure 5D:
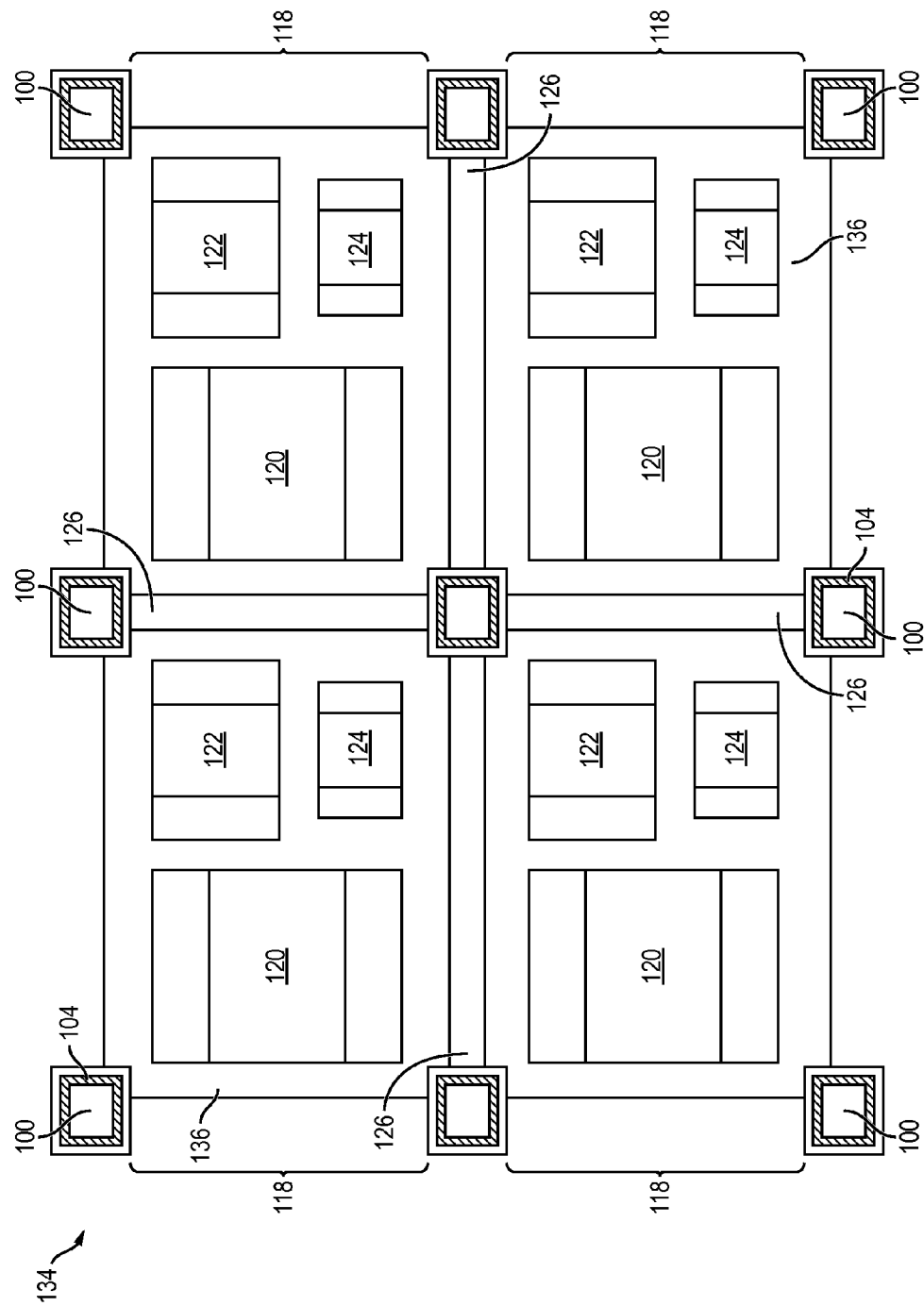

In FIG. 5e, a build-up interconnect structure 140 is formed over PCB units 100, components 120-124, and encapsulant 136. Insulating or passivation layer 142 is formed over front surface 114 of PCB units 100, components 120-124, and encapsulant 136 using PVD, CVD, printing, spin coating, spray coating, sintering or thermal oxidation. The insulating layer 142 contains one or more layers of SiO2, Si3N4, SiON, Ta2O5, Al2O3, or other material having similar insulating and structural properties. A portion of insulating layer 142 is removed by an etching process to expose conductive layer 104 of PCB unit 100 and portions of components 120-124.

An electrically conductive layer 144 is formed over insulating layer 142, conductive layer 104 of PCB unit 100, and components 120-124 using a patterning and metal deposition process such as PVD, CVD, sputtering, electrolytic plating, electroless seed layer deposition, and electroless plating. Conductive layer 144 includes one or more layers of Al, Cu, Ti, titanium tungsten (TiW), tin Sn, Ni, Au, Ag, W, or other suitable electrically conductive material or combination thereof. Conductive layer 144 operates as an RDL ground plane to provide EMI shielding for module 118. In one embodiment, conductive layer 144 operates as an RDL to redistribute electrical connection from components 120-124 to outside a footprint of module 118. One portion of conductive layer 144 is electrically connected to conductive layer 104 of PCB unit 100, while other portions of conductive layer 144 are electrically connected to contact pads 92 of components 120-124. Still other portions of conductive layer 144 are electrically common or electrically isolated depending on the design and function of the semiconductor device. Conductive layer 144 electrically connects components 120-124 to conductive layer 104 of PCB units 100.

An insulating or passivation layer 146 is formed over insulating layer 142 and conductive layer 144 using PVD, CVD, printing, spin coating, spray coating, sintering or thermal oxidation. Insulating layer 146 includes one or more layers of SiO2, Si3N4, SiON, Ta2O5, Al2O3, low temperature curable polymer dielectric resist (i.e., cures at less than 250° C.), benzocyclobutene (BCB), polybenzoxazoles (PBO), or epoxy based photosensitive polymer dielectric, or other material having similar insulating and structural properties. A portion of insulating layer 146 is removed by laser direct ablation (LDA) or an etching process through a patterned photoresist layer to expose portions of conductive layer 144.

Figure 5F:
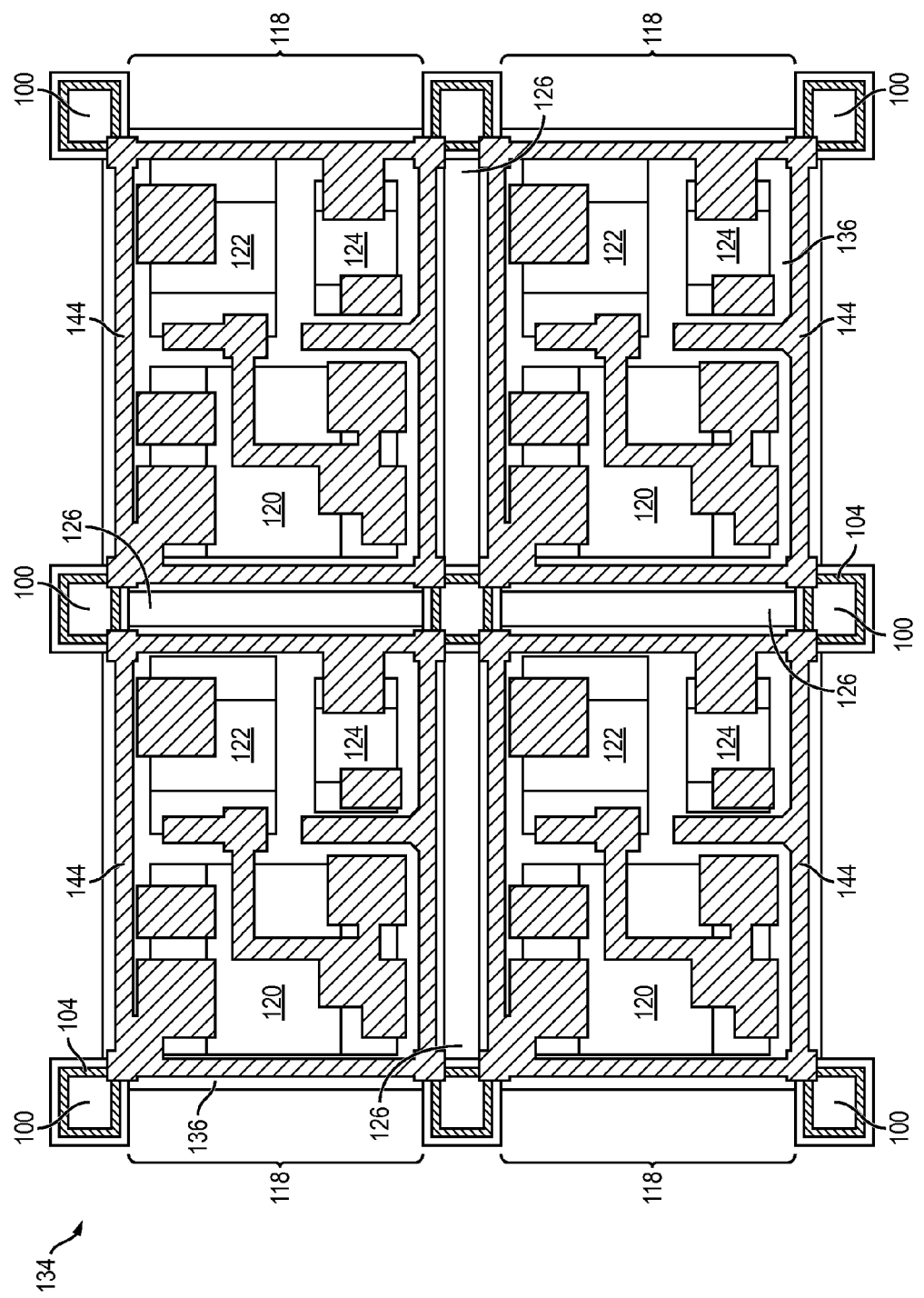

FIG. 5f shows a plan view of a portion of reconstituted panel 134 including further detail of conductive layer or RDL ground plane 144. For purposes of illustration, FIG. 5f shows reconstituted panel 134 without insulating layers 142 and 146. Conductive layer 144 is electrically connected to PCB units 100 disposed at each corner of each module 118 through conductive layer 104. Conductive layer 104 is further electrically connected to conductive layer 106 through PTH 108 of PCB unit 100.

In FIG. 5g, an electrically conductive bump material is deposited over modules 118 and electrically connected to conductive layer 144 using an evaporation, electrolytic plating, electroless plating, ball drop, or screen printing process. The bump material includes Al, Sn, Ni, Au, Ag, lead (Pb), bismuth (Bi), Cu, solder, or combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. The bumps can also be compression bonded to conductive layer 144. Bumps 148 represent one type of interconnect structure that is formed over conductive layer 144. The interconnect structure can also use bond wires, stud bump, micro bump, or other electrical interconnect. Bumps 148 or other interconnect structures are optional, and in one embodiment, are formed after singulation of reconstituted panel 134.

In FIG. 5h, an optional backgrinding tape or support tape 150 is applied over reconstituted panel 134 and in contact with interconnect structure 140. In one embodiment, support tape 150 includes a thermally resistant tape, warpage balancing tape, or other tape. For example, support tape 150 may include a material having high thermal conductivity and high heat resistance. Alternatively, reconstituted panel 134 is placed in a supporting jig with or without support tape 150.

Figure 5I:
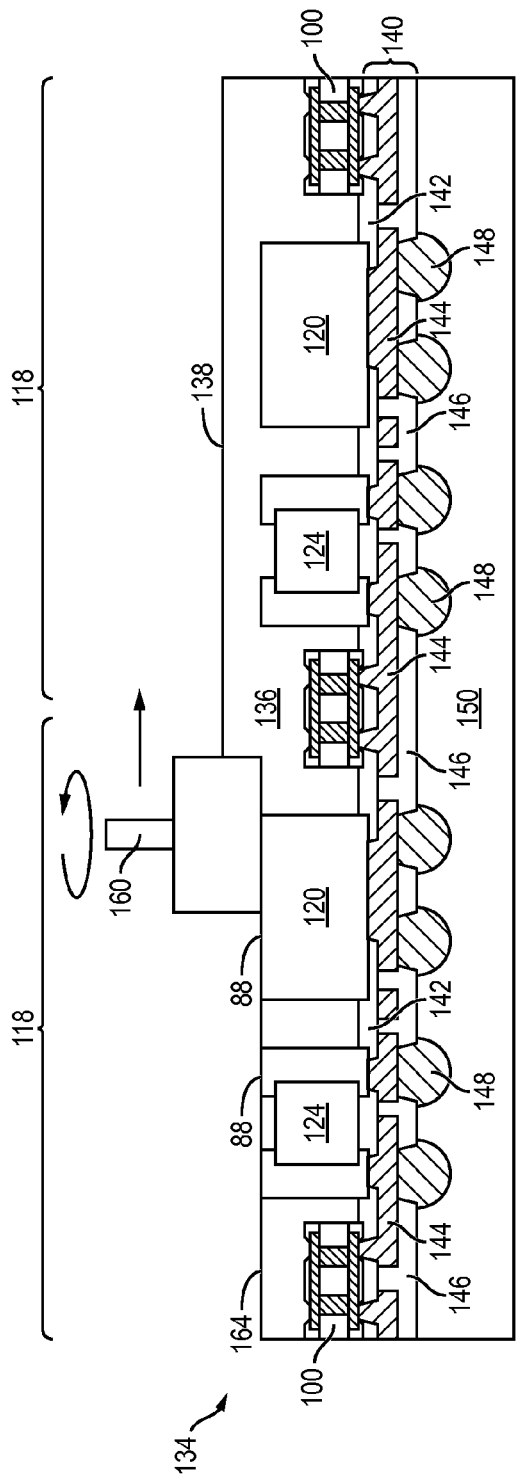

In FIG. 5i, reconstituted panel 134 undergoes an optional backgrinding operation with grinder 160 or other suitable mechanical or etching process to reduce a thickness of reconstituted panel 134 and to expose back surface 88 of components 120-124 coplanar with new back surface 164 of encapsulant 136. The backgrinding operation removes a portion of encapsulant 136 from over PCB units 100 and components 120-124. In one embodiment, the backgrinding operation removes a portion of components 120-124 as well as a portion of encapsulant 136 and leaves new back surface 162 of components 120-124 coplanar with new back surface 164 of encapsulant 136. In one embodiment, surface 116 of PCB units 100 remains covered with encapsulant 136 after backgrinding. In another embodiment, the backgrinding operation removes encapsulant 136 from over back surface 116 of PCB units 100 to expose conductive layer 106 over PTH 108.

Figure 5J:
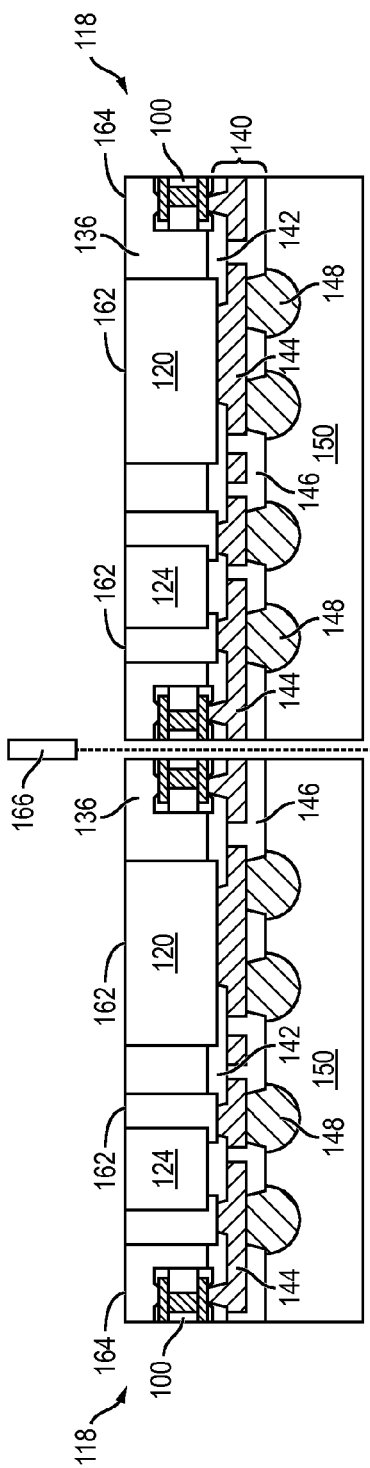

FIG. 5j continues from FIG. 5i and shows reconstituted panel 134 after the backgrinding operation shown in FIG. 5i. In FIG. 5j, reconstituted panel 134 is singulated with saw blade or laser cutting device 166 through PCB units 100 and interconnect structure 140 into individual modules 118.

Figure 5K:
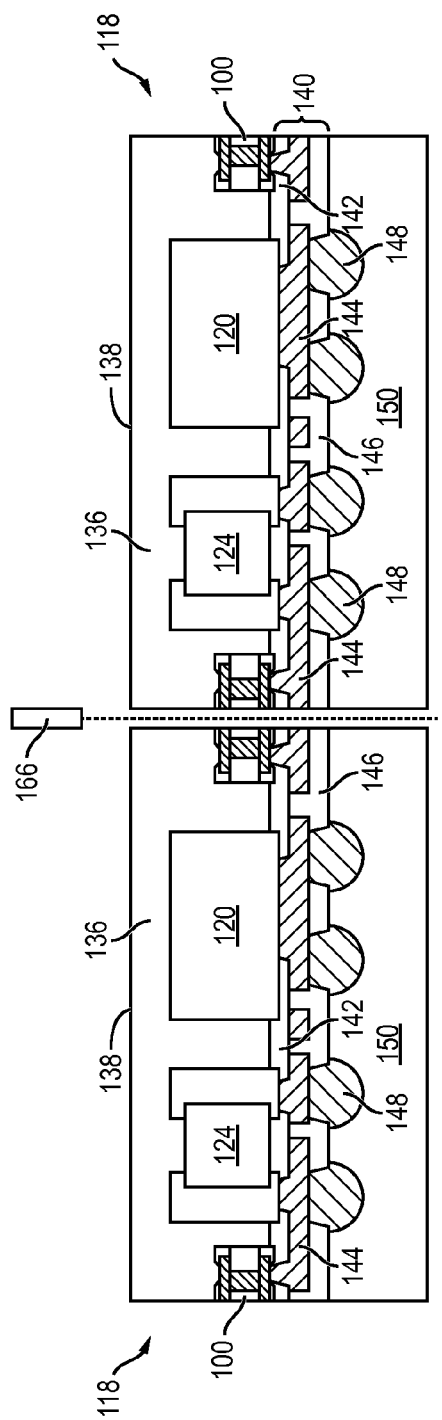

FIG. 5k continues from FIG. 5h and shows reconstituted panel 134 without the optional backgrinding operation shown in FIG. 5i. In FIG. 5k, reconstituted panel 134 is singulated with saw blade or laser cutting device 166 through PCB units 100 and interconnect structure 140 into individual modules 118.

Figure 5M:
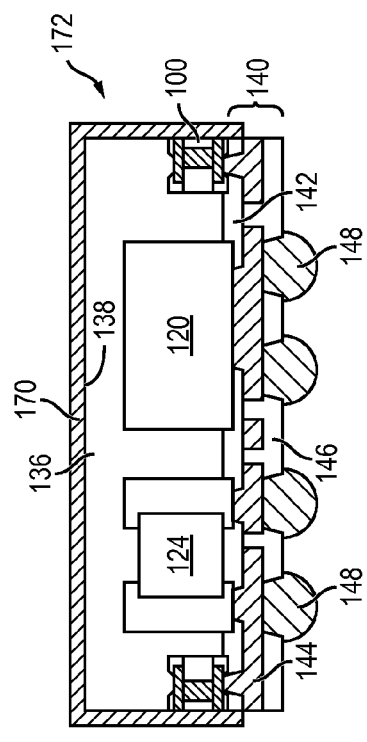
Figure 5L:
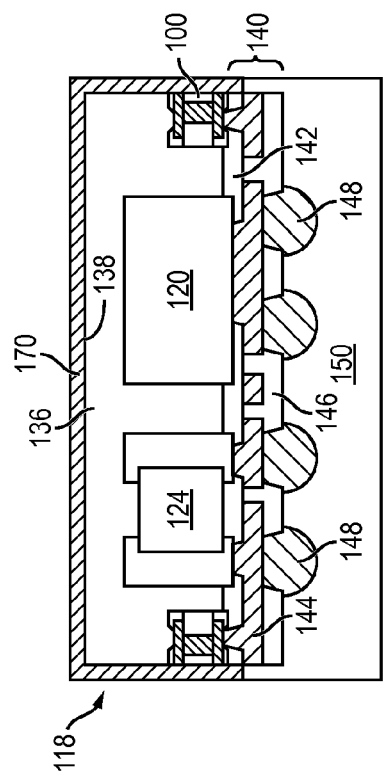

In FIG. 5l, a shielding layer 170 is formed over encapsulant 136. Shielding layer 170 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding layer 170 is patterned and conformally deposited using an electrolytic plating, electroless plating, sputtering, PVD, CVD, or other suitable metal deposition process. Shielding layer 170 can also be a non-metal material such as carbon-black or aluminum flake to reduce the effects of EMI and RFI. For non-metal materials, shielding layer 170 can be applied by lamination, spraying, or painting. Shielding layer 170 encapsulates module 118. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of module 118. Shielding layer 170 is electrically connected through RDL 144, conductive layer 104, PTH 108, and optional conductive layer 106 of PCB unit 100 to an external low-impedance ground point.

FIG. 5m shows support tape 150 removed from over interconnect structure 140 to form EMI shielded module 172. EMI shielded module 172 includes an LC circuit with EMI shielding. Shielding layer 170 encapsulates EMI shielded module 172. Shielding layer 170 extends completely around semiconductor die 84 or components 120-124. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of EMI shielded module 172. RDL 144 forms a ground plane. Conductive layer 104, PTH 108, and optional conductive layer 106 of PCB units 100 provide an electrical connection between shielding layer 170 and RDL 144. PCB units 100 provide a grounding connection. PCB units 100, RDL 144, and shielding layer 170 surround semiconductor die 84 or components 120-124 as part of a faraday cage providing EMI and RFI shielding to EMI shielded module 172. PCB units 100, RDL 144, and shielding layer 170 surround semiconductor die 84 or components 120-124 and route EMI, RFI, and other interfering signals from shielding layer 170 to an external low-impedance ground point. Accordingly, PCB units 100, RDL 144, and shielding layer 170 provide effective EMI and RFI shielding for EMI shielded module 172. PCB units 100 have a height less than a height of semiconductor die 84 or components 120-124. PCB unit 100 acts as a modular interconnect structure providing connectivity to EMI shielded module 172. In one embodiment, components 120-124 form an LC circuit.

Figure 6A:
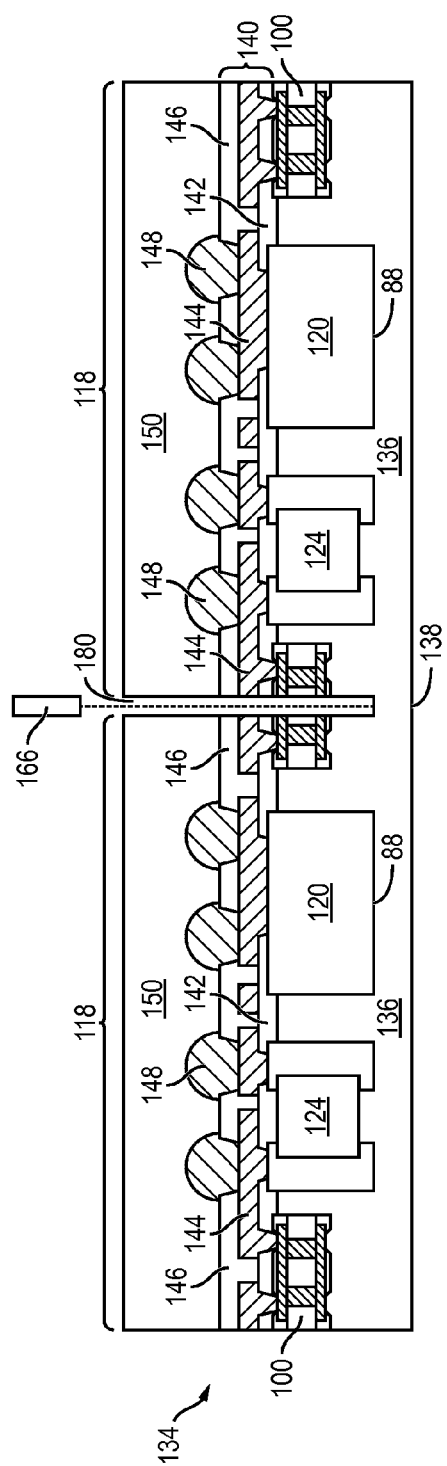
FIGS. 6a-6b illustrate another method of singulating an EMI shielded module.
Figure 6B:
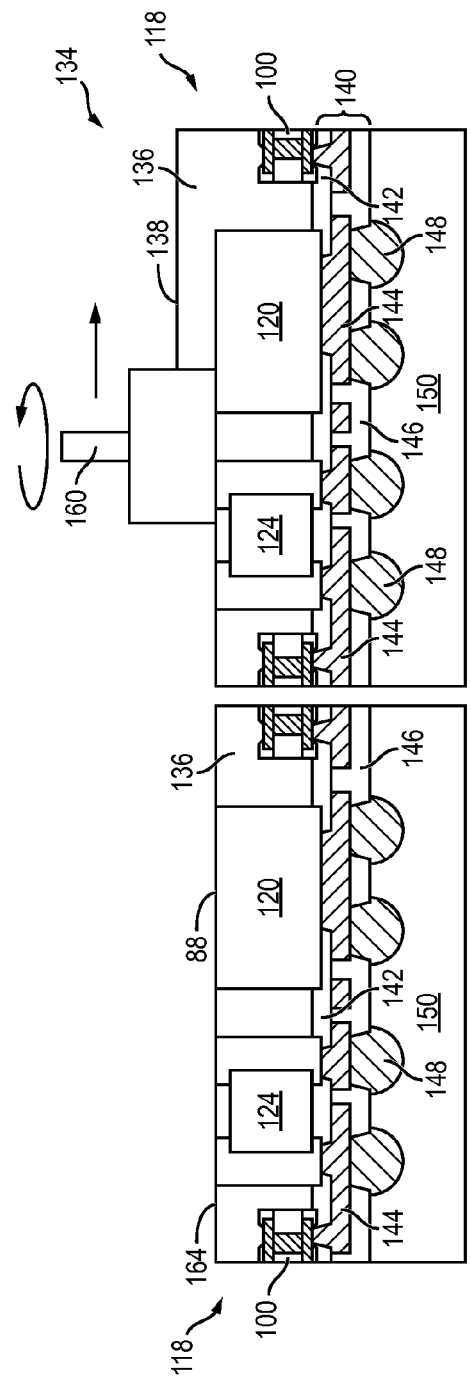

FIGS. 6a-6b illustrate, in relation to FIGS. 5a-5m, an alternative method of singulating reconstituted panel 134. FIG. 6a shows a cross-sectional view of a portion of reconstituted panel 134. In FIG. 6a, a trench 180 is formed in the front side of reconstituted panel 134 with saw blade or laser cutting device 166. Trench 180 cuts fully through PCB units 100 and interconnect structure 140. Trench 180 cuts partially through encapsulant 136. Trench 180 stops short of surface 138 of encapsulant 136. In one embodiment, trench 180 is formed to a depth of back surface 88 of components 120-124.

In FIG. 6b, reconstituted panel 134 undergoes a backgrinding operation with grinder 160 or other suitable mechanical or etching process to reduce a thickness of reconstituted panel 134 and to singulate modules 118. In one embodiment, the backgrinding operation exposes back surface 88 of components 120-124. The backgrinding operation removes a portion of encapsulant 136 from over PCB units 100 and components 120-124 leaving new back surface 164 of encapsulant 136. In one embodiment, the backgrinding operation removes a portion of components 120-124 as well as a portion of encapsulant 136 and leaves new back surface 162 of components 120-124 coplanar with new back surface 164 of encapsulant 136. In one embodiment, surface 116 of PCB units 100 remains covered with encapsulant 136 after backgrinding. In another embodiment, the backgrinding operation removes encapsulant 136 from over back surface 116 of PCB units 100 to expose conductive layer 106 over PTH 108. Singulated module 118 of FIG. 6b is equivalent to singulated module 118 of FIG. 5j. Processing of singulated module 118 continues with formation of shielding layer 170 as shown in FIG. 5l and explained above.

FIGS. 7a-7h illustrate, in relation to FIGS. 5a-5m, an alternative method of making an EMI shielded module with longer PCB units disposed along each side of the EMI shielded module. In the present embodiment, longer PCB units 190, disposed along the edges of module 192 replace corner PCB units 100 of module 118. PCB units 190 include base material 102, conductive layer 104 and optional conductive layer 106 formed on opposing surfaces of base material 102, and optional PTH 108, as shown in FIG. 3. PCB units 190 are longer than PCB units 100. In one embodiment, some PCB units 190 are approximately 3 mm in length while other PCB units 190 are approximately 5 mm in length.

Figure 7A:
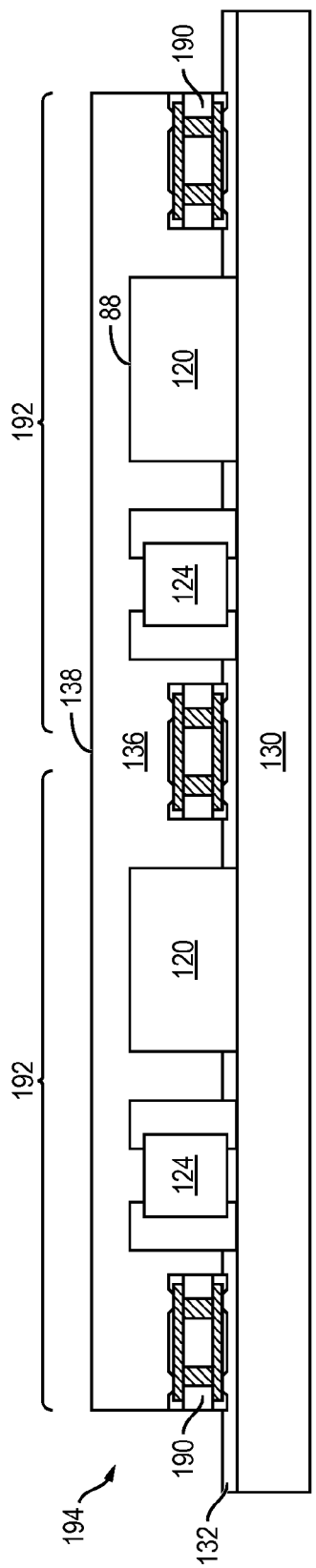
FIGS. 7a-7h illustrate a method of making an EMI shielded module including side PCB units.

FIG. 7a shows a cross-sectional view of a portion of a carrier or temporary substrate 130 containing sacrificial base material such as silicon, polymer, beryllium oxide, glass, or other suitable low-cost, rigid material for structural support. An interface layer or double-sided tape 132 is formed over carrier 130 as a temporary adhesive bonding film, etch-stop layer, or thermal release layer. Components 120-124 or semiconductor die 84 from FIG. 2d and PCB units 190 are mounted to interface layer 132 and over carrier 130 using, for example, a pick and place operation with front surface 114 of PCB units 190 and active surface 90 of components 120-124 or semiconductor die 84 oriented toward the carrier. Components 120-124 and PCB units 190 are arranged to form module 192. FIG. 7a shows components 120-124 and PCB units 190 mounted to interface layer 132 of carrier 130 as reconstituted panel or reconfigured wafer 194. PCB units 190 have a height less than a height of components 120-124. PCB unit 190 acts as a modular interconnect structure providing connectivity to module 192.

FIG. 7a shows an encapsulant or molding compound 136 deposited over reconstituted panel 194 including PCB units 190, components 120-124, and carrier 130 using a paste printing, compressive molding, transfer molding, liquid encapsulant molding, vacuum lamination, or other suitable applicator. Encapsulant 136 can be polymer composite material, such as epoxy resin with filler, epoxy acrylate with filler, or polymer with proper filler. Encapsulant 136 is non-conductive, provides physical support, and environmentally protects the semiconductor device from external elements and contaminants. Encapsulant 136 is deposited between PCB units 190 and components 120-124 to cover the side surfaces of PCB units 190 and components 120-124. In one embodiment, encapsulant 136 is deposited using film-assisted molding process to leave back surface 88 of components 120-124 devoid of the encapsulant.

Figure 7C:
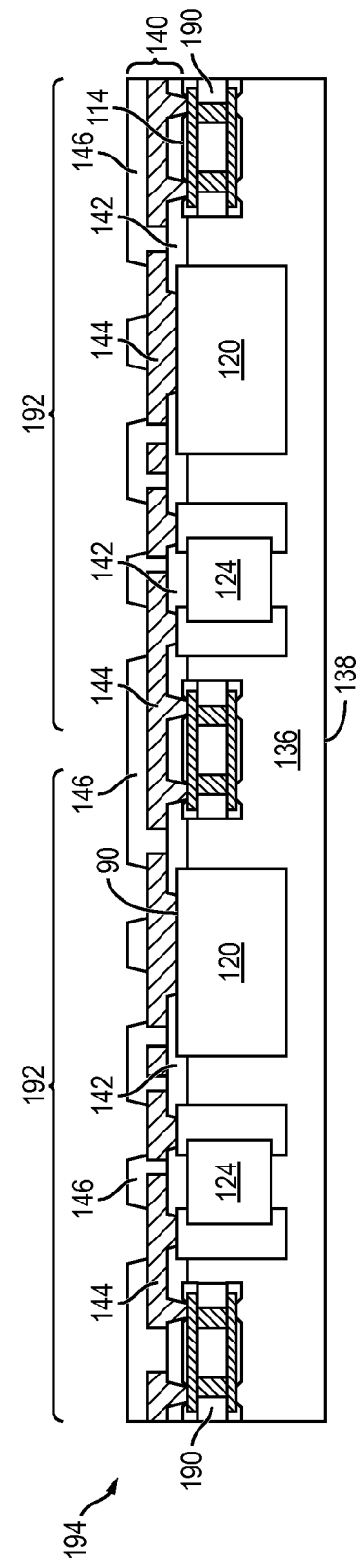
Figure 7B:
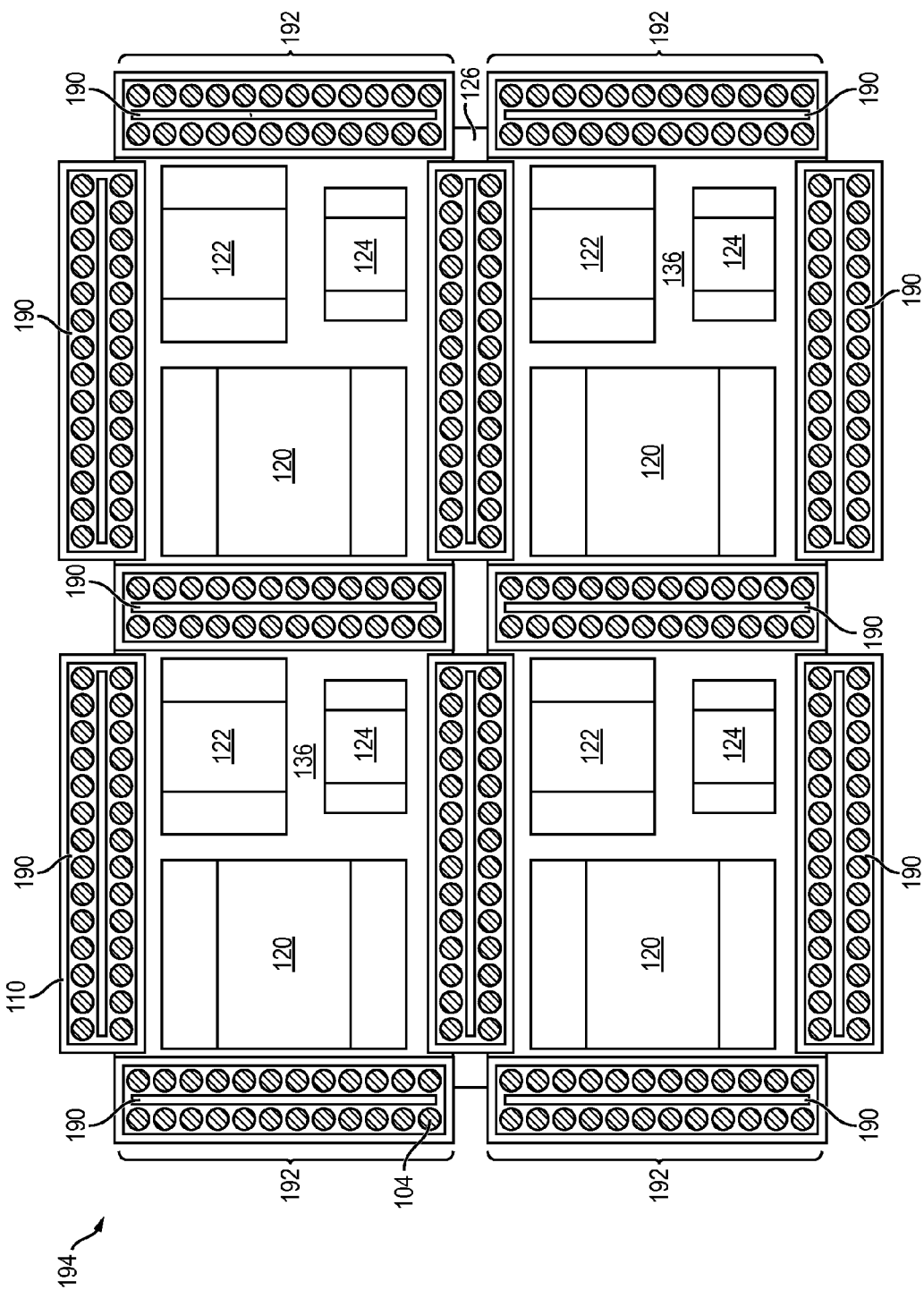

In FIG. 7b, temporary carrier 130 and optional interface layer 132 are removed from reconstituted panel 194 by chemical etching, mechanical peel-off, CMP, mechanical grinding, thermal bake, laser scanning, or wet stripping. Front surface 114 of PCB units 190 and active surface 90 of components 120-124 are exposed after carrier 130 and interface layer 132 is removed. FIG. 7b shows a plan view of a portion of reconstituted panel 194.

In FIG. 7c, a build-up interconnect structure 140 is formed over PCB units 190, components 120-124, and encapsulant 136. Insulating or passivation layer 142 is formed over front surface 114 of PCB units 190, active surface 90 of components 120-124, and encapsulant 136 using PVD, CVD, printing, spin coating, spray coating, sintering or thermal oxidation. Insulating layer 142 contains one or more layers of SiO2, Si3N4, SiON, Ta2O5, Al2O3, or other material having similar insulating and structural properties. A portion of insulating layer 142 is removed by an etching process to expose conductive layer 104 of PCB unit 190 and portions of components 120-124.

An electrically conductive layer 144 is formed over insulating layer 142, conductive layer 104 of PCB unit 190, and components 120-124 using a patterning and metal deposition process such as PVD, CVD, sputtering, electrolytic plating, electroless seed layer deposition, and electroless plating. Conductive layer 144 includes one or more layers of Al, Cu, Ti, TiW, tin Sn, Ni, Au, Ag, W, or other suitable electrically conductive material or combination thereof. Conductive layer 144 operates as an RDL ground plane to provide EMI shielding for module 192. In one embodiment, conductive layer 144 operates as an RDL to redistribute electrical connection from components 120-124 to outside a footprint of module 192. One portion of conductive layer 144 is electrically connected to conductive layer 104 of PCB unit 190, while other portions of conductive layer 144 are electrically connected to contact pads 92 of components 120-124. Still other portions of conductive layer 144 are electrically common or electrically isolated depending on the design and function of the semiconductor device. Conductive layer 144 electrically connects components 120-124 to conductive layer 104 of PCB units 190.

An insulating or passivation layer 146 is formed over insulating layer 142 and conductive layer 144 using PVD, CVD, printing, spin coating, spray coating, sintering or thermal oxidation. Insulating layer 146 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 146 is removed by LDA or an etching process through a patterned photoresist layer to expose portions of conductive layer 144.

Figure 7D:
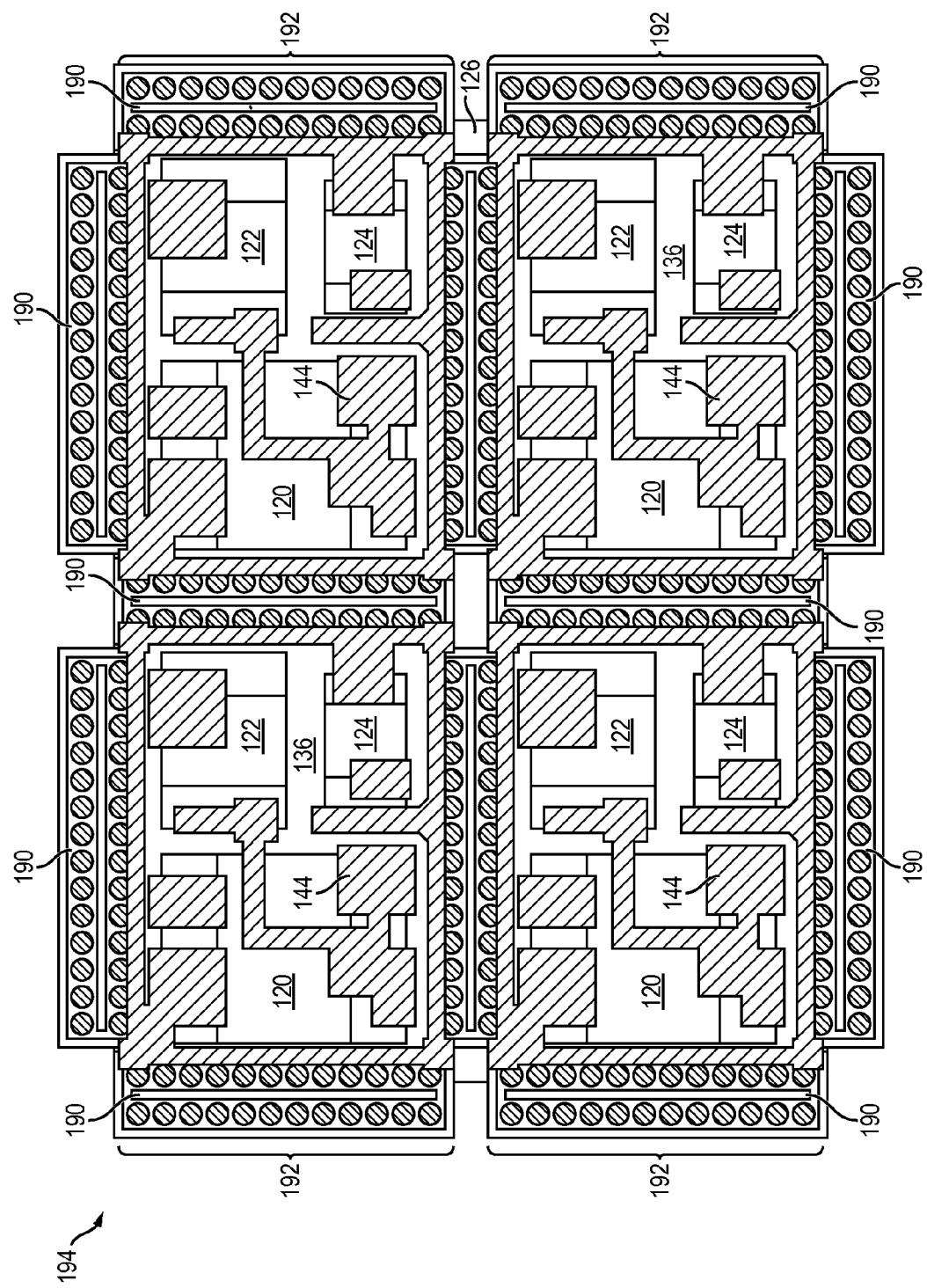

FIG. 7d shows a plan view of a portion of reconstituted panel 194 including further detail of conductive layer or RDL ground plane 144. For purposes of illustration, FIG. 7d shows reconstituted panel 194 without insulating layers 142 and 146. Conductive layer 144 is electrically connected to PCB units 190 disposed along each edge of each module 192 through conductive layer 104. Conductive layer 104 is further electrically connected to conductive layer 106 through PTH 108 of PCB unit 190.

Figure 7E:
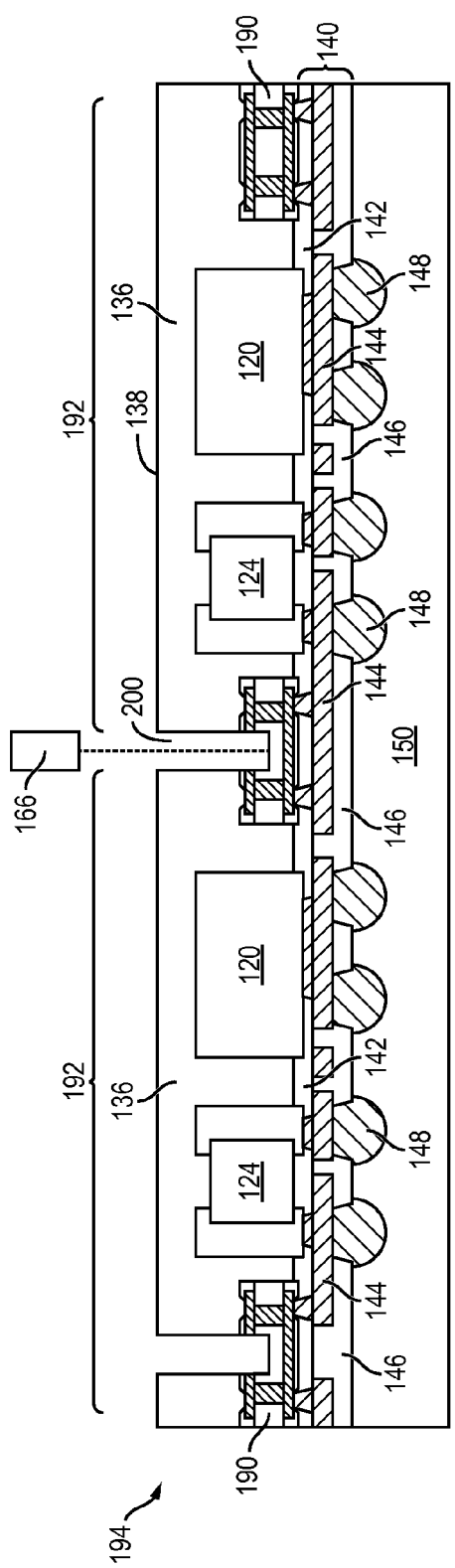

In FIG. 7e, an electrically conductive bump material is deposited over modules 192 and electrically connected to conductive layer 144 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. The bumps can also be compression bonded to conductive layer 144. Bumps 148 represent one type of interconnect structure that is formed over conductive layer 144. The interconnect structure can also use bond wires, stud bump, micro bump, or other electrical interconnect. Bumps 148 or other interconnect structures are optional, and in one embodiment, are formed after singulation of reconstituted panel 134.

Backgrinding tape or support tape 150 is applied over reconstituted panel 194 and in contact with interconnect structure 140. In one embodiment, support tape 150 includes a thermally resistant tape, warpage balancing tape, or other tape. For example, support tape 150 may include a material having high thermal conductivity and high heat resistance. Alternatively, reconstituted panel 194 is placed in a supporting jig with or without support tape 150.

In FIG. 7e, a wide trench 200 is formed in the back side of reconstituted panel 194 including surface 138 of encapsulant 136 with saw blade or laser cutting device 166. Saw blade 166 uses a relatively wide blade to make wide trench 200. Wide trench 200 cuts fully through encapsulant 136. Wide trench 200 cuts partially through PCB units 190 through back surface 116. Wide trench 200 cuts completely through insulating layer 112 and conductive layer 106. Wide trench 200 cuts partially through base material 102. Wide trench 200 stops short of conductive layer 104.

Figure 7F:
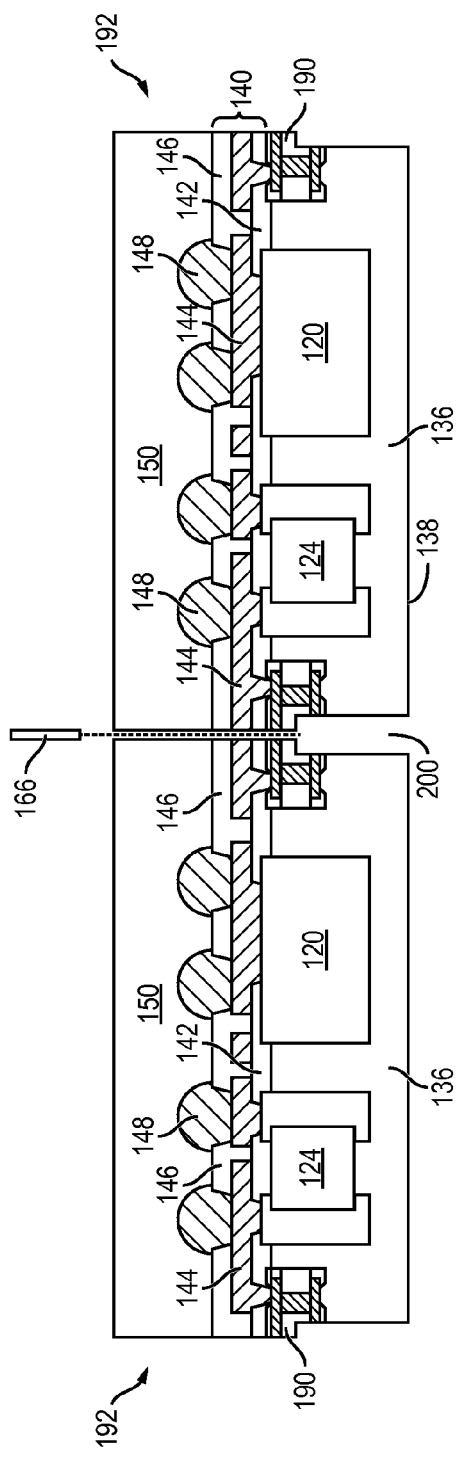

In FIG. 7f, reconstituted panel 194 is singulated with saw blade or laser cutting device 166 through interconnect structure 140 and the remainder of PCB units 190 into individual modules 192. Saw blade 166 uses a relatively narrower saw blade than that used to form wide trench 200. Saw blade 166 singulates modules 192 from the front side.

Figure 7G:
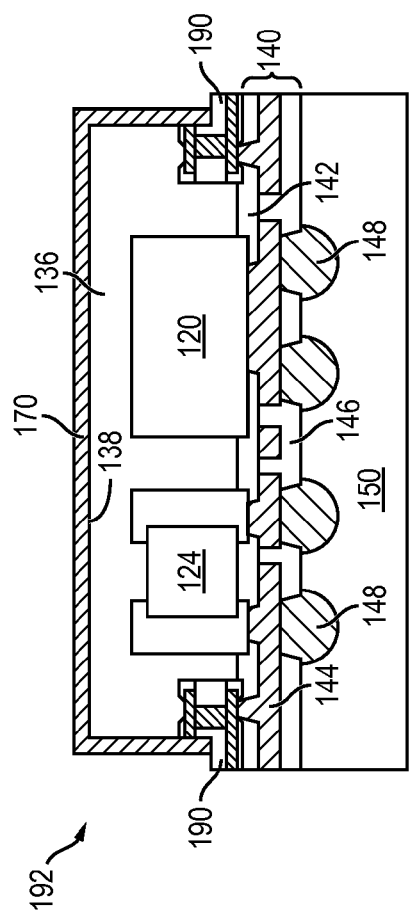

In FIG. 7g, a shielding layer 170 is formed over encapsulant 136. Shielding layer 170 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding layer 170 is patterned and conformally deposited using an electrolytic plating, electroless plating, sputtering, PVD, CVD, or other suitable metal deposition process. Shielding layer 170 can also be a non-metal material such as carbon-black or aluminum flake to reduce the effects of EMI and RFI. For non-metal materials, shielding layer 170 can be applied by lamination, spraying, or painting. Shielding layer 170 encapsulates module 118. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of module 192. Shielding layer 170 is electrically connected through RDL 144, optional conductive layer 106, PTH 108, and conductive layer 104 of PCB unit 190 to an external low-impedance ground point. Shielding layer 170 encapsulates module 192.

Figure 7H:
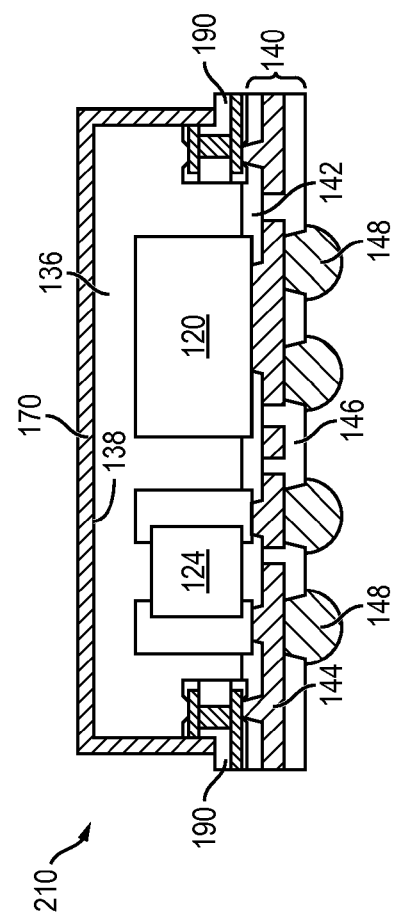

FIG. 7h shows support tape 150 removed from over interconnect structure 140 to form EMI shielded module 210. EMI shielded module 210 includes an LC circuit with EMI shielding. Shielding layer 170 encapsulates EMI shielded module 210. Shielding layer 170 extends completely around semiconductor die 84 or components 120-124. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of EMI shielded module 210. RDL 144 forms a ground plane. Optional conductive layer 106, PTH 108, and conductive layer 104 of PCB units 190 provide an electrical connection between shielding layer 170 and RDL 144 as part of an EMI shield. PCB units 190 provide a grounding connection. PCB units 190, RDL 144, and shielding layer 170 surround semiconductor die 84 or components 120-124 as part of a faraday cage providing EMI and RFI shielding to EMI shielded module 210. PCB units 190, RDL 144, and shielding layer 170 surround semiconductor die 84 or components 120-124 and route EMI, RFI, and other interfering signals from shielding layer 170 to an external low-impedance ground point. Accordingly, PCB units 190, RDL 144, and shielding layer 170 provide effective EMI and RFI shielding for EMI shielded module 210. PCB units 190 have a height less than a height of components 120-124. PCB unit 190 acts as a modular interconnect structure providing connectivity to EMI shielded module 210. In one embodiment, components 120-124 form an LC circuit.

Figure 8A:
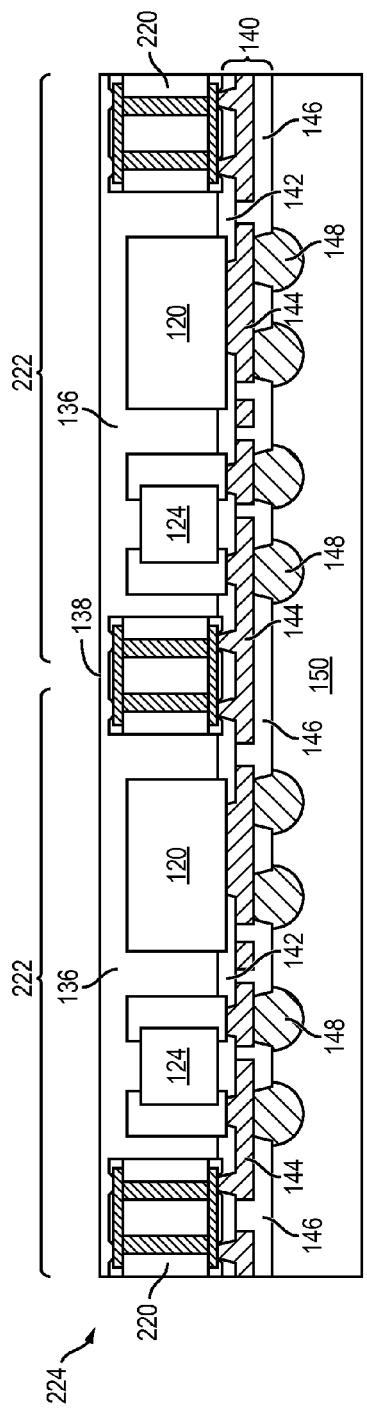

FIGS. 8a-8f illustrate, in relation to FIGS. 7a-7h, an alternative method of making an EMI shielded module with taller PCB units disposed along each side of the EMI shielded module. In the present embodiment, taller PCB units 220, disposed along the edges of module 222 replace PCB units 190 of module 192. PCB units 220 include base material 102, conductive layer 104 and optional conductive layer 106 formed on opposing surfaces of base material 102, and optional PTH 108, as shown in FIG. 3. PCB units 220 are longer than PCB units 100, and taller than PCB units 190. In one embodiment, some PCB units 220 are approximately 3 mm in length while other PCB units 220 are approximately 5 mm in length. In one embodiment, PCB units 220 are taller than components 120-124. FIG. 8a shows a cross-sectional view of a portion of reconstituted panel 224, similar to reconsitituted wafer 194 from FIG. 7e, but with taller PCB units 220 disposed along each edge of each module 222. PCB units 220 have a height greater than a height of components 120-124. PCB unit 220 acts as a modular interconnect structure providing connectivity to module 222.

Figure 8B:
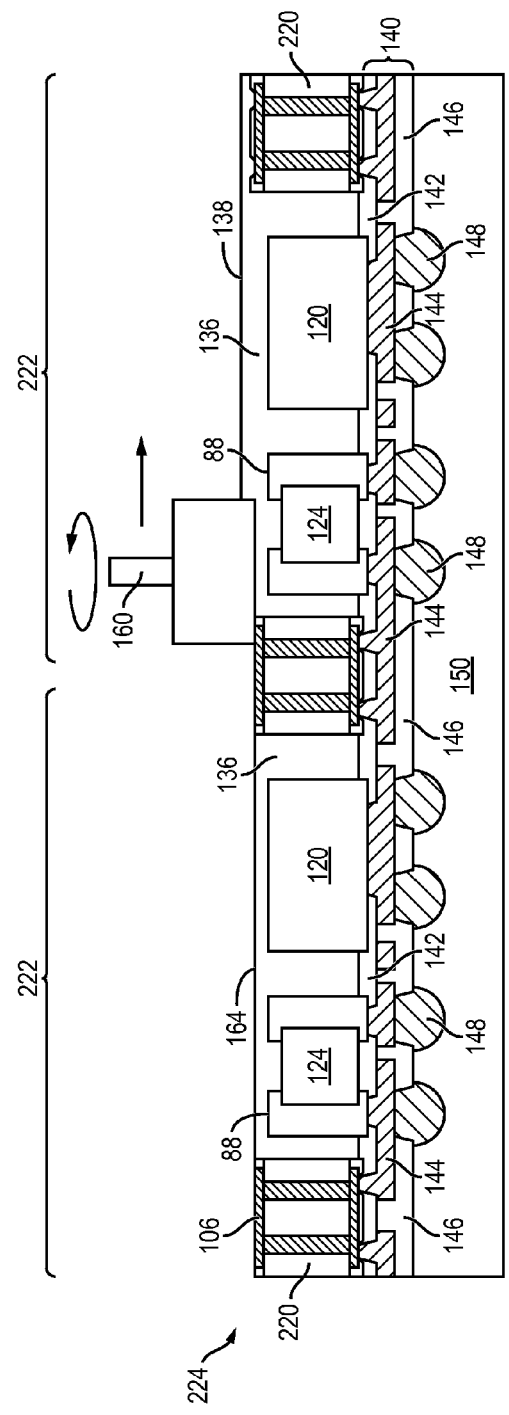

In FIG. 8b, reconstituted panel 224 undergoes an optional backgrinding operation with grinder 160 or other suitable mechanical or etching process to reduce a thickness of reconstituted panel 224 and to expose conductive layer 106 of PCB unit 220. The backgrinding operation removes all of encapsulant 136 from over PCB units 220, as well as insulating layer 112, exposing conductive layer 106. The backgrinding operation removes a portion of encapsulant 136 from over components 120-124 leaving new back surface 164 of encapsulant 136. In one embodiment, the backgrinding operation removes a portion of components 120-124 as well as a portion of encapsulant 136 and leaves new back surface 162 of components 120-124 coplanar with new back surface 164 of encapsulant 136. In another embodiment, back surface 88 of components 120-124 remains covered with encapsulant 136 after backgrinding.

FIG. 8c shows reconstituted panel 224 after the backgrinding operation shown in FIG. 8b. In FIG. 8c, a layer of thermally conductive material 226 is applied over conductive layer 106 and surface 164 of encapsulant 136. Thermally conductive layer 226 provides superior thermal conductivity and adhesion to surface 164 of encapsulant 136. Thermally conductive layer 226 can be Ti, Invar alloy, stainless steel, Chromium (Cr)/Cu alloy, Ni, or thermal conductive paste.

A shielding lid 228 is formed over thermally conductive layer 226. Shielding lid 228 can be Cu, Al, ferrite or carbonyl iron, stainless steel, nickel silver, low-carbon steel, silicon-iron steel, foil, conductive composite, and other metals and composites capable of blocking or absorbing EMI, RFI, harmonic distortion, and other inter-device interference. Shielding lid 228 is patterned and conformally deposited using an electrolytic plating, electroless plating, sputtering, PVD, CVD, or other suitable metal deposition process. In one embodiment, shielding lid 228 includes an outer layer with improved anti-corrosive properties. Shielding lid 228 can also be a non-metal material such as carbon-black or aluminum flake to reduce the effects of EMI and RFI. For non-metal materials, shielding lid 228 can be applied by lamination, spraying, or painting. Shielding lid 228 is electrically connected through RDL 144, optional conductive layer 106, PTH 108, and conductive layer 104 of PCB unit 220 to an external low-impedance ground point. In one embodiment, shielding lid 228 is pre-formed and attached, via thermally conductive layer 226, to reconstituted panel 224. Shielding lid 228 substantially covers all areas of encapsulant 136 relative to the top of semiconductor die 84 or components 120-124 to provide protection for the enclosed semiconductor devices against EMI, RFI, or other inter-device interference. PCB units 220 provides protection for the enclosed semiconductor devices against EMI, RFI, or other inter-device interference relative to the sides of module 222. The interference can be generated internally or come from external semiconductor devices containing IPDs or RF circuits. In one embodiment, thermally conductive layer 226 is snap cured.

In FIG. 8d, reconstituted panel 224 is singulated with saw blade or laser cutting device 166 through interconnect structure 140, PCB units 220, thermally conductive layer 226, and shielding lid 228 into individual modules 222. Saw blade 166 singulates modules 222 from the front side.

Figure 8E:
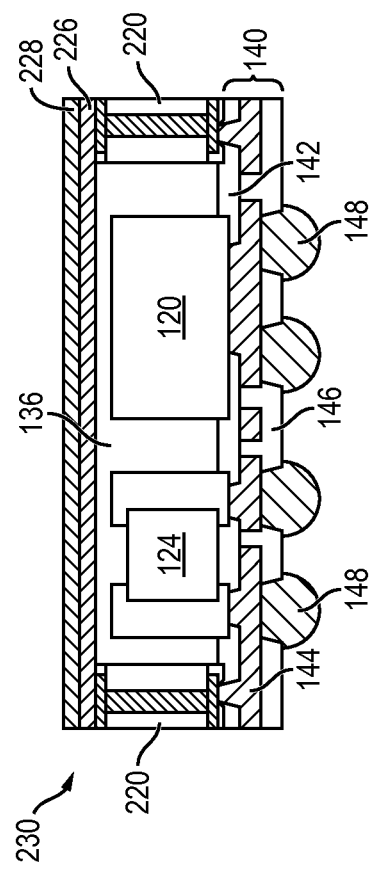

FIG. 8e shows support tape 150 removed from over interconnect structure 140 to form EMI shielded module 230. EMI shielded module 230 includes an LC circuit with EMI shielding. Shielding lid 228 forms a conductive lid over EMI shielded module 230. RDL 144 forms a ground plane. Conductive layers 104 and 106, and PTH 108 of PCB units 220 provide an electrical connection between shielding lid 228, thermally conductive layer 226, and RDL 144. PCB units 220 provide a grounding connection. PCB units 220 act as modular interconnect structures providing connectivity to EMI shielded module 230. PCB units 220, RDL 144, thermally conductive layer 226, and shielding lid 228 extend completely around semiconductor die 84 or components 120-124. Shielding lid 228 substantially covers all areas of encapsulant 136 relative to the top of semiconductor die 84 or components 120-124 to provide protection for the enclosed semiconductor devices against EMI, RFI, or other inter-device interference. PCB units 220 provides protection for the enclosed semiconductor devices against EMI, RFI, or other inter-device interference relative to the sides of EMI shielded module 230. The interference can be generated internally or come from external semiconductor devices containing IPDs or RF circuits. PCB units 220, RDL 144, thermally conductive layer 226, and shielding lid 228 surround semiconductor die 84 or components 120-124 as part of a faraday cage providing EMI and RFI shielding to EMI shielded module 230. PCB units 220, RDL 144, thermally conductive layer 226, and shielding lid 228 surround semiconductor die 84 or components 120-124 and route EMI, RFI, and other interfering signals from PCB units 220, RDL 144, thermally conductive layer 226, and shielding lid 228 to an external low-impedance ground point. Accordingly, PCB units 220, RDL 144, thermally conductive layer 226, and shielding lid 228 provide effective EMI and RFI shielding for EMI shielded module 230. In one embodiment, components 120-124 form an LC circuit. A height of PCB units 220 is greater than a height of components 120-124.

Figure 8F:
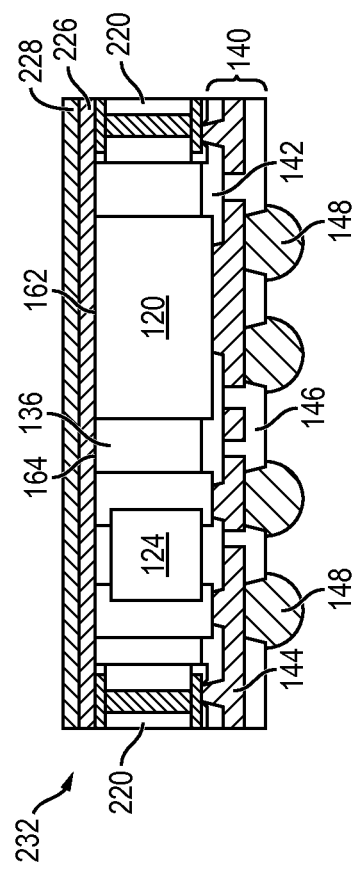

FIG. 8f continues from FIG. 8b with the backgrinding operation removing a portion of components 120-124 as well as a portion of encapsulant 136 and leaving new back surface 162 of components 120-124 coplanar with new back surface 164 of encapsulant 136. In one embodiment, new back surface 162 of components 120-124 and new back surface 164 of encapsulant 136 are coplanar with conductive layer 106 of PCB unit 220. FIG. 8f shows thermally conductive layer 226 applied over conductive layer 106, surface 162 of components 120-124, and surface 164 of encapsulant 136. A shielding lid 228 is formed over thermally conductive layer 226. Shielding lid 228 is electrically connected through RDL 144, conductive layer 106, PTH 108, and conductive layer 104 of PCB unit 220 to an external low-impedance ground point.

FIG. 8f shows support tape 150 removed from over interconnect structure 140 to form EMI shielded module 232. EMI shielded module 232 includes an LC circuit with EMI shielding. Shielding lid 228 forms a conductive lid over EMI shielded module 232. RDL 144 forms a ground plane. PCB units 220 provide an electrical connection between shielding lid 228, thermally conductive layer 226, and RDL 144 through conductive layers 104 and 106, and PTH 108. Shielding lid 228 substantially covers all areas of encapsulant 136 relative to the top of semiconductor die 84 or components 120-124 to provide protection for the enclosed semiconductor devices against EMI, RFI, or other inter-device interference. PCB units 220, RDL 144, thermally conductive layer 226, and shielding lid 228 surround semiconductor die 84 or components 120-124 as part of a faraday cage providing EMI and RFI shielding to EMI shielded module 232. A height of PCB units 220 is equal to a height of components 120-124.

Figure 9D:
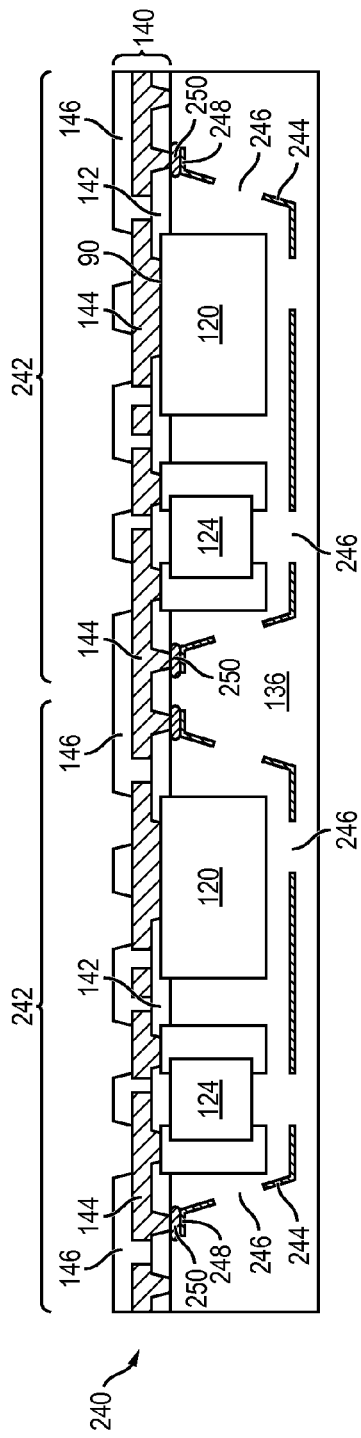

FIGS. 9a-9h illustrate, in relation to FIGS. 5a-5m, an alternative method of making an EMI shielded module with an embedded conductive shielding cage including mesh holes. FIG. 9a shows a cross-sectional view of a portion of a carrier or temporary substrate 130 containing sacrificial base material such as silicon, polymer, beryllium oxide, glass, or other suitable low-cost, rigid material for structural support. An interface layer or double-sided tape 132 is formed over carrier 130 as a temporary adhesive bonding film, etch-stop layer, or thermal release layer. Components 120-124 or semiconductor die 84 from FIG. 2d are mounted to interface layer 132 and over carrier 130 using, for example, a pick and place operation with active surface 90 of components 120-124 or semiconductor die 84 oriented toward the carrier. Components 120-124 are arranged to form module 242. FIG. 9a shows components 120-124 mounted to interface layer 132 of carrier 130 as reconstituted panel or reconfigured wafer 240.

In FIG. 9b, a shielding cage 244 is disposed over module 242 and carrier 130 using, for example, a pick and place operation. Shielding cage 244 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding cage 244 is patterned and conformally deposited using an electrolytic plating, electroless plating, sputtering, PVD, CVD, or other suitable metal deposition process.

Shielding cage 244 can also be a non-metal material such as carbon-black or aluminum flake to reduce the effects of EMI and RFI. For non-metal materials, shielding cage 244 can be applied by lamination, spraying, or painting. Shielding cage 244 includes mesh holes 246. Mesh holes 246 are sized and positioned in shielding cage 244 to ensure effective EMI shielding. Mesh holes 246 are sized and positioned in shielding cage 244 to ensure efficient flow of encapsulation material. In one embodiment, mesh holes 246 are positioned in shielding cage 244 to maximize EMI shielding. The thickness of shielding cage 244 is designed to provide sufficient EMI shielding capability. The size of feet 248 of shielding cage 244 is designed to provide sufficient EMI shielding capability. The thickness of shielding cage 244 is also designed to provide sufficient adhesion to interface layer 132. The size of feet 248 of shielding cage 244 is also designed to provide sufficient adhesion to interface layer 132. Shielding cage 244 substantially covers all areas of module 242 relative to the top of semiconductor die 84 and components 120-124 to provide protection for the enclosed semiconductor devices against EMI, RFI, or other inter-device interference. The interference can be generated internally or come from external semiconductor devices containing IPDs or RF circuits. Shielding cage 244 can also provide inter-device interference protection relative to the sides of module 242.

In FIG. 9c, an encapsulant or molding compound 136 deposited over reconstituted panel 240 including shielding cage 244, components 120-124, and carrier 130 using a paste printing, compressive molding, transfer molding, liquid encapsulant molding, vacuum lamination, or other suitable applicator. Encapsulant 136 can be polymer composite material, such as epoxy resin with filler, epoxy acrylate with filler, or polymer with proper filler. Encapsulant 136 is non-conductive, provides physical support, and environmentally protects the semiconductor device from external elements and contaminants. Encapsulant 136 is deposited between shielding cage 244 and components 120-124 to cover the side surfaces of shielding cage 244 and components 120-124. Encapsulant 136 flows through mesh holes 246 of shielding cage 244 to fully encapsulate shielding cage 244, components 120-124, and carrier 130. In one embodiment, encapsulant 136 is deposited using film-assisted molding process to leave a backside of shielding cage 244 devoid of the encapsulant.

In FIG. 9d, temporary carrier 130 and optional interface layer 132 are removed from reconstituted panel 240 by chemical etching, mechanical peel-off, CMP, mechanical grinding, thermal bake, laser scanning, or wet stripping. Feet 248 of shielding cage 244 and active surface 90 of components 120-124 are exposed after carrier 130 and interface layer 132 are removed. In FIG. 9d, a conductive adhesive 250 is applied to exposed feet 248 of shielding cage 244. Conductive adhesive 250 can be thermal epoxy, thermal epoxy resin, thermal conductive paste, aluminum oxide, zinc oxide, boron nitride, pulverized silver, or thermal grease. FIG. 9d shows a build-up interconnect structure 140 formed over conductive adhesive 250, components 120-124, and encapsulant 136. Insulating or passivation layer 142 is formed over conductive adhesive 250, components 120-124, and encapsulant 136 using PVD, CVD, printing, spin coating, spray coating, sintering or thermal oxidation. Insulating layer 142 contains one or more layers of SiO2, Si3N4, SiON, Ta2O5, Al2O3, or other material having similar insulating and structural properties. A portion of insulating layer 142 is removed by an etching process to expose conductive adhesive 250 and portions of components 120-124.

An electrically conductive layer 144 is formed over insulating layer 142, conductive adhesive 250, and components 120-124 using a patterning and metal deposition process such as PVD, CVD, sputtering, electrolytic plating, electroless seed layer deposition, and electroless plating. Conductive layer 144 includes one or more layers of Al, Cu, Ti, TiW, tin Sn, Ni, Au, Ag, W, or other suitable electrically conductive material or combination thereof. Conductive layer 144 operates as an RDL ground plane to provide EMI shielding for module 242. In one embodiment, conductive layer 144 operates as an RDL to redistribute electrical connection from components 120-124 to outside a footprint of module 242. One portion of conductive layer 144 is electrically connected to feet 248 of shielding cage 244, while other portions of conductive layer 144 are electrically connected to contact pads 92 of components 120-124. Still other portions of conductive layer 144 are electrically common or electrically isolated depending on the design and function of the semiconductor device. Conductive layer 144 electrically connects components 120-124 to feet 248 of shielding cage 244.

An insulating or passivation layer 146 is formed over insulating layer 142 and conductive layer 144 using PVD, CVD, printing, spin coating, spray coating, sintering or thermal oxidation. Insulating layer 146 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 146 is removed by LDA or an etching process through a patterned photoresist layer to expose portions of conductive layer 144. Shielding cage 244 is electrically connected through RDL 144 to an external low-impedance ground point.

Figure 9E:
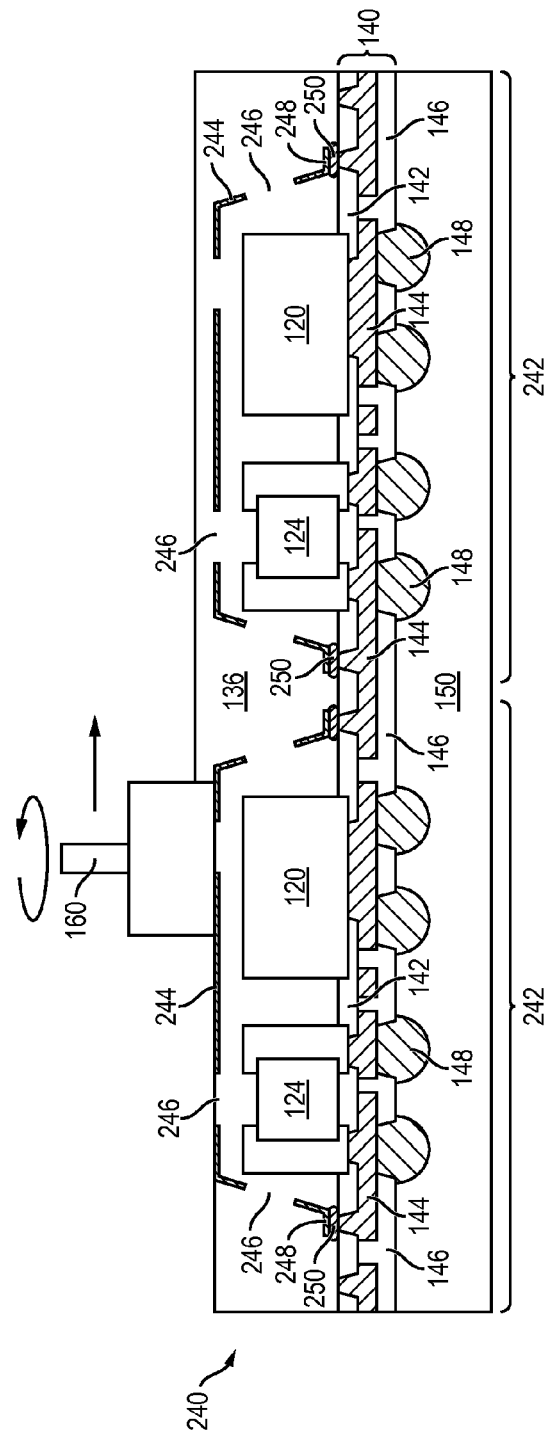

In FIG. 9e, an electrically conductive bump material is deposited over module 242 and electrically connected to conductive layer 144 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. The bumps can also be compression bonded to conductive layer 144. Bumps 148 represent one type of interconnect structure that is formed over conductive layer 144. The interconnect structure can also use bond wires, stud bump, micro bump, or other electrical interconnect. Bumps 148 or other interconnect structures are optional, and in one embodiment, are formed after singulation of reconstituted panel 240.

FIG. 9e shows an optional backgrinding tape or support tape 150 applied over reconstituted panel 240 and in contact with interconnect structure 140. In one embodiment, support tape 150 includes a thermally resistant tape, warpage balancing tape, or other tape. For example, support tape 150 may include a material having high thermal conductivity and high heat resistance. Alternatively, reconstituted panel 240 is placed in a supporting jig with or without support tape 150. In one embodiment, reconstituted panel 240 undergoes an optional backgrinding operation with grinder 160 or other suitable mechanical or etching process to reduce a thickness of encapsulant 136 and reconstituted panel 240. In another embodiment, grinder 160 removes encapsulant 136 exposing a backside of shielding cage 244. In FIG. 9f, reconstituted panel 240 is singulated with saw blade or laser cutting device 166 through encapsulant 136 and interconnect structure 140 into individual modules 242.

In FIG. 9g, support tape 150 is removed from over interconnect structure 140 to form EMI shielded module 260. EMI shielded module 260 includes an LC circuit with EMI shielding. Shielding cage 244 forms a conductive cage surrounding EMI shielded module 260. Shielding cage 244 extends completely around semiconductor die 84 or components 120-124. Shielding cage 244 substantially covers all areas of EMI shielded module 260 relative to the top of semiconductor die 84 and components 120-124 to provide protection for the enclosed semiconductor devices against EMI, RFI, or other inter-device interference. The interference can be generated internally or come from external semiconductor devices containing IPDs or RF circuits. Shielding cage 244 can also provide inter-device interference protection relative to the sides of EMI shielded module 260. RDL 144 forms a ground plane. Conductive adhesive 250 provides an electrical connection between shielding cage 244 and RDL 144. Conductive adhesive 250 provides a grounding connection. Shielding cage 244, conductive adhesive 250, and RDL 144 surround semiconductor die 84 or components 120-124 as part of a faraday cage providing EMI and RFI shielding to EMI shielded module 260. Shielding cage 244, conductive adhesive 250, and RDL 144 surround semiconductor die 84 or components 120-124 and route EMI, RFI, and other interfering signals from shielding cage 244 to an external low-impedance ground point. Accordingly, shielding cage 244, conductive adhesive 250, and RDL 144 provide effective EMI and RFI shielding for EMI shielded module 260. In one embodiment, components 120-124 form an LC circuit.

FIG. 9h shows EMI shielded module 262, similar to EMI shielded module 260. A backside of shielding cage 244 is exposed from encapsulant 136 in EMI shielded module 262. In one embodiment, encapsulant 136 is deposited using film-assisted molding process, leaving a backside of shielding cage 244 devoid of encapsulant. In another embodiment, grinder 160 removes encapsulant 136 exposing a backside of shielding cage 244. EMI shielded module 262 includes an LC circuit with EMI shielding. Shielding cage 244 forms a conductive cage surrounding EMI shielded module 262. Shielding cage 244 extends completely around semiconductor die 84 or components 120-124. Shielding cage 244 substantially covers all areas of EMI shielded module 262 relative to the top of semiconductor die 84 and components 120-124 to provide protection for the enclosed semiconductor devices against EMI, RFI, or other inter-device interference. The interference can be generated internally or come from external semiconductor devices containing IPDs or RF circuits. Shielding cage 244 can also provide inter-device interference protection relative to the sides of EMI shielded module 262. RDL 144 forms a ground plane. Conductive adhesive 250 provides an electrical connection between shielding cage 244 and RDL 144. Conductive adhesive 250 provides a grounding connection. Shielding cage 244, conductive adhesive 250, and RDL 144 surround semiconductor die 84 or components 120-124 as part of a faraday cage providing EMI and RFI shielding to EMI shielded module 262. Shielding cage 244, conductive adhesive 250, and RDL 144 surround semiconductor die 84 or components 120-124 and route EMI, RFI, and other interfering signals from shielding cage 244 to an external low-impedance ground point. Accordingly, shielding cage 244, conductive adhesive 250, and RDL 144 provide effective EMI and RFI shielding for EMI shielded module 262. In one embodiment, components 120-124 form an LC circuit.

FIGS. 10a-10b illustrate, in relation to FIGS. 9a-9f, alternative EMI shielded modules with the shielding cages directly connected to the RDLs. FIG. 10a shows EMI shielded module 270, similar to EMI shielded module 260, but without conductive adhesive 250. In EMI shielded module 270, shielding cage 244 is directly connected, physically and electrically, to RDL 144. EMI shielded module 270 includes an LC circuit with EMI shielding. Shielding cage 244 forms a conductive cage surrounding EMI shielded module 270. Shielding cage 244 extends completely around semiconductor die 84 or components 120-124. Shielding cage 244 substantially covers all areas of EMI shielded module 270 relative to the top of semiconductor die 84 and components 120-124 to provide protection for the enclosed semiconductor devices against EMI, RFI, or other inter-device interference. The interference can be generated internally or come from external semiconductor devices containing IPDs or RF circuits. Shielding cage 244 can also provide inter-device interference protection relative to the sides of EMI shielded module 270. RDL 144 forms a ground plane. Feet 248 of shielding cage 244 directly contact RDL 144. Shielding cage 244 and RDL 144 surround semiconductor die 84 or components 120-124 as part of a faraday cage providing EMI and RFI shielding to EMI shielded module 270. Shielding cage 244 and RDL 144 surround semiconductor die 84 or components 120-124 and route EMI, RFI, and other interfering signals from shielding cage 244 to an external low-impedance ground point. Accordingly, shielding cage 244 and RDL 144 provide effective EMI and RFI shielding for EMI shielded module 270. In one embodiment, components 120-124 form an LC circuit.

FIG. 10b shows EMI shielded module 272, similar to EMI shielded module 262, but without conductive adhesive 250. In EMI shielded module 272, shielding cage 244 is directly connected, physically and electrically, to RDL 144. A backside of shielding cage 244 is exposed from encapsulant 136 in EMI shielded module 272. In one embodiment, encapsulant 136 is deposited using film-assisted molding process, leaving a backside of shielding cage 244 devoid of encapsulant. In another embodiment, grinder 160 removes encapsulant 136 exposing a backside of shielding cage 244. Shielding cage 244 and RDL 144 surround semiconductor die 84 or components 120-124 as part of a faraday cage providing EMI and RFI shielding to EMI shielded module 272.

FIGS. 11a-11b illustrate, in relation to FIGS. 10a-10b, alternative EMI shielded modules including a thermally enhanced adhesive disposed between the components and the shielding cage. FIG. 11a shows EMI shielded module 274, similar to EMI shielded module 270, but with a thermal interface material disposed between shielding cage 244 and components 120-124. In FIG. 11a, thermal interface material 276 is applied over back surface 88 of components 120-124 prior to placing shielding cage 244 over the components. Thermal interface material 276 is typically a composite material including a filler disposed in a resin adhesive. Thermal interface material 276 includes a low Young's modulus. Thermal interface material 276 can include thermal epoxy, thermal epoxy resin, thermal conductive paste, aluminum oxide, zinc oxide, boron nitride, pulverized silver, or thermal grease with organic filler, silica filler, or polymer filler. Thermal interface material 276 improves thermal conductivity between the components 120-124 and the shielding cage 244. Thermal interface material 276 reduces shifting of shielding cage 244 during encapsulation. In EMI shielded module 274, shielding cage 244 is directly connected, physically and electrically, to RDL 144. EMI shielded module 274 includes an LC circuit with EMI shielding. Shielding cage 244 forms a conductive cage surrounding EMI shielded module 274. Shielding cage 244 extends completely around semiconductor die 84 or components 120-124. Shielding cage 244 substantially covers all areas of EMI shielded module 274 relative to the top of semiconductor die 84 and components 120-124 to provide protection for the enclosed semiconductor devices against EMI, RFI, or other inter-device interference. The interference can be generated internally or come from external semiconductor devices containing IPDs or RF circuits. Shielding cage 244 can also provide inter-device interference protection relative to the sides of EMI shielded module 274. RDL 144 forms a ground plane. Feet 248 of shielding cage 244 directly contact RDL 144. Shielding cage 244 and RDL 144 surround semiconductor die 84 or components 120-124 as part of a faraday cage providing EMI and RFI shielding to EMI shielded module 274. Shielding cage 244 and RDL 144 surround semiconductor die 84 or components 120-124 and route EMI, RFI, and other interfering signals from shielding cage 244 to an external low-impedance ground point. Accordingly, shielding cage 244 and RDL 144 provide effective EMI and RFI shielding for EMI shielded module 274. In one embodiment, components 120-124 form an LC circuit.

FIG. 11b shows EMI shielded module 278, similar to EMI shielded module 272, but with a thermally enhanced adhesive disposed between the shielding cage and the components. In FIG. 11b, a thermal interface material 276 is applied over back surface 88 of components 120-124 prior to placing shielding cage 244 over the components. Thermal interface material 276 improves thermal conductivity between the components 120-124 and the shielding cage 244. Thermal interface material 276 reduces shifting of shielding cage 244 during encapsulation. In EMI shielded module 278, shielding cage 244 is directly connected, physically and electrically, to RDL 144. A backside of shielding cage 244 is exposed from encapsulant 136 in EMI shielded module 278. In one embodiment, encapsulant 136 is deposited using film-assisted molding process, leaving a backside of shielding cage 244 devoid of encapsulant. In another embodiment, grinder 160 removes encapsulant 136 exposing a backside of shielding cage 244. Shielding cage 244 and RDL 144 surround semiconductor die 84 or components 120-124 as part of a faraday cage providing EMI and RFI shielding to EMI shielded module 278.

Figure 12B:
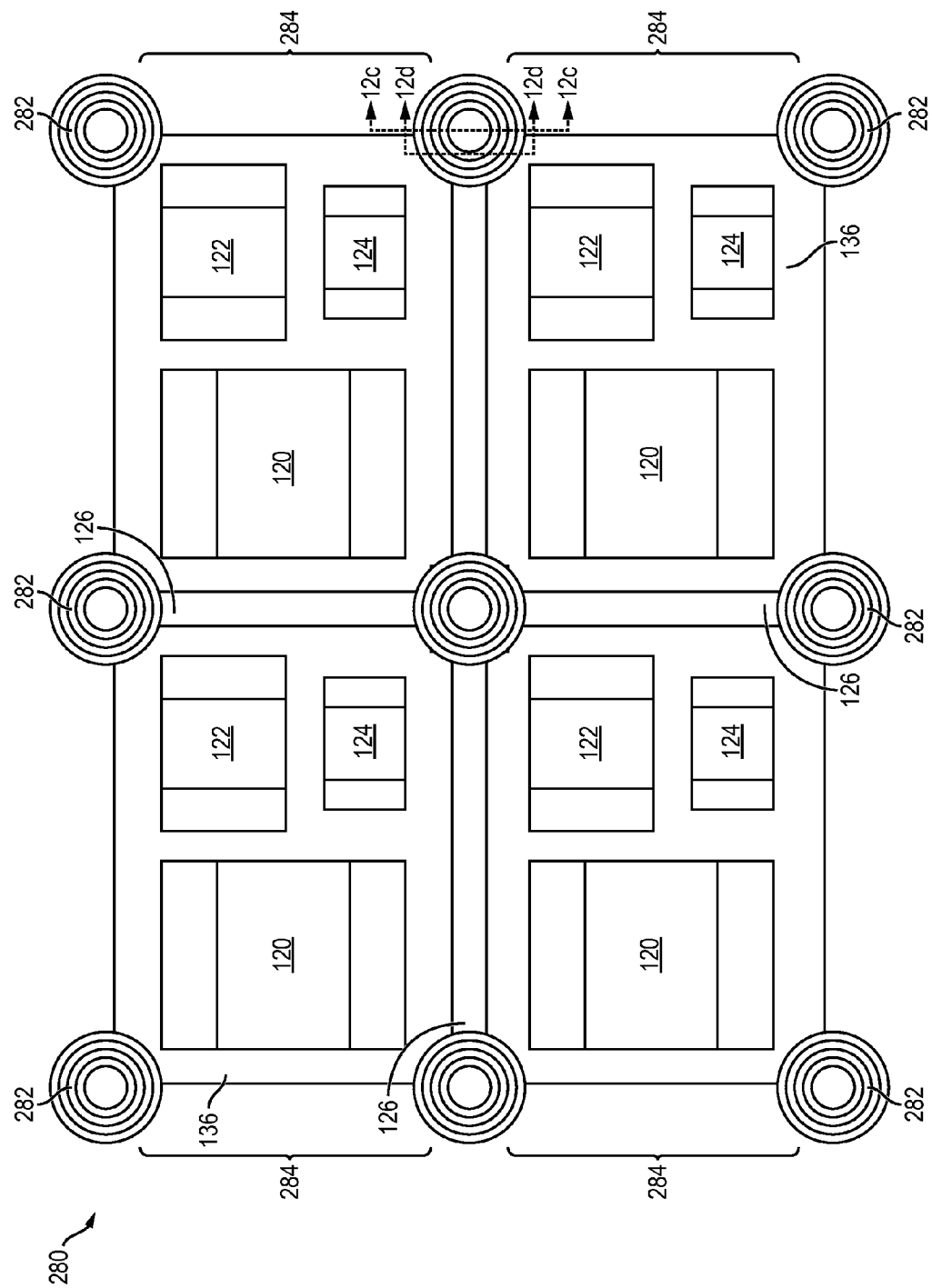

FIGS. 12a-12j illustrate, in relation to FIGS. 5a-5m, a method of making an EMI shielded module without PCB units. FIG. 12a shows a cross-sectional view of a portion of reconstituted panel 280, similar to reconstituted panel 134 from FIG. 5c, but without PCB units 100. In FIG. 12a, active surfaces 90 of components 120-124 are exposed after carrier 130 and interface layer 132 are removed. Trenches 282 are formed in encapsulant 136 at the corners of each module 284. Trenches 282 are formed by a laser or cutting tool 166 at desired locations in encapsulant 136. In one embodiment, trenches 282 in encapsulant 136 are formed in two concentric circles located at each corner of each module 284.

FIG. 12b shows a plan view of a portion of reconstituted panel 280, similar to reconstituted wafer 134 from FIG. 5d, but with trenches 282 rather than PCB units 100 at the corners of modules 118. FIG. 12c shows a cross-sectional view of a portion of reconsituted wafer 280 including trenches 282 across reference line 12c. FIG. 12d shows a cross-sectional view of a portion of reconsituted wafer 280 including trenches 282 across reference line 12d.

In FIG. 12e, a build-up interconnect structure 140 is formed over trenches 282, components 120-124, and encapsulant 136. Insulating or passivation layer 142 is formed over trenches 282, components 120-124, and encapsulant 136 using PVD, CVD, printing, spin coating, spray coating, sintering or thermal oxidation. Insulating layer 142 contains one or more layers of SiO2, Si3N4, SiON, Ta2O5, Al2O3, or other material having similar insulating and structural properties. A portion of insulating layer 142 is removed by an etching process to expose encapsulant 136 in trenches 282 and components 120-124.

An electrically conductive layer 144 is formed over insulating layer 142, trenches 282, and components 120-124 using a patterning and metal deposition process such as PVD, CVD, sputtering, electrolytic plating, electroless seed layer deposition, and electroless plating. Conductive layer 144 includes one or more layers of Al, Cu, Ti, TiW, tin Sn, Ni, Au, Ag, W, or other suitable electrically conductive material or combination thereof. Conductive layer 144 operates as an RDL ground plane to provide EMI shielding for module 284. In one embodiment, conductive layer 144 operates as an RDL to redistribute electrical connection from components 120-124 to outside a footprint of module 284. A portion of RDL 144 fills in trenches 282. Portions of conductive layer 144 are electrically common or electrically isolated depending on the design and function of the semiconductor device. Conductive layer 144 provides external connectivity to components 120-124.

An insulating or passivation layer 146 is formed over insulating layer 142 and conductive layer 144 using PVD, CVD, printing, spin coating, spray coating, sintering or thermal oxidation. Insulating layer 146 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 146 is removed by LDA or an etching process through a patterned photoresist layer to expose portions of conductive layer 144.

Figure 12F:
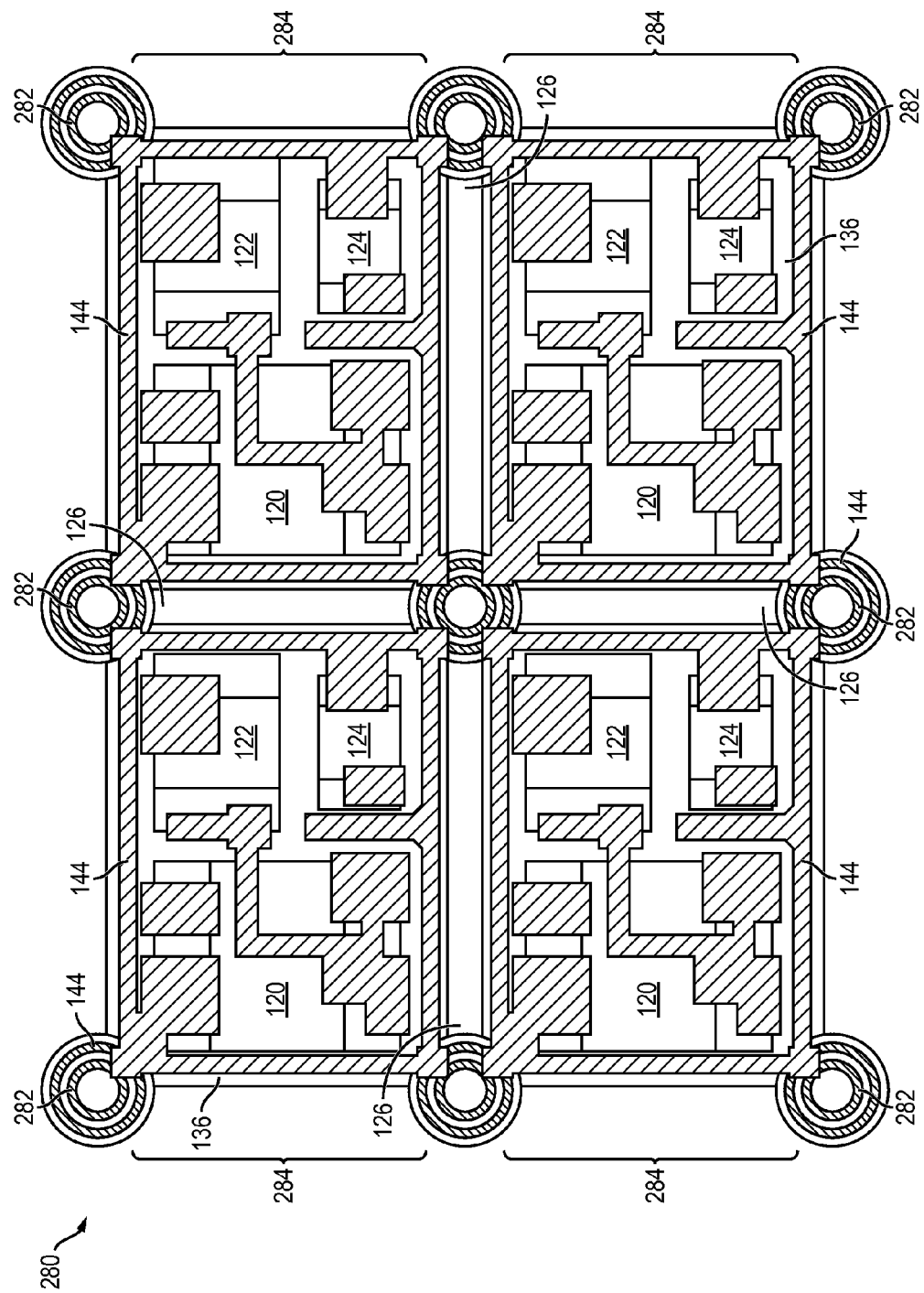

FIG. 12f, shows a plan view of a portion of reconstituted panel 280 including further detail of conductive layer or RDL ground plane 144. For purposes of illustration, FIG. 12d shows reconstituted panel 280 without insulating layers 142 and 146. Conductive layer 144 is disposed in trenches 282 at each corner of each module 284. Conductive layer 144 fills trenches 282. Portions of conductive layer 144 are electrically connected to other portions of conductive layer 144 disposed in trenches 282.

In FIG. 12g, an electrically conductive bump material is deposited over modules 284 and electrically connected to conductive layer 144 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. The bumps can also be compression bonded to conductive layer 144. Bumps 148 represent one type of interconnect structure that is formed over conductive layer 144. The interconnect structure can also use bond wires, stud bump, micro bump, or other electrical interconnect. Bumps 148 or other interconnect structures are optional, and in one embodiment, are formed after singulation of reconstituted panel 280.

Backgrinding tape or support tape 150 is applied over reconstituted panel 280 and in contact with interconnect structure 140. In one embodiment, support tape 150 includes a thermally resistant tape, warpage balancing tape, or other tape. For example, support tape 150 may include a material having high thermal conductivity and high heat resistance. Alternatively, reconstituted panel 280 is placed in a supporting jig with or without support tape 150.

In FIG. 12g, reconstituted panel 280 is singulated with saw blade or laser cutting device 166 through interconnect structure 140 and trench 282 into individual modules 284. In one embodiment, saw blade 166 singulates modules 284 from the front side.

In FIG. 12h, a shielding layer 170 is formed over encapsulant 136. Shielding layer 170 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding layer 170 is patterned and conformally deposited using an electrolytic plating, electroless plating, sputtering, PVD, CVD, or other suitable metal deposition process. Shielding layer 170 can also be a non-metal material such as carbon-black or aluminum flake to reduce the effects of EMI and RFI. For non-metal materials, shielding layer 170 can be applied by lamination, spraying, or painting. Shielding layer 170 is electrically connected through RDL 144 by portions of conductive layer 144 disposed in trenches 282 to an external low-impedance ground point. Shielding layer 170 encapsulates module 284. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of module 284.

FIG. 12i shows support tape 150 removed from over interconnect structure 140 to form EMI shielded module 286. EMI shielded module 286 includes an LC circuit with EMI shielding. Shielding layer 170 encapsulates EMI shielded module 286. Shielding layer 170 extends completely around semiconductor die 84 or components 120-124. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of EMI shielded module 286. A portion of RDL 144 forms a ground plane. Another portion of RDL 144 in trench 282 provides an electrical connection between shielding layer 170 and RDL 144 as part of an EMI shield. RDL 144 provides a grounding connection. Shielding layer 170 and RDL 144 surround semiconductor die 84 or components 120-124 as part of a faraday cage providing EMI and RFI shielding to EMI shielded module 286. Shielding layer 170 and RDL 144 surround semiconductor die 84 or components 120-124 and route EMI, RFI, and other interfering signals from shielding layer 170 to an external low-impedance ground point. Accordingly, shielding layer 170 and RDL 144 provide effective EMI and RFI shielding for EMI shielded module 286. In one embodiment, components 120-124 form an LC circuit.

FIG. 12j shows EMI shielded module 288 with shielding layer 170 deposited directly on back surfaces 88 of components 120-124. Back surfaces 88 of components 120-124 are exposed from encapsulant 136 in EMI shielded module 278 prior to depositing shielding layer 170. In one embodiment, encapsulant 136 is deposited using film-assisted molding process, leaving back surfaces 88 of components 120-124 devoid of encapsulant. In another embodiment, grinder 160 removes encapsulant 136 exposing back surfaces 88 of components 120-124. Shielding layer 170 and RDL 144 surround semiconductor die 84 or components 120-124 as part of a faraday cage providing EMI and RFI shielding to EMI shielded module 288.

Figure 13B:
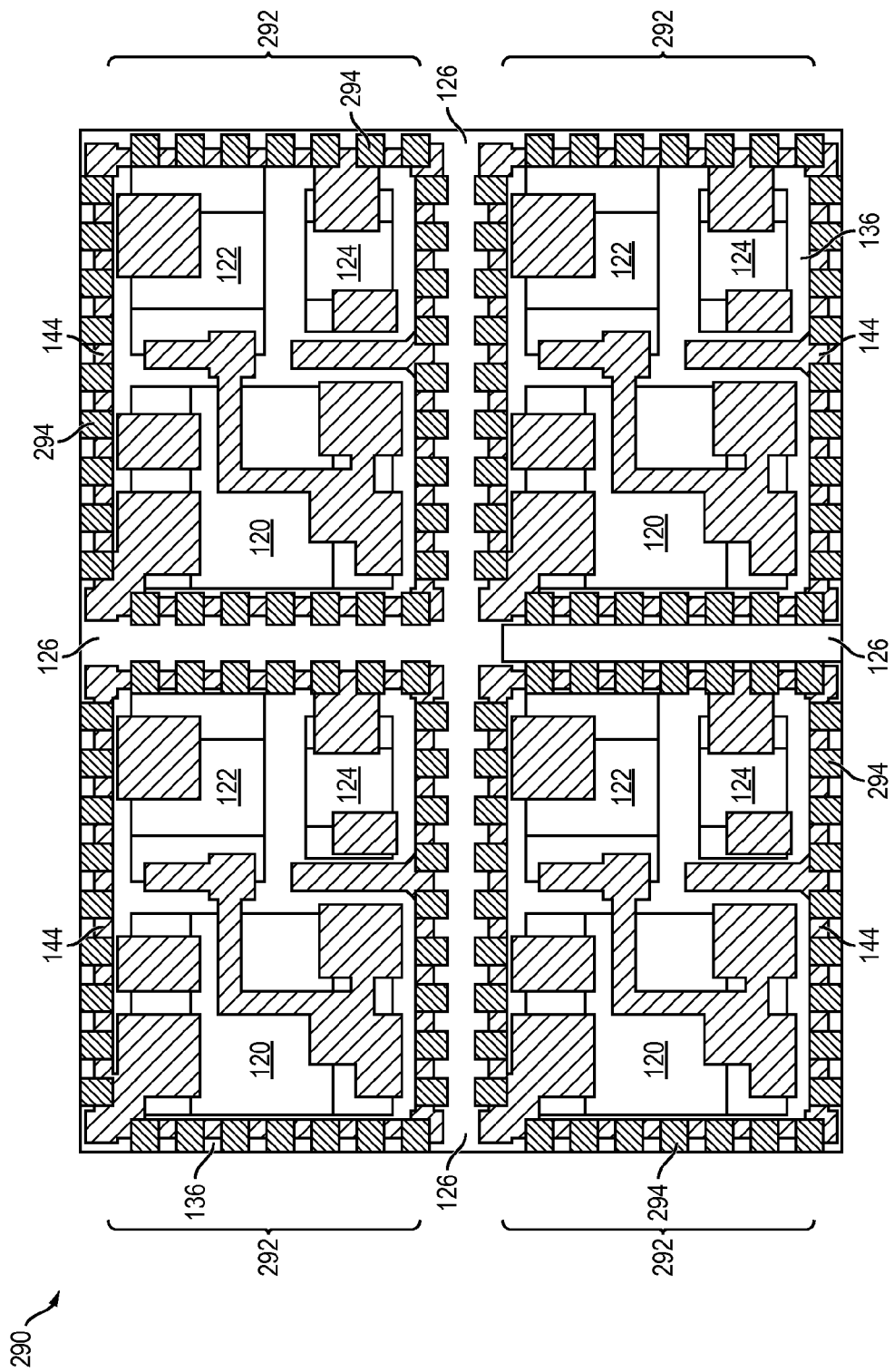

FIGS. 13a-13f illustrate, in relation to FIGS. 12a-12j, an alternative method of making an EMI shielded module without trenches formed in the encapsulant. FIG. 13a shows a cross-sectional view of a portion of reconstituted panel 290, similar to reconstituted panel 280 from FIG. 12a, but without trenches. An encapsulant or molding compound 136 deposited over reconstituted panel 290 including components 120-124, using a paste printing, compressive molding, transfer molding, liquid encapsulant molding, vacuum lamination, or other suitable applicator. In one embodiment, encapsulant 136 is deposited using film-assisted molding process. Encapsulant 136 can be polymer composite material, such as epoxy resin with filler, epoxy acrylate with filler, or polymer with proper filler. Encapsulant 136 is non-conductive, provides physical support, and environmentally protects the semiconductor device from external elements and contaminants. In FIG. 13a, active surfaces 90 of components 120-124 are exposed after carrier 130 and interface layer 132 are removed. In one embodiment, an electrically conductive layer 294 is formed over encapsulant 136 in saw streets 126 using a patterning and metal deposition process such as PVD, CVD, sputtering, electrolytic plating, electroless seed layer deposition, and electroless plating. Conductive layer 294 includes one or more layers of Al, Cu, Ti, TiW, tin Sn, Ni, Au, Ag, W, or other suitable electrically conductive material or combination thereof. Conductive layer 294 operates as RDL side teeth 294. RDL side teeth 294 are formed over encapsulant 136, across saw streets 126 of reconstituted panel 290.

A build-up interconnect structure 140 is formed over components 120-124, RDL side teeth 294, and encapsulant 136. Insulating or passivation layer 142 is formed over a surface of components 120-124 and encapsulant 136 using PVD, CVD, printing, spin coating, spray coating, sintering or thermal oxidation. Insulating layer 142 contains one or more layers of SiO2, Si3N4, SiON, Ta2O5, Al2O3, or other material having similar insulating and structural properties. A portion of insulating layer 142 is removed by an etching process to expose portions of encapsulant 136 in saw streets 126 and components 120-124.

An electrically conductive layer 144 is formed over insulating layer 142, portions of encapsulant 136 in saw streets 126, and of components 120-124 using a patterning and metal deposition process such as PVD, CVD, sputtering, electrolytic plating, electroless seed layer deposition, and electroless plating. Conductive layer 144 includes one or more layers of Al, Cu, Ti, TiW, tin Sn, Ni, Au, Ag, W, or other suitable electrically conductive material or combination thereof. Conductive layer 144 operates as an RDL ground plane to provide EMI shielding for module 284. In one embodiment, conductive layer 144 operates as an RDL to redistribute electrical connection from components 120-124 to outside a footprint of module 284. In one embodiment, conductive layer 144 forms both RDL 144 and RDL side teeth 294. One portion of conductive layer 144 is electrically connected to components 120-124. Other portions of conductive layer 144 are electrically common or electrically isolated depending on the design and function of the semiconductor device. Conductive layer 144 electrically connects components 120-124 to RDL side teeth 294.

An insulating or passivation layer 146 is formed over insulating layer 142 and conductive layer 144 using PVD, CVD, printing, spin coating, spray coating, sintering or thermal oxidation. Insulating layer 146 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 146 is removed by LDA or an etching process through a patterned photoresist layer to expose portions of conductive layer 144, including RDL side teeth 294.

FIG. 13b shows a plan view of a portion of reconstituted panel 290 with RDL side teeth 294. For purposes of illustration, FIG. 13b shows reconstituted panel 290 without insulating layers 142 and 146. In one embodiment, RDL side teeth 294 are formed as part of conductive layer 144. RDL side teeth 294 are formed over encapsulant 136, across saw streets 126 of reconstituted panel 290.

In FIG. 13c, an electrically conductive bump material is deposited over modules 292 and electrically connected to conductive layer 144 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. The bumps can also be compression bonded to conductive layer 144. Bumps 148 represent one type of interconnect structure that is formed over conductive layer 144. The interconnect structure can also use bond wires, stud bump, micro bump, or other electrical interconnect. Bumps 148 or other interconnect structures are optional, and in one embodiment, are formed after singulation of reconstituted panel 290.

Backgrinding tape or support tape 150 is applied over reconstituted panel 290 and in contact with interconnect structure 140. In one embodiment, support tape 150 includes a thermally resistant tape, warpage balancing tape, or other tape. For example, support tape 150 may include a material having high thermal conductivity and high heat resistance. Alternatively, reconstituted panel 290 is placed in a supporting jig with or without support tape 150.

In FIG. 13c, reconstituted panel 290 is singulated through interconnect structure 140 and RDL side teeth 294 into individual modules 292. In one embodiment, modules 292 are singulated from the front side. A portion of RDL side teeth 294 are exposed from module 292 after singulation to provide connectivity.

In FIG. 13d, a shielding layer 170 is formed over RDL side teeth 294 and encapsulant 136. Shielding layer 170 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding layer 170 is patterned and conformally deposited using an electrolytic plating, electroless plating, sputtering, PVD, CVD, or other suitable metal deposition process. Shielding layer 170 can also be a non-metal material such as carbon-black or aluminum flake to reduce the effects of EMI and RFI. For non-metal materials, shielding layer 170 can be applied by lamination, spraying, or painting. Shielding layer 170 is electrically connected through RDL 144 by RDL side teeth 294 to an external low-impedance ground point. Shielding layer 170 encapsulates module 292. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of module 292.

FIG. 13e shows support tape 150 removed from over interconnect structure 140 to form EMI shielded module 296. EMI shielded module 296 includes an LC circuit with EMI shielding. Shielding layer 170 encapsulates EMI shielded module 296. Shielding layer 170 extends completely around semiconductor die 84 or components 120-124. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of EMI shielded module 296. A portion of RDL 144 forms a ground plane. RDL side teeth 294 provide an electrical connection between shielding layer 170 and RDL 144 as part of an EMI shield. RDL 144 provides a grounding connection. Shielding layer 170, RDL 144, and RDL side teeth 294, surround semiconductor die 84 or components 120-124 as part of a faraday cage providing EMI and RFI shielding to EMI shielded module 296. Shielding layer 170, RDL 144, and RDL side teeth 294 surround semiconductor die 84 or components 120-124 and route EMI, RFI, and other interfering signals from shielding layer 170 to an external low-impedance ground point. Accordingly, shielding layer 170, RDL 144, and RDL side teeth 294 provide effective EMI and RFI shielding for EMI shielded module 296. In one embodiment, components 120-124 form an LC circuit.

FIG. 13f shows EMI shielded module 298 with shielding layer 170 deposited over encapsulant 136 and exposed side surfaces of interconnect structure 140. Shielding layer 170, RDL 144, and RDL side teeth 294, surround semiconductor die 84 or components 120-124 as part of a faraday cage providing EMI and RFI shielding to EMI shielded module 298.

Figure 14B:
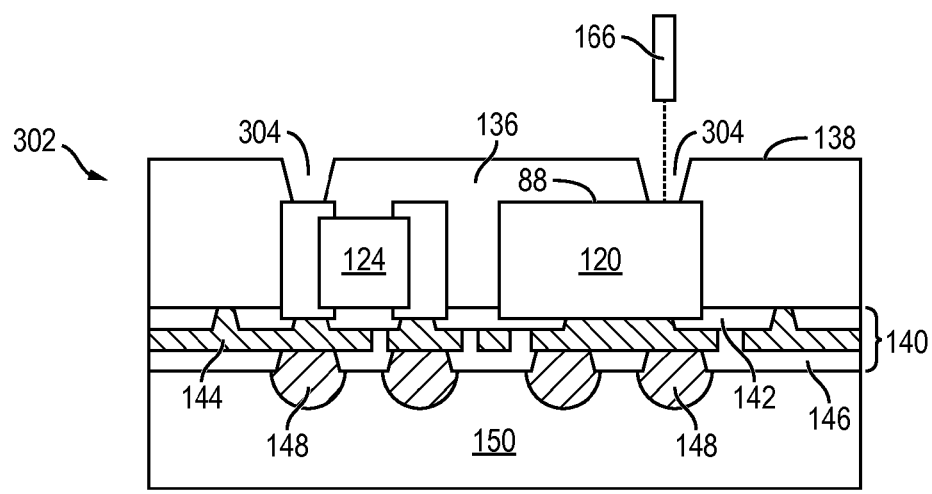

FIGS. 14a-14d illustrate, in relation to FIGS. 13a-13f, an alternative method of making an EMI shielded module without trenches formed in the encapsulant. FIG. 14a shows a cross-sectional view of a portion of reconstituted panel 300 comprising modules 302, similar to reconstituted panel 290 from FIG. 13a, but without RDL side teeth 294. An encapsulant or molding compound 136 deposited over reconstituted panel 300 including components 120-124, using a paste printing, compressive molding, transfer molding, liquid encapsulant molding, vacuum lamination, or other suitable applicator. In one embodiment, encapsulant 136 is deposited using film-assisted molding process. Encapsulant 136 can be polymer composite material, such as epoxy resin with filler, epoxy acrylate with filler, or polymer with proper filler. Encapsulant 136 is non-conductive, provides physical support, and environmentally protects the semiconductor device from external elements and contaminants. Active surfaces 90 of components 120-124 are exposed after carrier 130 and interface layer 132 are removed, as shown in FIG. 14a.

A build-up interconnect structure 140 is formed over components 120-124 and encapsulant 136. Insulating or passivation layer 142 is formed over a surface of components 120-124 and encapsulant 136 using PVD, CVD, printing, spin coating, spray coating, sintering or thermal oxidation. Insulating layer 142 contains one or more layers of SiO2, Si3N4, SiON, Ta2O5, Al2O3, or other material having similar insulating and structural properties. A portion of insulating layer 142 is removed by an etching process to expose portions of components 120-124.

An electrically conductive layer 144 is formed over insulating layer 142 and components 120-124 using a patterning and metal deposition process such as PVD, CVD, sputtering, electrolytic plating, electroless seed layer deposition, and electroless plating. Conductive layer 144 includes one or more layers of Al, Cu, Ti, TiW, tin Sn, Ni, Au, Ag, W, or other suitable electrically conductive material or combination thereof. Conductive layer 144 operates as an RDL ground plane to provide EMI shielding for module 284. In one embodiment, conductive layer 144 operates as an RDL to redistribute electrical connection from components 120-124 to outside a footprint of module 284. One portion of conductive layer 144 is electrically connected to contact pads 92 of components 120-124. Other portions of conductive layer 144 are electrically common or electrically isolated depending on the design and function of the semiconductor device.

An insulating or passivation layer 146 is formed over insulating layer 142 and conductive layer 144 using PVD, CVD, printing, spin coating, spray coating, sintering or thermal oxidation. Insulating layer 146 includes one or more layers of SiO2, Si3N4, SiON, Ta2O5, Al2O3, low temperature curable polymer dielectric resist (i.e., cures at less than 250° C.), BCB, PBO, or epoxy based photosensitive polymer dielectric, or other material having similar insulating and structural properties. A portion of insulating layer 146 is removed by LDA or an etching process through a patterned photoresist layer to expose portions of conductive layer 144.

In FIG. 14b, an electrically conductive bump material is deposited over modules 302 and electrically connected to conductive layer 144 using an evaporation, electrolytic plating, electroless plating, ball drop, or screen printing process. The bump material includes Al, Sn, Ni, Au, Ag, Pb, Bi, Cu, solder, or combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. The bumps can also be compression bonded to conductive layer 144. Bumps 148 represent one type of interconnect structure that is formed over conductive layer 144. The interconnect structure can also use bond wires, stud bump, micro bump, or other electrical interconnect. Bumps 148 or other interconnect structures are optional, and in one embodiment, are formed after singulation of reconstituted panel 300.

Backgrinding tape or support tape 150 is applied over reconstituted panel 300 and in contact with interconnect structure 140. In one embodiment, support tape 150 includes a thermally resistant tape, warpage balancing tape, or other tape. For example, support tape 150 may include a material having high thermal conductivity and high heat resistance. Alternatively, reconstituted panel 300 is placed in a supporting jig with or without support tape 150.

Reconstituted panel 300 is singulated with saw blade or laser cutting device 166 through interconnect structure 140 into individual modules 302, as shown in FIG. 14b. In one embodiment, saw blade 166 singulates modules 302 from the front side. A plurality of vias 304 is formed through encapsulant 136 to back surface 88 of components 120-124 using laser drilling, mechanical drilling, or DRIE. Vias 304 expose back surface 88 of components 120-124 from encapsulant 136.

Figure 14C:
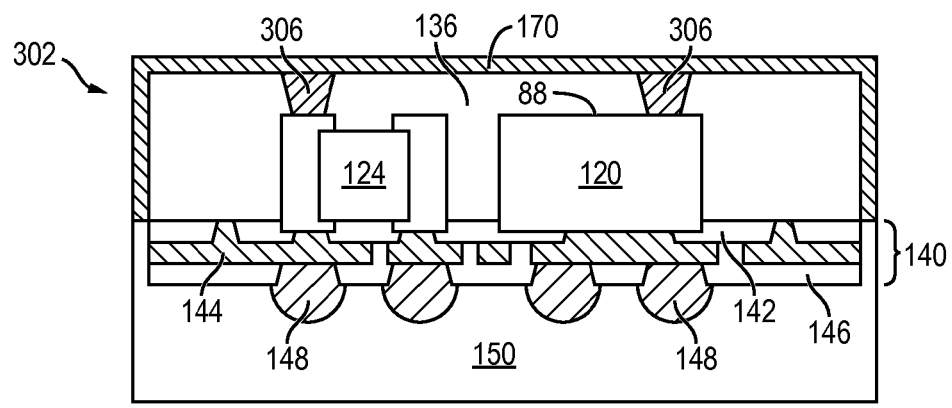

In FIG. 14c, vias 304 are filled with conductive material to form passive pads 306. A shielding layer 170 is formed over encapsulant 136 and passive pads 306. In one embodiment, passive pads 306 and shielding layer 170 are formed simultaneously. Shielding layer 170 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding layer 170 is patterned and conformally deposited using an electrolytic plating, electroless plating, sputtering, PVD, CVD, or other suitable metal deposition process. Shielding layer 170 can also be a non-metal material such as carbon-black or aluminum flake to reduce the effects of EMI and RFI. For non-metal materials, shielding layer 170 can be applied by lamination, spraying, or painting. Shielding layer 170 is electrically connected through passive pads 306, components 120-124, and RDL 144 to an external low-impedance ground point. Shielding layer 170 encapsulates module 302. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of module 302. Shielding layer 170 in vias 304 form passive pads 306.

Figure 14D:
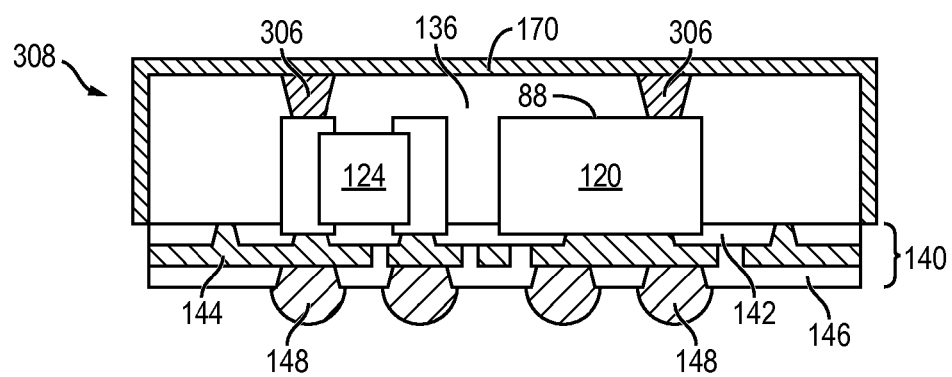

FIG. 14d shows support tape 150 removed from over interconnect structure 140 to form EMI shielded module 308, similar to EMI shielded module 296 from FIG. 13e. EMI shielded module 308 employs passive pads 306 rather than RDL side teeth 294 to provide electrical connectivity between shielding layer 170 and the remainder of EMI shielded module 308. Vias 304 through encapsulant 136 to back surface 88 of components 120-124 are filled with conductive material to form passive pads 306. EMI shielded module 308 includes an LC circuit with EMI shielding. Shielding layer 170 encapsulates EMI shielded module 308. Shielding layer 170 extends completely around semiconductor die 84 or components 120-124. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of EMI shielded module 308. A portion of RDL 144 forms a ground plane. Passive pads 306 provide an electrical connection between shielding layer 170, components 120-124, and RDL 144 as part of an EMI shield. RDL 144 provides a grounding connection. Shielding layer 170, RDL 144, and passive pads 306, surround semiconductor die 84 or components 120-124 as part of a faraday cage providing EMI and RFI shielding to EMI shielded module 308. Shielding layer 170, passive pads 306, and RDL 144 surround semiconductor die 84 or components 120-124 and route EMI, RFI, and other interfering signals from shielding layer 170 and passive pads 306 to an external low-impedance ground point. Accordingly, shielding layer 170, passive pads 306, and RDL 144 provide effective EMI and RFI shielding for EMI shielded module 308. In one embodiment, components 120-124 form an LC circuit.

Figure 15A:
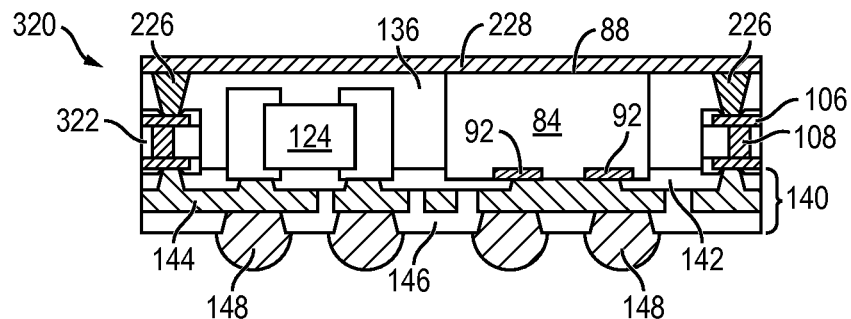
FIGS. 15a-15e illustrate other EMI shielded modules including semiconductor die.

FIGS. 15a-15e illustrate, in relation to FIGS. 14a-14d, alternate EMI shielded modules including semiconductor die. FIG. 15a shows a cross-sectional view of EMI shielded module 320. EMI shielded module 320 includes semiconductor die 84 from FIG. 2d, components 120-124, encapsulant 136, interconnect structure 140, bumps 148, and shielding lid 228. EMI shielded module 320 also includes PCB units 322. PCB units 322 may be disposed in the corners of EMI shielded module 320, similar to corner PCB units 100. In one embodiment, PCB units 322 may be disposed along each side of EMI shielded module 320, similar to long PCB units 190. PCB units 322 have a height less than a height of components 120-124. PCB units 322 act as modular interconnect structures providing connectivity to EMI shielded module 320. PCB unit 322 is singulated to form EMI shielded module 320. EMI shielded module 320 also includes thermally conductive layer 226 applied over conductive layer 106 and PTH 108 of PCB unit 322. Shielding lid 228 is formed over semiconductor die 84, components 120-124, encapsulant 136, and thermally conductive layer 226. Shielding lid 228 can be Cu, Al, ferrite or carbonyl iron, stainless steel, nickel silver, low-carbon steel, silicon-iron steel, foil, conductive composite, and other metals and composites capable of blocking or absorbing EMI, RFI, harmonic distortion, and other inter-device interference. Shielding lid 228 is patterned and conformally deposited using an electrolytic plating, electroless plating, sputtering, PVD, CVD, or other suitable metal deposition process. In one embodiment, shielding lid 228 includes an outer layer with improved anti-corrosive properties. Shielding lid 228 can also be a non-metal material such as carbon-black or aluminum flake to reduce the effects of EMI and RFI. For non-metal materials, shielding lid 228 can be applied by lamination, spraying, or painting. Shielding lid 228 is electrically connected through thermally conductive layer 226, optional conductive layer 106, PTH 108, and conductive layer 104 of PCB unit 322, and RDL 144 to an external low-impedance ground point. In one embodiment, shielding lid 228 is pre-formed and attached, via thermally conductive layer 226, to EMI shielded module 320.

FIG. 15a shows EMI shielded module 320 including semiconductor die 84 and an LC circuit with EMI shielding. Shielding lid 228 forms a conductive lid over EMI shielded module 320. PCB units 322, RDL 144, thermally conductive layer 226, and shielding lid 228 extend completely around semiconductor die 84 and components 120-124. Shielding lid 228 substantially covers all areas of encapsulant 136 relative to the top of semiconductor die 84 and components 120-124 to provide protection for the enclosed semiconductor devices against EMI, RFI, or other inter-device interference. PCB units 322 provides protection for the enclosed semiconductor devices against EMI, RFI, or other inter-device interference relative to the sides of EMI shielded module 320. The interference can be generated internally or come from external semiconductor devices containing IPDs or RF circuits. RDL 144 forms a ground plane. PCB units 322 and thermally conductive layer 226 provide an electrical connection between shielding lid 228 and RDL 144. PCB units 322 provide a grounding connection. PCB units 322, RDL 144, thermally conductive layer 226, and shielding lid 228 surround semiconductor die 84 and components 120-124 as part of a faraday cage providing EMI and RFI shielding to EMI shielded module 320. PCB units 322, RDL 144, thermally conductive layer 226, and shielding lid 228 surround semiconductor die 84 and components 120-124 and route EMI, RFI, and other interfering signals from PCB units 322, RDL 144, thermally conductive layer 226, and shielding lid 228 to an external low-impedance ground point. Accordingly, PCB units 322, RDL 144, thermally conductive layer 226, and shielding lid 228 provide effective EMI and RFI shielding for EMI shielded module 320. In one embodiment, shielding lid 228 is coplanar with back surface 88 of semiconductor die 84.

Figure 15B:
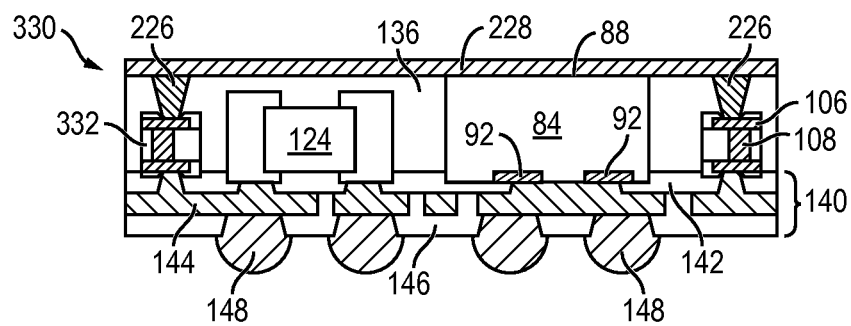

FIG. 15b shows a cross-sectional view of EMI shielded module 330. EMI shielded module 330 includes semiconductor die 84 from FIG. 2d, components 120-124, encapsulant 136, interconnect structure 140, bumps 148, and shielding lid 228. EMI shielded module 320 also includes PCB units 332. PCB units 332 may be disposed in the corners of EMI shielded module 330, similar to corner PCB units 100. In one embodiment, PCB units 332 may be disposed along each side of EMI shielded module 330, similar to long PCB units 190. PCB units 332 have a height less than a height of components 120-124 or semiconductor die 84. PCB units 332 act as modular interconnect structures providing connectivity to EMI shielded module 330. PCB units 332 have a width less than a width of PCB units 322. PCB units 332 are not singulated to form EMI shielded module 330. EMI shielded module 330 also includes thermally conductive layer 226 applied over conductive layer 106 and PTH 108 of PCB unit 332.

FIG. 15b shows EMI shielded module 330 including semiconductor die 84 and an LC circuit with EMI shielding. PCB units 332, RDL 144, thermally conductive layer 226, and shielding lid 228 surround semiconductor die 84 and components 120-124 as part of a faraday cage providing EMI and RFI shielding to EMI shielded module 330. In one embodiment, shielding lid 228 is coplanar with back surface 88 of semiconductor die 84.

Figure 15C:
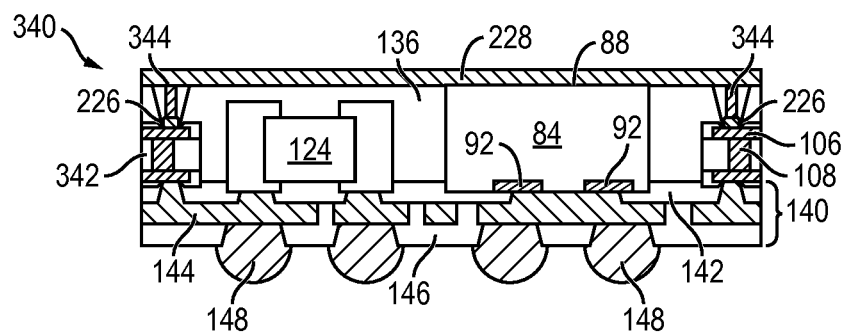

FIG. 15c shows a cross-sectional view of EMI shielded module 340. EMI shielded module 340 includes semiconductor die 84 from FIG. 2d, components 120-124, encapsulant 136, interconnect structure 140, and bumps 148. EMI shielded module 340 includes shielding lid 228 with conductive pillars 344. Shielding lid 228 and conductive pillars 344 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding lid 228 is patterned and conformally deposited using an electrolytic plating, electroless plating, sputtering, PVD, CVD, or other suitable metal deposition process. Shielding lid 228 and conductive pillars 344 can also be a non-metal material such as carbon-black or aluminum flake to reduce the effects of EMI and RFI. For non-metal materials, shielding lid 228 with conductive pillars 344 can be applied by lamination, spraying, or painting. Shielding lid 228 is electrically connected through conductive pillars 344, thermally conductive layer 226, optional conductive layer 106, PTH 108, and conductive layer 104 of PCB unit 342, and RDL 144 to an external low-impedance ground point.

EMI shielded module 340 also includes PCB units 342. PCB units 342 may be disposed in the corners of EMI shielded module 340, similar to corner PCB units 100. In one embodiment, PCB units 342 may be disposed along each side of EMI shielded module 340, similar to long PCB units 190. PCB units 342 have a height less than a height of components 120-124 or semiconductor die 84. PCB units 342 act as modular interconnect structures providing connectivity to EMI shielded module 340. In one embodiment, PCB unit 342 is singulated to form EMI shielded module 340. EMI shielded module 340 also includes thermally conductive layer 226 applied over conductive layer 106 and PTH 108 of PCB unit 342. Shielding lid 228 including conductive pillars 344 is disposed over thermally conductive layer 226.

FIG. 15c shows EMI shielded module 340 including semiconductor die 84 and an LC circuit with EMI shielding. PCB units 342, RDL 144, thermally conductive layer 226, conductive pillars 344, and shielding lid 228 surround semiconductor die 84 and components 120-124 as part of a faraday cage providing EMI and RFI shielding to EMI shielded module 340. In one embodiment, shielding lid 228 is coplanar with back surface 88 of semiconductor die 84.

Figure 15D:
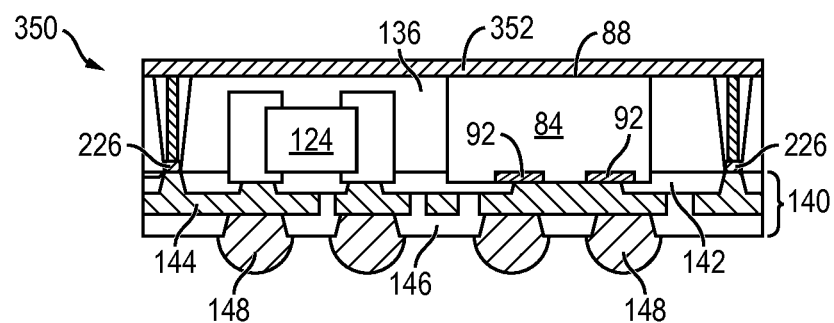

FIG. 15d shows a cross-sectional view of EMI shielded module 350. EMI shielded module 350 includes semiconductor die 84 from FIG. 2d, components 120-124, encapsulant 136, interconnect structure 140, and bumps 148. EMI shielded module 320 also includes thermally conductive layer 226 applied over conductive layer 144. A shielding cage 352 is disposed over thermally conductive layer 226 and encapsulant 136. Shielding cage 352 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding cage 352 is patterned and conformally deposited using an electrolytic plating, electroless plating, sputtering, PVD, CVD, or other suitable metal deposition process. Shielding cage 352 can also be a non-metal material such as carbon-black or aluminum flake to reduce the effects of EMI and RFI. For non-metal materials, shielding cage 352 can be applied by lamination, spraying, or painting. Shielding cage 352 is electrically connected through thermally conductive layer 226 and RDL 144 to an external low-impedance ground point. In one embodiment, shielding cage 352 is pre-formed and attached, via thermally conductive layer 226, to interconnect structure 140 of EMI shielded module 350.

FIG. 15d shows EMI shielded module 350 including semiconductor die 84 and an LC circuit with EMI shielding. Shielding cage 352 is disposed over encapsulant 136. RDL 144, thermally conductive layer 226, and shielding cage 352 surround semiconductor die 84 and components 120-124 as part of a faraday cage providing EMI and RFI shielding to EMI shielded module 350. In one embodiment, shielding cage 352 is coplanar with back surface 88 of semiconductor die 84.

Figure 15E:
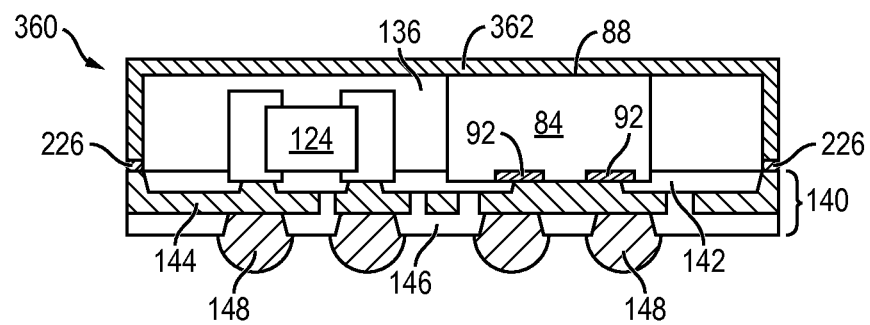

FIG. 15e shows a cross-sectional view of EMI shielded module 360. EMI shielded module 360 includes semiconductor die 84 from FIG. 2d, components 120-124, encapsulant 136, interconnect structure 140, and bumps 148. EMI shielded module 320 also includes thermally conductive layer 226 applied over conductive layer 144. A shielding cage 362 is formed over interconnect structure 140, thermally conductive layer 226, and encapsulant 136. Shielding cage 362 can be Al, ferrite or carbonyl iron, stainless steel, nickel silver, low-carbon steel, silicon-iron steel, foil, conductive resin, and other metals and composites capable of blocking or absorbing EMI, RFI, harmonic distortion, and other inter-device interference. Shielding cage 362 is patterned and conformally deposited using an electrolytic plating, electroless plating, sputtering, PVD, CVD, or other suitable metal deposition process. Shielding cage 362 can also be a non-metal material such as carbon-black or aluminum flake to reduce the effects of EMI and RFI. For non-metal materials, shielding cage 362 can be applied by lamination, spraying, or painting. Shielding cage 362 is electrically connected through thermally conductive layer 226 and RDL 144 to an external low-impedance ground point. In one embodiment, shielding cage 362 is pre-formed and attached, via thermally conductive layer 226, to interconnect structure 140 of EMI shielded module 360.

FIG. 15e shows EMI shielded module 360 including semiconductor die 84 and an LC circuit with EMI shielding. Shielding cage 362 encapsulates EMI shielded module 360. RDL 144, thermally conductive layer 226, and shielding cage 362 surround semiconductor die 84 and components 120-124 as part of a faraday cage providing EMI and RFI shielding to EMI shielded module 360. In one embodiment, shielding cage 362 is coplanar with back surface 88 of semiconductor die 84.

Figure 16A:
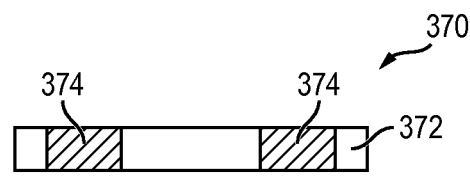
FIGS. 16a-16d illustrate a method of making an EMI shielded module including side PCB units.
Figure 16B:
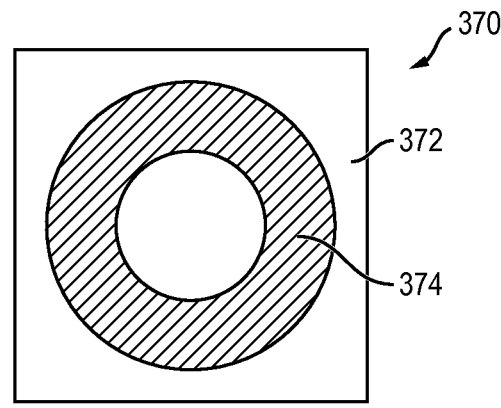

FIGS. 16a-16d illustrate, in relation to FIGS. 5a-5m, an alternative method of making an EMI shielded module with alternate PCB units disposed in each corner of the EMI shielded module. In the present embodiment, PCB units 370, disposed in each corner of module 376 replace corner PCB units 100 of module 118. PCB units 370 include base material 372 and PTH 374, as shown in FIGS. 16a-16b. PCB units 370 are substantially the same size as PCB units 100.

FIG. 16a shows a cross-sectional view of PCB unit 370. Base material 372 of PCB unit 370 can be metal, silicon, polymer, polymer composite, ceramic, glass, glass epoxy, beryllium oxide, or other suitable low-cost, rigid material or bulk semiconductor material for structural support. Alternatively, base material 372 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Circular PTH 374 are formed through base material 372 of PCB unit 370. In one embodiment, only one circular PTH 374 is formed in each PCB unit 370. PTH 374 represent one type of PTH that is formed through base material 372. The PTH could also be star-shaped, plus-shaped, post-shaped, concentric circles, square, rectangle, or any other shape. FIG. 16b shows a plan view of alternate PCB unit 370.

Figure 16D:
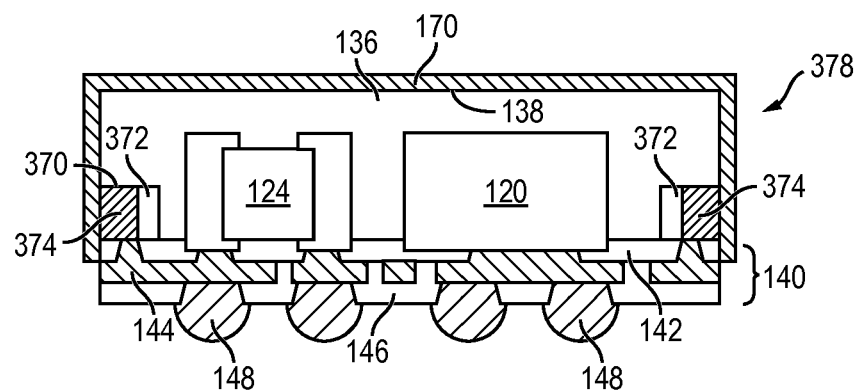
Figure 16C:
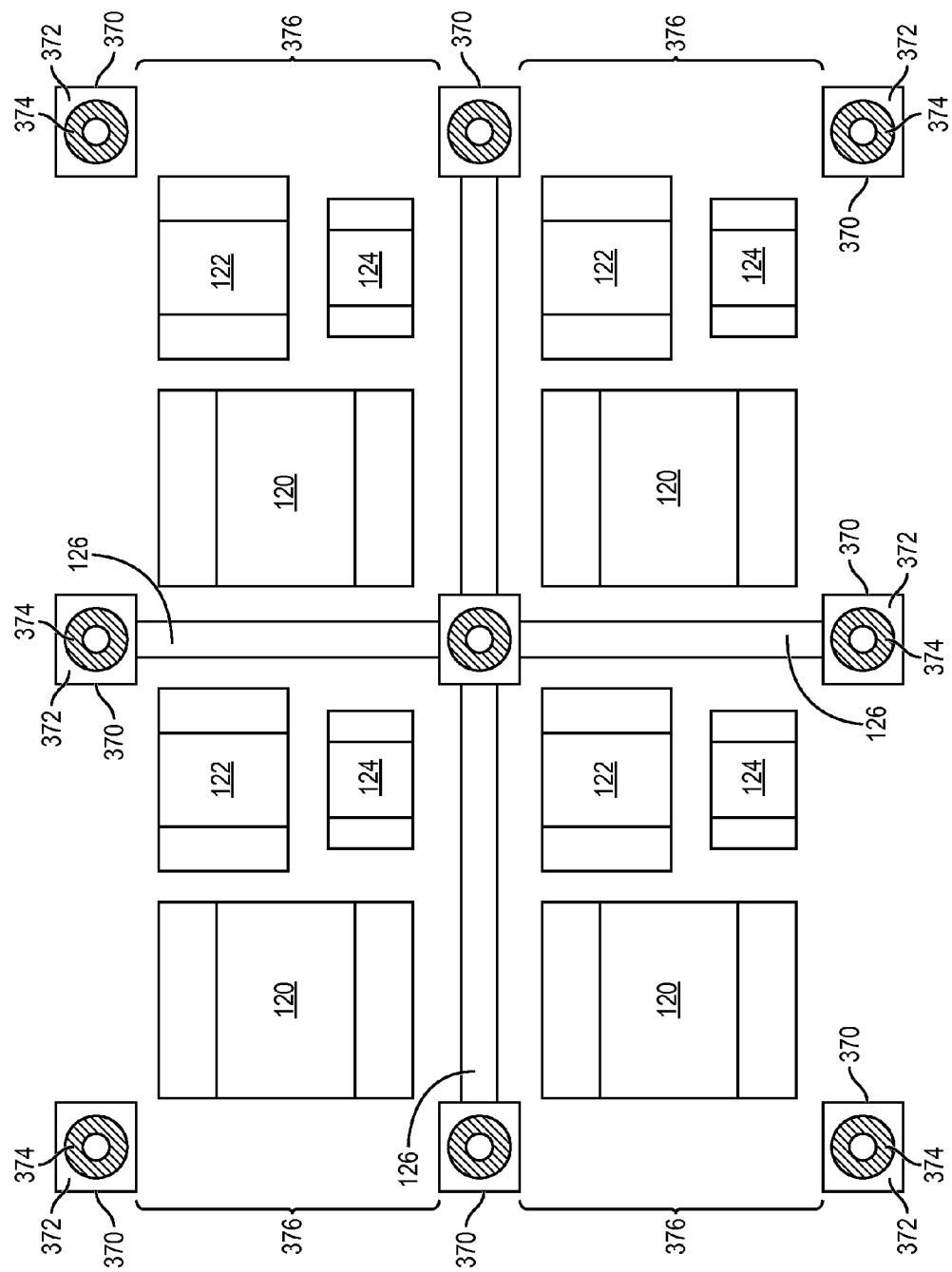

FIG. 16c shows a plan view of a portion of a layout for forming modules 376 with three components 120-124. FIG. 16c shows four modules 376, although any number of modules may be formed. Each corner of each module 376 includes PCB unit 370. The layout shown in FIG. 16c includes a separation region or saw street 126 between each module 376. Components 120-124 may be semiconductor die 84 containing IPDs, or discrete passive devices such as inductors, capacitors, and resistors. In one embodiment, components 120 and 122 are inductors and component 124 is a capacitor with specifications listed in Table 1.

FIG. 16d shows EMI shielded module 378. EMI shielded module 378 includes an LC circuit with EMI shielding. Shielding layer 170 encapsulates EMI shielded module 378. Shielding layer 170 extends completely around semiconductor die 84 or components 120-124. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of EMI shielded module 378. RDL 144 forms a ground plane. PTH 374 of PCB units 370 provides an electrical connection between shielding layer 170 and RDL 144. PCB units 370 provide a grounding connection. PCB units 370, RDL 144, and shielding layer 170 surround semiconductor die 84 or components 120-124 as part of a faraday cage providing EMI and RFI shielding to EMI shielded module 378. PCB units 370, RDL 144, and shielding layer 170 surround semiconductor die 84 or components 120-124 and route EMI, RFI, and other interfering signals from shielding layer 170 to an external low-impedance ground point. Accordingly, PCB units 370, RDL 144, and shielding layer 170 provide effective EMI and RFI shielding for EMI shielded module 378. PCB units 370 have a height less than a height of semiconductor die 84 or components 120-124. PCB unit 370 acts as a modular interconnect structure providing connectivity to EMI shielded module 378. In one embodiment, components 120-124 form an LC circuit.

Figure 17A:
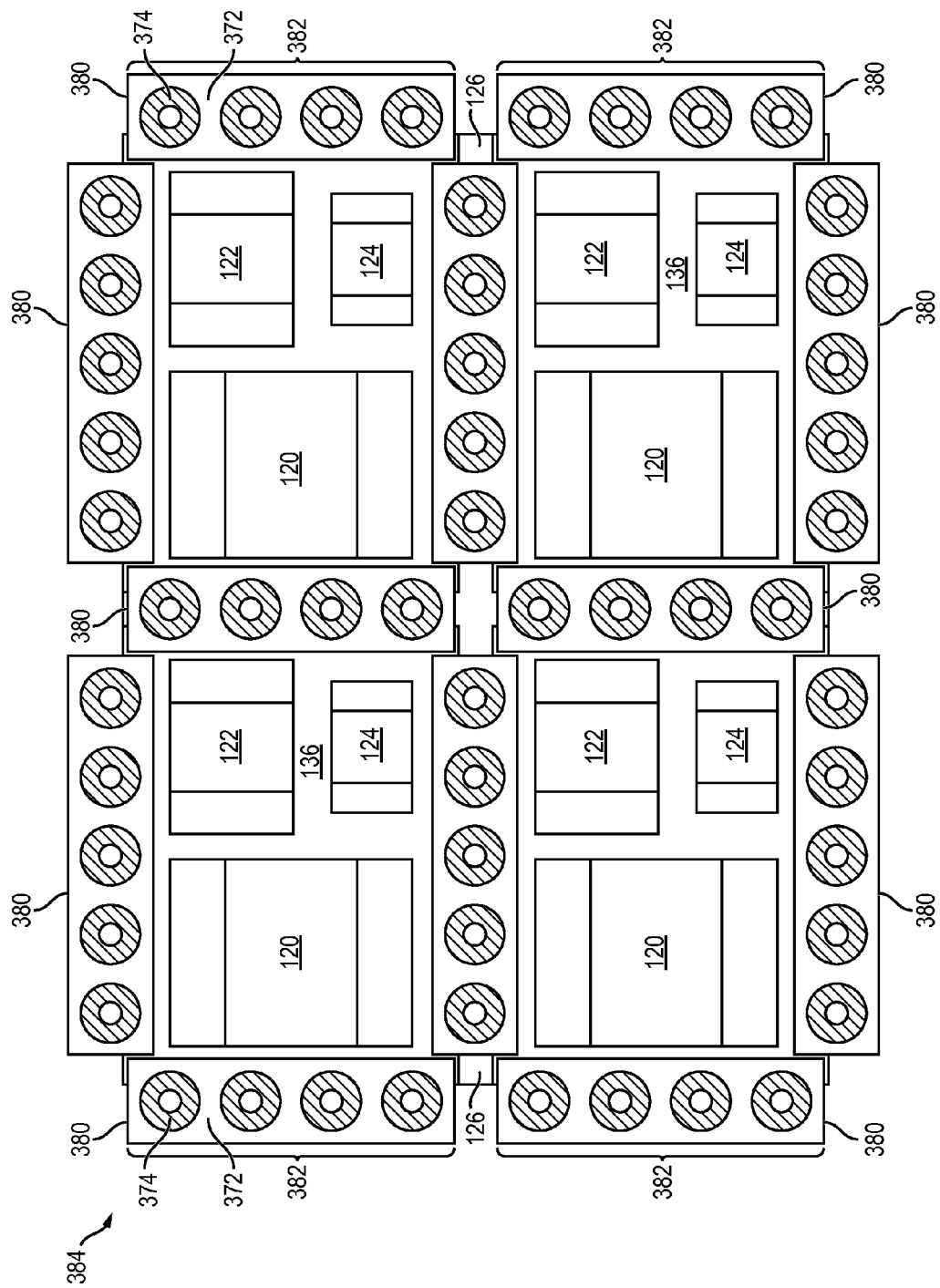
FIGS. 17a-17b illustrate other EMI shielded modules including side PCB units.
Figure 17B:
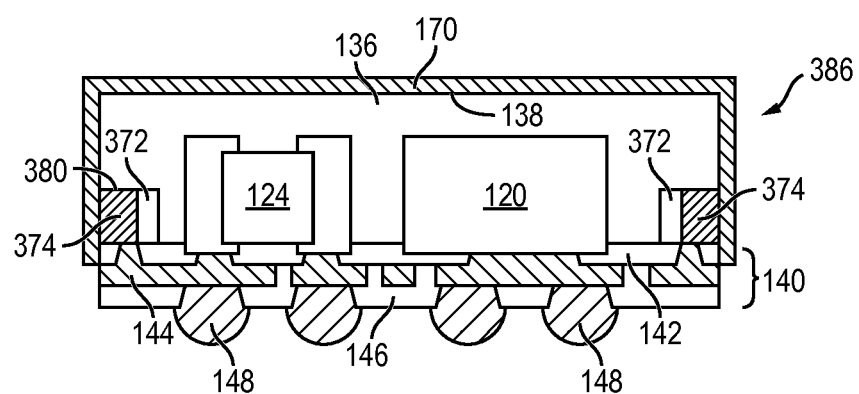

FIGS. 17a-17b illustrate, in relation to FIGS. 16a-16d, an alternative method of making an EMI shielded module with longer PCB units disposed along each side of the EMI shielded module. In the present embodiment, longer PCB units 380, disposed along the edges of module 382 replace corner PCB units 370 of module 376. PCB units 380 include base material 372 and PTH 374, as shown in FIG. 16a. PCB units 380 are longer than PCB units 370. In one embodiment, some PCB units 380 are approximately 3 mm in length while other PCB units 380 are approximately 5 mm in length. FIG. 17a shows a plan view of a portion of reconstituted panel 384. Each PCB unit 380 contains multiple PTHs 374.

FIG. 17b shows EMI shielded module 386. EMI shielded module 386 includes an LC circuit with EMI shielding. Shielding layer 170 encapsulates EMI shielded module 386. Shielding layer 170 extends completely around semiconductor die 84 or components 120-124. Shielding layer 170 substantially covers all areas of encapsulant 136 relative to the top of semiconductor die 84 or components 120-124 to provide protection for the enclosed semiconductor devices against EMI, RFI, or other inter-device interference. The interference can be generated internally or come from external semiconductor devices containing IPDs or RF circuits. Shielding layer 170 also substantially covers all areas of encapsulant 136 relative to the sides of EMI shielded module 386. RDL 144 forms a ground plane. PTHs 374 of PCB units 380 provide an electrical connection between shielding layer 170 and RDL 144 as part of an EMI shield. PCB units 380 provide a grounding connection. PCB units 380, RDL 144, and shielding layer 170 surround semiconductor die 84 or components 120-124 as part of a faraday cage providing EMI and RFI shielding to EMI shielded module 386. PCB units 380, RDL 144, and shielding layer 170 surround semiconductor die 84 or components 120-124 and route EMI, RFI, and other interfering signals from shielding layer 170 to an external low-impedance ground point. Accordingly, PCB units 380, RDL 144, and shielding layer 170 provide effective EMI and RFI shielding for EMI shielded module 386. PCB units 380 have a height less than a height of components 120-124. PCB units 380 act as modular interconnect structures providing connectivity to EMI shielded module 386. In one embodiment, components 120-124 form an LC circuit.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first component including a discrete capacitor;
   disposing a discrete inductor adjacent to the first component;
   disposing a modular interconnect structure adjacent to the first component with the modular interconnect structure including a base material and a conductive layer formed on the base material;
   forming a first interconnect structure over the first component, discrete inductor, and modular interconnect structure;
   forming a trench in the modular interconnect structure; and
   forming a shielding layer over the first component, discrete inductor, modular interconnect structure, and first interconnect structure and extending into the trench.

2. The method of claim 1, further including disposing a conductive adhesive over the modular interconnect structure.

3. The method of claim 1, wherein the modular interconnect structure includes a height greater than a height of the first component.

4. The method of claim 1, further including forming the first interconnect structure to include a ground plane directly over the first component.

5. The method of claim 1, wherein forming a trench in the modular interconnect structure includes fully singulating the modular interconnect structure.

6. A method of making a semiconductor device, comprising:
   providing a first component;
   disposing an encapsulant over the first component;
   forming a first interconnect structure over the first component and encapsulant;
   forming a shielding layer over the first component, encapsulant, and first interconnect structure; and
   singulating the semiconductor device with a width of the first interconnect structure greater than a width of the shielding layer.

7. The method of claim 6, further including disposing a second component adjacent to the first component.

8. The method of claim 7, wherein the second component includes a passive device.

9. The method of claim 7, further including forming an LC circuit including the first component and second component.

10. The method of claim 6, further including disposing a semiconductor die adjacent to the first component.

11. A semiconductor device, comprising:
a first component;
a passive device disposed adjacent to the first component;
a modular interconnect structure disposed adjacent to the first component;
a first interconnect structure formed over the first component and modular interconnect structure; and
a shielding layer formed over the first component, modular interconnect structure, and first interconnect structure.

12. The semiconductor device of claim 11, further including an LC circuit including the first component and passive device.

13. The semiconductor device of claim 11, further including a conductive adhesive disposed over the modular interconnect structure.

14. The semiconductor device of claim 11, wherein the modular interconnect structure includes a height less than a height of the first component.

15. The semiconductor device of claim 11, wherein the shielding layer contacts a side surface of the modular interconnect structure.

16. A semiconductor device, comprising:
a first component;
an encapsulant disposed over the first component;
a conductive layer disposed over the encapsulant and including a surface coplanar with a side surface of the encapsulant;
a first interconnect structure formed over the first component, conductive layer, and encapsulant; and
a shielding layer formed over the first component, encapsulant, and first interconnect structure and contacting the conductive layer.

17. The semiconductor device of claim 16, further including a second component disposed adjacent to the first component.

18. The semiconductor device of claim 17, wherein the second component includes a passive device.

19. The semiconductor device of claim 16, further including a semiconductor die disposed adjacent to the first component.

20. The semiconductor device of claim 16, further including a modular interconnect structure including the conductive layer.

* * * * *